United States Patent
Ma et al.

(10) Patent No.: US 10,643,701 B2
(45) Date of Patent: May 5, 2020

(54) MEMORY DEVICE AND MEMORY SYSTEM

(71) Applicant: Tohoku University, Miyagi (JP)

(72) Inventors: Yitao Ma, Miyagi (JP); Tetsuo Endoh, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 56 days.

(21) Appl. No.: 16/099,966

(22) PCT Filed: May 11, 2017

(86) PCT No.: PCT/JP2017/017943
§ 371 (c)(1),
(2) Date: Mar. 13, 2019

(87) PCT Pub. No.: WO2017/195874
PCT Pub. Date: Nov. 16, 2017

(65) Prior Publication Data
US 2019/0221262 A1    Jul. 18, 2019

(30) Foreign Application Priority Data

May 13, 2016  (JP) ................................ 2016-097500
May 13, 2016  (JP) ................................ 2016-097501

(51) Int. Cl.
*G11C 15/04*    (2006.01)
*G11C 14/00*    (2006.01)
(Continued)

(52) U.S. Cl.
CPC .............. *G11C 15/04* (2013.01); *G06F 12/00* (2013.01); *G06F 16/90339* (2019.01);
(Continued)

(58) Field of Classification Search
CPC ........... G11C 15/04; G11C 14/00; G11C 5/14; G11C 8/08; G11C 7/1006; G11C 14/0081;
(Continued)

(56) References Cited

U.S. PATENT DOCUMENTS 6,185,331 B1 *  2/2001  Shi ........................... G06N 7/04
                                                        382/181
6,205,438 B1 *  3/2001  Shi ......................... G06N 7/043
                                                        706/5
(Continued)

FOREIGN PATENT DOCUMENTS

JP    2011076688 A    4/2011
JP    2012190530 A    10/2012
(Continued)

OTHER PUBLICATIONS

An, F., et al., "A Coprocessor for Clock-Mapping-Based Nearest Euclidean Distance Search with Feature Vector Dimension Adaptability," 978-1-4799-3286-3/14 copyright 2014 IEEE.
(Continued)

*Primary Examiner* — Khamdan N. Alrobaie
(74) *Attorney, Agent, or Firm* — Fox Rothschild LLP; Robert J. Sacco

(57) ABSTRACT

A memory device and a memory system capable of flexibly corresponding to the number of dimensions of reference data and having a compact circuit configuration at searching for data similar to search data are provided. A memory system capable of reducing processing time to search for data similar to search data and reducing a circuit area is provided. A memory device includes a plurality of read circuits, an input search data storing circuit configured to divide search data to output, a plurality of similarity evaluation cells and a plurality of current accumulators. The memory system is
(Continued)

configured by including a main core and a branch core thus configured.

27 Claims, 39 Drawing Sheets

(51) Int. Cl.

| | | |
|---|---|---|
| G06F 12/00 | (2006.01) | |
| G11C 5/14 | (2006.01) | |
| G11C 8/08 | (2006.01) | |
| G11C 7/10 | (2006.01) | |
| G06F 16/903 | (2019.01) | |
| G06K 9/62 | (2006.01) | |

(52) U.S. Cl.
CPC .............. *G06K 9/6276* (2013.01); *G11C 5/14* (2013.01); *G11C 7/1006* (2013.01); *G11C 8/08* (2013.01); *G11C 14/00* (2013.01); *G11C 14/0081* (2013.01)

(58) Field of Classification Search
CPC . G06F 12/00; G06F 16/90339; G06K 9/6276; G06K 9/4652; G06K 9/00986
See application file for complete search history.

(56) References Cited

U.S. PATENT DOCUMENTS

| | | | | |
|---|---|---|---|---|
| 6,272,476 | B1 * | 8/2001 | Shi | G06K 9/00973 706/1 |
| 6,341,275 | B1 * | 1/2002 | Shi | G06K 9/6276 706/33 |
| 6,480,931 | B1 * | 11/2002 | Buti | G06F 9/3836 365/49.17 |
| 2005/0152167 | A1 * | 7/2005 | Nishiyama | G11C 15/00 365/49.17 |
| 2013/0114322 | A1 * | 5/2013 | Mattausch | G11C 15/04 365/49.17 |

FOREIGN PATENT DOCUMENTS

| | | |
|---|---|---|
| JP | 2013191255 A | 9/2013 |
| JP | 2015016257 A | 1/2015 |
| JP | 2015162257 A | 9/2015 |
| JP | 2015185197 A | 10/2015 |
| WO | 2011/102043 A1 | 8/2011 |

OTHER PUBLICATIONS

Akazawa, T., et al., "Word-Parallel Coprocessor Architecture for Digital Nearest Euclidean Distance Search," 978-1-4799-0645-1/13 copyright 2013 IEEE.

Sasaki, S., et al., "Digital Associative Memory for Word-Parrallel Manhattan-Distance-Based Vector Quantization," 978-1-4673-2212-3/12 copyright 2012 IEEE.

Ullah, Z., et al., "Z-TCAM: An SRAM-based Architecture for TCAM," 1063-8210 copyright 2014 IEEE.

An, F., et al., "Associative Memory for Nearest Neighbor Search with High Flexibility of Reference-Vector Number Due to Configurable Dual-Storage Space," Extended Abstracts of the 2015 International Conference on Solid State Devices and Materials, Sapporo, 2015, pp. 144-145.

Bui, T.T., et al., "A Scalable Architecture of Associative Processors Employing Nano Functional Devices," 978-1-4244-3705-4/09 copyright 2009 IEEE.

Ohsawa, T., et al., "A 1 Mb Nonvolatile Embedded Memory Using 4T2MTJ Cell with 32 b Fine-Grained Power Gating Scheme," 0018-9200 copyright 2013 IEEE.

Ohsawa, T., et al., "A 1.5nsec/2.1nsec Random Read/Write Cycle 1 Mb STT-RAM Using 6T2MTJ Cell with Background Write for Nonvolatile e-Memories," 978-4-86348-348-4 2013 Symjposium on VLSI Circuits Digest of Technical Papers.

Yang, Byung-Do, "Low-Power Effective Memory-Size Expanded TCAM Using Data-Relocation Scheme," 0018-9200 copyright 2015 IEEE.

Onizawa, N., et al., "High-Throughput Low-Energy Self-Timed CAM Based on Reordered Overlapped Search Mechanism," IEEE Transactions on Circuits and Systems—I: Regular Papers, vol. 61, No. 3, Mar. 2014.

* cited by examiner

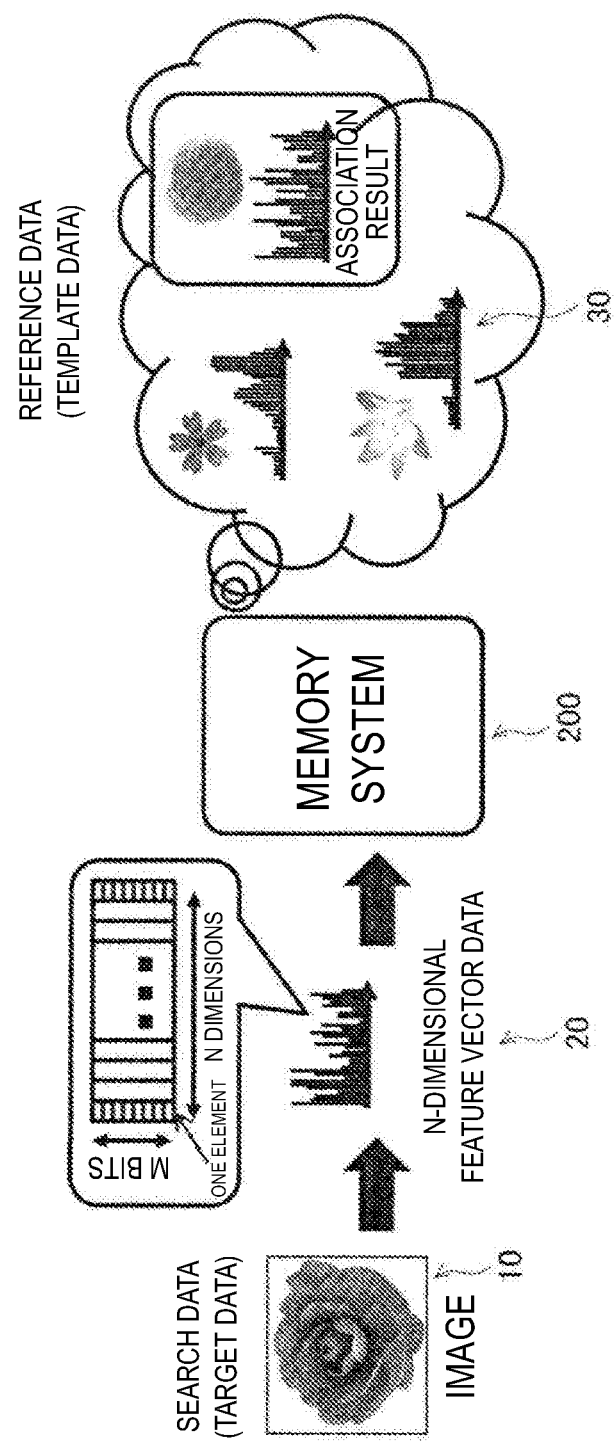

FIG. 27C

| Performance Comparison: | This Work |
|---|---|
| Technology Process | 90nm MTJ/CMOS |
| Circuit Area (Circuit Area/bit) | 660 µm x 345 µm (~ 11 µm² /bit) |
| Number of MTJ | 393K |
| Memory Size | 16Kb |
| Vector Data Format | 8D, 1b, 2048word ~ 128D 128b, 1word |
| Power Supply | 1.0 V |
| Operation Frequency | Clk1 : 12.5 MHz, Clk2 : 50MHz |
| Throughput | 8 cycle/vector (8D) ~ 128 cycle/vector (128D) |
| Average Operation Power Consumption | 130 µW |
| Standby Power Dissipation | 0 |
| Similarity Evaluation Method | Bell-Shape Similarity Evaluation |

FIG. 28

BELL-SHAPED SIMILARITY EVALUATE CELL CIRCUIT OPERATION TEST

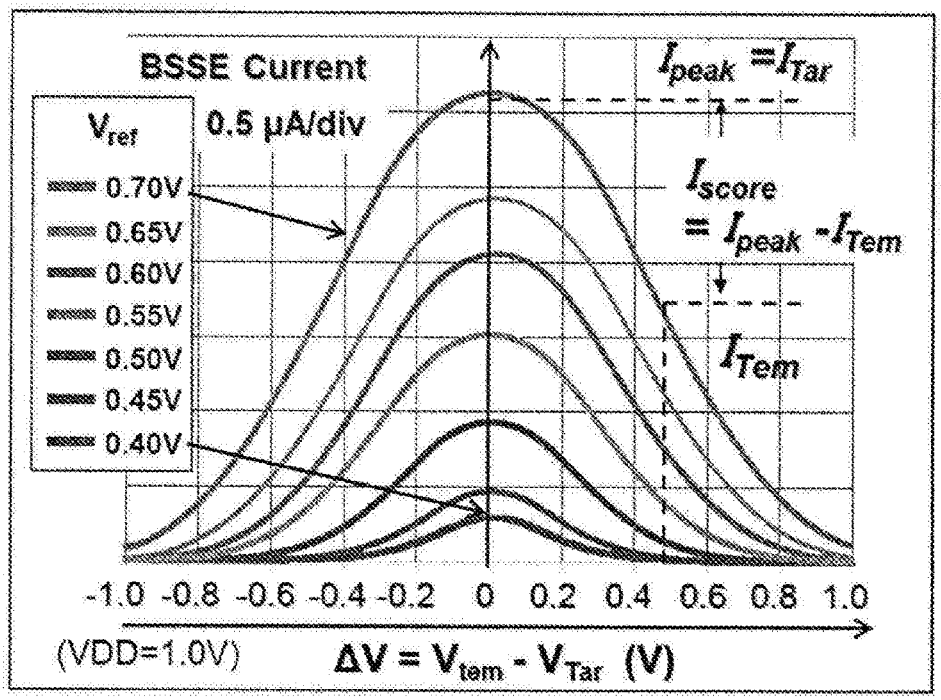

16-DIMENSIONAL DATA CONFIGURATION
CORE OPERATION WAVEFORM

MEMORY DEVICE AND MEMORY SYSTEM

CROSS-REFERENCE TO RELATED APPLICATIONS

The present application is a U.S. National Stage Entry of International Patent Application No. PCT/JP2017/017943, filed on May 11, 2017, which claims the benefit and priority of Japanese Patent Application No. 2016-097500 filed on May 13, 2016 and Japanese Patent Application No. 2016-097501 filed on May 13, 2016. The contents of the above applications are incorporated herein by reference in their entireties.

TECHNICAL FIELD

The present invention relates to a memory device and a memory system capable of searching for similar data.

BACKGROUND ART

In a typical memory device, data is stored at each address. The address is specified to read data stored in the specified address. In an associative memory device, data similar to input data is searched and read.

A typical associative memory is a content addressable memory (CAM) configured to search a reference data base for data completely matching with search data (refer to Patent Literatures 1 to 3 and Non Patent Literatures 1 to 3, for example). The CAM, which operates completely in parallel, includes a memory cell and a comparison circuit at each memory cell. The comparison circuit compares input data with reference data in the memory cell. The CAM searches fast for reference data matching with a specified destination IP address or MAC address. However, the CAM is useful for searching for an IP address at a network router, but is not suitable for searching for similar data.

One of technologies of searching for similar data is an associative memory having a nearest neighbor search (NNS) function. The associative memory is achieved in a digital approach (refer to Patent Literatures 4 and 5 and Non Patent Literatures 4 to 7, for example) or an analog approach (refer to Non Patent Literature 8, for example).

In general, the NNS associative memory determines whether multidimensional reference data is similar to search data. One-word reference data has N-dimensional data. One-dimensional data has M bits.

The NNS associative memory in a digital approach includes a storage circuit configured to store reference data of each dimension, a distance calculation circuit configured to calculate, as a distance, how similar reference data of each dimension is to search data, and a distance/clock number conversion circuit configured to start operation of clock signal counting in response to inputting of a trigger signal and configured to output a match signal indicating the timing of counting a clock number corresponding to a distance calculated by the distance calculation circuit. Distance/clock number conversion circuits are connected to each other in series and a match signal output from the distance/clock number conversion circuit in the front stage is turned into a trigger signal for the distance/clock number conversion circuit in the rear stage. In the NNS associative memory, a winner detection circuit determines a match signal of the earliest timing from among match signals input from a plurality of distance/clock number conversion circuits, and outputs the associative result. To control whether an output from the distance/clock number conversion circuit is sent to the next distance/clock number conversion circuit or to the winner detection circuit, a reconfigurable programmable switch circuit is provided for each of the distance/clock number conversion circuits.

The NNS associative memory in an analog approach includes volatile data storage circuits of R rows and N columns configured to store reference data of R words, N pieces of D/A conversion circuits provided only for one row and configured to convert digital data into analog data, matching cells of R rows and N columns provided for each dimension and each configured to evaluate the similarity between reference data and search data by a voltage difference therebetween and output the evaluation as a current, a current-to-delay-time converter circuit configured to convert an output currents of the matching cells of each row, which is obtained by integrating currents of N pieces of matching cells, into R pieces of voltage delay signals, and a time-domain winner-take-all circuit configured to search for the earliest rising signal from among the R pieces of voltage delay signals.

The group of the inventors have developed the technology of a spin transfer torque-magnetoresistance random access memory (STT-MRAM) as a nonvolatile memory (refer to Non Patent Literatures 9 and 10, for example).

CITATION LIST

Patent Literature

Patent Literature 1: Japanese Patent Laid-open No. 2012-190530
Patent Literature 2: Japanese Patent Laid-open No. 2013-191255
Patent Literature 3: Japanese Patent Laid-open No. 2015-185197
Patent Literature 4: Japanese Patent Laid-open No. 2011-76688
Patent Literature 5: Japanese Patent Laid-open No. 2015-162257

Non Patent Literature

Non Patent Literature 1: B.-D. Yang, JSSC, Vol 50, No. 10, pp. 2441-2450, October 2015
Non Patent Literature 2: N. Onizawa, S. Matsunaga, V. C. Gaudet, W. J. Gross and T. Hanyu, IEEE Trans. Circuits and Systems, Vol. 61, No. 3, pp. 865-876, March 2014
Non Patent Literature 3: Z. Ullah, M. K. Jaiswal and R. C. C. Cheung, IEEE Trans. VLSI Systems, Vol. 23, No. 2, pp. 402-406, February 2015
Non Patent Literature 4: S. Sasaki, M. Yasuda and H. J. Mattausch, ESSCIRC, pp. 185-188, 2012
Non Patent Literature 5: T. Akazawa, S. Sasaki and H. J. Mattausch, ESSCIRC, pp. 267-270, 2013
Non Patent Literature 6: F. An, T. Akazawa, S. Yamazaki, L. Chen, and H. J. Mattausch, CICC, pp. 1-4, 2014
Non Patent Literature 7: F. An, K. Mihara, S. Yamasaki, L. Chen and H. J. Mattausch, SSDM, pp. 144-145, 2015
Non Patent Literature 8: T. B. Trong and T. Shibata, ULIS, pp. 213-216, 2009
Non Patent Literature 9: Takashi Ohsawa, Hiroki Koike, Sadahiko Miura, Hiroaki Honjo, Keizo Kinoshita, Shoji Ikeda, Takahiro Hanyu, Hideo Ohno, Tetsuo Endoh, A 1 Mb Nonvolatile Embedded Memory Using 4T2MTJ Cell With 32b Fine-Grained Power Gating Scheme, IEEE JOURNAL OF SOLID-STATE CIRCUITS, VOL. 48, NO. 6, JUNE 2013, pp. 1511-1520

Non Patent Literature 10: T. Ohsawa, S. Miura, K. Kinoshita, H. Honjo, S. Ikeda, T. Hanyu, H. Ohno, and T. Endoh, A 1.5 nsec/2.1 nsec Random Read/Write Cycle 1MbSTT-RAM Using 6T2MTJ Cell with Background Write for Nonvolatile e-Memories, 2013 Symposium on VLSI Circuits Digest of Technical Papers C111

SUMMARY OF INVENTION

Technical Problem

A first problem is as follows. In the NNS associative memory in a digital approach, the distance calculation circuit is composed of adders of M bits, the distance/clock number conversion circuits are composed of multiple resistors and complicated counters, and the reconfigurable programmable switch circuit is composed of a complicated circuit. These circuits need to be provided for each dimension and occupy a vast amount of a circuit area. The winner detection circuit needs to be a complicated large-scale circuit to correspond to numerous match signals based on the assumption of the worst case. Meanwhile, in the NNS associative memory in an analog approach, similarity cells are prepared for respective dimensions corresponding to the fixed number of dimensions of reference data and it is therefore not possible to flexibly correspond to optional setting of the number of dimensions of reference data.

A second problem is as follows. In the NNS associative memory in any of the digital approach and the analog approach, a core system thereof includes a plurality of cores each of which requires a processing circuit to obtain the most similar reference data in the entire system from among reference data similar to search data in each core, thereby causing an increased processing time and an enlarged circuit area.

Therefore, to solve the first problem, a first object of the present invention is to provide a memory device capable of flexibly corresponding to the number of dimensions of reference data and having a compact circuit configuration at searching for reference data similar to search data. A second object of the present invention is to provide a memory system simply configured by cores of the same compact design and capable of reducing processing time at searching for reference data similar to search data.

To solve the second problem, a third object of the present invention is to provide a memory system configured by cores of the same compact design and capable of reducing processing time at searching for reference data similar to search data, even if the system includes a plurality of cores.

Further, to solve the first problem and the second problem, a fourth object of the present invention is to provide a memory system that satisfies at the same time being configured by cores of the same compact design and capable of reducing processing time at searching for reference data similar to search data, even if the system includes a plurality of cores, and being capable of flexibly corresponding to the number of dimensions of reference data and having a compact circuit configuration at searching for reference data similar to search data.

To achieve the above first and second objects, the present invention has the following concepts.

[1] A memory device including:

a plurality of read circuits each configured to read, in a memory area storing a plurality of pieces of reference data of N ($\geq 1$) dimensions each composed of M ($\geq 1$) bits, the reference data divided into data of each dimension, reference data from a corresponding memory grain among memory grains in an optional number ($1 \leq k \leq N$) each composed of memories of M bits;

a search data storing circuit configured to store search data of N ($\geq 1$) dimensions each composed of M ($\geq 1$) bits and divide the search data to output;

a plurality of similarity evaluation cells each configured to output, as a current value, similarity of reference data read from the corresponding read circuit with respect to data read from the search data storing circuit; and a plurality of current accumulators each configured to accumulate currents output from the corresponding similarity evaluation cells in the optional number.

[2] The memory device according to the above [1], in which the plurality of similarity evaluation cells are divided into cell groups having the similarity evaluation cells in the optional number;

each of the current accumulators corresponds to one of the cell groups; and each of the current accumulators is provided with a switch so as to accumulate currents output from the similarity evaluation cells in the optional number in the cell group different from the corresponding one cell group.

[3] The memory device according to the above [2], in which, among the plurality of current accumulators, electric power is supplied only to a current accumulator which accumulates currents output from the similarity evaluation cells in the optional number in the cell group different from the corresponding one cell group.

[4] The memory device according to any of the above [1] to [3], in which a digital analog convertor configured to convert digital data into analog data is provided in a front stage of the similarity evaluation cells; and the similarity evaluation cells output, as analog current values, similarities to the corresponding current accumulators based on data converted into analog data by the digital analog convertor.

[5] The memory device according to any of the above [1] to [3], in which a digital analog convertor configured to convert digital data into analog data is provided in a rear stage of the similarity evaluation cells; and the similarity evaluation cells calculate similarities and output the similarities to the digital analog convertor.

[6] The memory device according to any of the above [1] to [5], including a searching unit configured to obtain a current value of reference data most similar to search data based on current values output from the plurality of current accumulators, and convert the current value into a data value.

[7] The memory device according the above [6], including a comparing and updating unit configured to compare reference data read from the memory area for each row and update reference data most similar to search data based on the data obtained by the searching unit.

[8] The memory device according to any of the above [1] to [5], including:

a plurality of time-domain convertors each configured to convert the similarity calculated by the corresponding similarity evaluation cell into a delay time;

a searching unit configured to obtain, as a local winner, a reference data candidate having high similarity based on delay times converted by the plurality of time-domain convertors; and a comparing and updating unit configured to obtain, as a global winner, a reference data candidate having the highest similarity from among local winners obtained by the searching unit in each reading and evaluating a similarity, and have a temporary storage circuit for storing the similarity of the global winner, in which the comparing and updating unit compares the similarity of the local winner obtained by the searching unit and the similarity of the global winner stored in the temporary storage circuit.

[9] The memory device according the above [8], in which the searching unit includes a time-domain minimum searching circuit configured to search for the local winner corresponding to the shortest delay based on a plurality of delay times input from the plurality of time-domain convertors, and simultaneously convert, as digital similarity of the local winner, the shortest delay into a clock cycle number within delay times by a counter to determine an address of the local winner.

[10] A memory system including a main core and one or a plurality of branch cores, in which the main core comprises the memory device according to the above [8] or [9], and the branch cores comprise the memory device according to the above [8] or [9], the comparing and updating unit being deactivated in the branch core and a local winner obtained by the searching unit of the branch core being input to the comparing and updating unit of the main core.

[11] The memory system according the above [10], in which searching processing by the searching unit and comparing and updating by the comparing and updating unit in the main core are performed with searching processing by the searching unit in the branch core according to a synchronized clock.

[12] The memory system according the above [11], in which searching processing by the searching unit and comparing and updating by the comparing and updating unit are performed at an optionally deviated clock number in the main core and the branch cores.

To achieve the third object, the present invention has the following concepts.

[1] A memory system including a main core and one or a plurality of branch cores, each of the main core and the branch cores including:

a searching unit configured to obtain, as a local winner, a reference data candidate having high similarity based on similarity between reference data read from a memory area and search data in each reading from a memory area and similarity evaluation, in which the main core includes a comparing and updating unit having a temporary storage circuit, the temporary storage circuit configured to store a similarity of a global winner, the global winner obtained at the searching unit, as which, a reference data candidate having the highest similarity among local winners obtained in each reading and evaluating a similarity, the comparing and updating unit configured to compare the similarity of the local winner obtained by the searching unit of the main core and the similarity of the global winner stored in the temporary storage circuit, and compares the similarity of the local winner obtained by the searching unit of the branch core and the similarity of the global winner stored in the temporary storage circuit.

[2] The memory system according to the above [1], in which each of the main core and the branch cores includes a plurality of similarity evaluation cells each configured to calculate the similarity between each reference data read in each reading from the memory area and search data, and a plurality of time-domain convertors each configured to convert the similarity calculated by the corresponding similarity evaluation cell into a delay time.

[3] The memory system according to the above [2], in which the searching unit includes a time-domain minimum searching circuit configured to search for the local winner corresponding to the shortest delay based on a plurality of delay times input from the plurality of time-domain convertors, and simultaneously convert, as digital similarity of the local winner, the shortest delay into a clock cycle number within delay times by a counter to determine an address of the local winner.

[4] The memory system according to the above [3], in which the comparing and updating unit includes a minimum searching circuit configured to receive inputting of similarities of local winners from the searching units of the main core and the branch cores, and update, at the temporary storage circuit, a value having high similarity in comparison with the similarity of the global winner stored in the temporary storage circuit.

[5] The memory system according to any of the above [1] to [4], in which searching processing by the searching unit and comparing and updating by the comparing and updating unit in the main core are performed with searching processing by the searching unit in the branch core according to a synchronized clock.

[6] The memory system according to the above [5], in which searching processing by the searching unit and comparing and updating by the comparing and updating unit are performed at an optionally deviated clock number in the main core and the branch cores.

[7] The memory system according to the above [2], in which each of the main core and the branch cores includes:

a plurality of read circuits each configured to read, in a memory area storing a plurality of pieces of reference data of N ($\geq$1) dimensions each composed of M ($\geq$1) bits, the reference data divided into data of each dimension, reference data from a corresponding memory grain among memory grains in an optional number ($1 \leq k \leq N$) each composed of memories of M bits;

a search data storing circuit configured to store search data of N ($\geq$1) dimensions each composed of M ($\geq$1) bits and divide the search data to output; and a plurality of current accumulators each configured to accumulate currents output from the corresponding similarity evaluation cells in the optional number, in which each of the similarity evaluation cells outputs, as a current value, the similarity of reference data read from the corresponding read circuit with respect to data read from the search data storing circuit.

[8] The memory system according to the above [7], in which the plurality of similarity evaluation cells are divided into cell groups having the similarity evaluation cells in the optional number;

each of the current accumulators corresponds to one of the cell groups; and each of the current accumulators is provided with a switch so as to accumulate currents output from the similarity evaluation cells in the optional number in the cell group different from the corresponding one cell group.

[9] The memory system according to the above [8], in which, among the plurality of current accumulators, electric power is supplied only to a current accumulator which accumulates currents output from the similarity evaluation cells in the optional number in the cell group different from the corresponding one cell group.

[10] The memory system according to the above [7], in which
a digital analog convertor configured to convert digital data into analog data is provided in a front stage of the similarity evaluation cells; and
the similarity evaluation cells output, as analog current values, similarities to the corresponding current accumulators based on data converted into analog data by the digital analog convertor.

To achieve the fourth object, the present invention has the following concepts.

[1] A memory system including:
a main core and one or a plurality of branch cores, each of the main core and the branch cores including:
a plurality of read circuits each configured to read, in a memory area storing a plurality of pieces of reference data of N (≥1) dimensions each composed of M (≥1) bits, the reference data divided into data of each dimension, reference data from a corresponding memory grain among memory grains in an optional number (1≤k≤N) each composed of memories of M bits;
a search data storing circuit configured to store search data of N (≥1) dimensions each composed of M (≥1) bits and divide the search data to output;
a plurality of similarity evaluation cells each configured to calculate similarity between reference data read in each reading from the memory area and search data, and output, as a current value, the similarity of reference data read from the corresponding read circuit with respect to data read from the search data storing circuit;
a plurality of current accumulators each configured to accumulate currents output from the corresponding similarity evaluation cells in the optional number; and
a searching unit configured to obtain, as a local winner, a reference data candidate having high similarity based on the similarity between reference data read from the memory area and search data in each reading from the memory area and evaluating a similarity, in which
the main core includes;
a comparing and updating unit having a temporary storage circuit, the temporary storage circuit configured to store a similarity of a global winner, the global winner obtained at the searching unit, as which, a reference data candidate having the highest similarity among local winners obtained in each reading and evaluating a similarity, the comparing and updating unit configured to compare the similarity of the local winner obtained by the searching unit of the main core and the similarity of the global winner stored in the temporary storage circuit, and compares the similarity of the local winner obtained by the searching unit of the branch core and the similarity of the global winner stored in the temporary storage circuit.

[2] The memory system according to the above [1], in which
the plurality of similarity evaluation cells are divided into cell groups having the similarity evaluation cells in the optional number;
each of the current accumulators corresponds to one of the cell groups; and
each of the current accumulators is provided with a switch so as to accumulate currents output from the similarity evaluation cells in the optional number in the cell group different from the corresponding one cell group.

[3] The memory system according to the above [2], in which, among the plurality of current accumulators, electric power is supplied only to a current accumulator which accumulates currents output from the similarity evaluation cells in the optional number in the cell group different from the corresponding one cell group.

[4] The memory system according to any of the above [1] to [3], in which
a digital analog convertor configured to convert digital data into analog data is provided in a front stage of the similarity evaluation cells; and
the similarity evaluation cells output, as analog current values, similarities to the corresponding current accumulators based on data converted into analog data by the digital analog convertor.

[5] The memory system according to any of the above [1] to [4], in which the main core and the branch cores are provided with a plurality of time-domain convertors each configured to convert the similarity calculated at the corresponding similarity evaluation cell into a delay time.

[6] The memory system according to the above [5], in which the searching unit includes a time-domain minimum searching circuit configured to search for the local winner corresponding to the shortest delay based on a plurality of delay times input from the plurality of time-domain convertors, and simultaneously convert, as digital similarity of the local winner, the shortest delay into a clock cycle number within delay times by a counter to determine an address of the local winner.

[7] The memory system according to the above [6], in which the comparing and updating unit includes a minimum searching circuit configured to receive inputting of similarities of local winners from the searching unit of the main core and the branch cores, and update, at the temporary storage circuit, a value having high similarity in comparison with the similarity of the global winner stored in the temporary storage circuit.

[8] The memory system according to any of the above [1] to [7], in which searching processing by the searching unit and comparing and updating by the comparing and updating unit in the main core are performed with searching processing by the searching unit in the branch core according to a synchronized clock.

[9] The memory system according to the above [8], in which searching processing by the searching unit and comparing and updating by the comparing and updating unit are performed at an optionally deviated clock number in the main core and the branch cores.

Advantageous Effects of Invention

According to the present invention provided to achieve the first object, firstly, each of the read circuits reads reference data from a corresponding memory grain among memory grains in an optional number (1≤k≤N) each composed of memories of M bits in a memory area storing a plurality of pieces of reference data divided into data of each dimension, secondly, each of similarity evaluation cells outputs, as a current value, similarity of reference data read from the corresponding read circuit with respect to data read from the searching data storage circuit, and thirdly, each of current accumulators accumulates currents output from the corresponding similarity evaluation cells in the optional number. Thus, the current accumulators accumulate currents from the similarity evaluation cells in accordance with an optional number and the number of dimensions of reference data stored in the memory area, whereby it is possible to flexibly correspond to the number of dimensions of reference data. Also, the device is not premised on a complicated circuit and therefore can be realized with a compact circuit. According to the present invention, a memory device can be provided which is capable of flexibly corresponding to the number of dimensions of reference data and having a compact circuit configuration at searching for data similar to search data.

According to the present invention provided to achieve the second object, the above memory device further includes, as the main core, a plurality of time-domain convertors each configured to convert similarity calculated at the corresponding similarity evaluation cell into a delay time, a searching unit configured to obtain, as a local winner, a reference data candidate having high similarity from among similarities between reference data read from the memory area and search data based on delay times converted by the plurality of time-domain convertors, and a comparing and updating unit configured to obtain, as a global winner, a reference data candidate having the highest similarity from among local winners obtained by the searching unit in each reading and similarity evaluation, and have a temporary storage circuit for storing the similarity of the global winner. The branch core has the same configuration as the main core but the comparing and updating unit is not provided or deactivated therein. By the memory system comprising such a branch core and a main core, searching by the searching unit in the main core and the branch core and comparing and updating by the comparing and updating unit in the main core are processed in parallel, whereby reference data similar to search data can be obtained for shorter time from the memory area on the memory system. Thus, the memory system can be configured in a simple manner with the cores of the same compact design and reduce the processing time at searching for reference data similar to search data.

According to the present invention provided to achieve the third object, the memory system includes the memory core and the branch core, each of the memory core and the branch core includes a searching unit configured to obtain, as a local winner, a reference data candidate having high similarity based on similarities between reference data read from the memory area and search data in each reading from the memory area and similarity evaluation, in which the main core includes a comparing and updating unit configured to obtain, as a global winner, a reference data candidate having the highest similarity from among local winners obtained by the searching unit in each reading and similarity evaluation, and have a register for storing the similarity of the global winner, and the comparing and updating unit compares the similarity of the local winner calculated by the searching unit of the main core and the similarity of the global winner stored in the temporary storage circuit and also compares the similarity of the local winner calculated by the searching unit of the branch core and the similarity of the global winner stored in the temporary storage circuit. Therefore, candidates obtained in the main core and the branch core do not need to be compared again and no circuit for re-comparing is required, whereby the system can be made compact. Further, comparing and updating are processed only by the comparing and updating unit of the main core and therefore can be processed in parallel with searching by the searching unit. Thus, comparing and updating in each of the cores can be processed via a pipeline and associative calculation is completed for reference data read in each reading of, for example, one clock. Hence, according to the present invention, the memory system can reduce the processing time at searching for reference data similar to search data even if the memory system includes a plurality of cores.

According to the present invention provided to achieve the fourth object, in order to have the effect for achievement of the aforementioned first to third objects, the present invention provides the memory system that satisfies, at the same time, being configured in a simple manner with the cores of the same compact design and capable of reducing the processing time at searching for reference data similar to search data even if the memory system includes a plurality of cores, and being capable of flexibly corresponding to the number of dimensions of reference data and having a compact circuit configuration at searching for reference data similar to search data.

BRIEF DESCRIPTION OF DRAWINGS

FIG. 1B is a diagram for description of a case to which a memory system according to an embodiment of the present invention is applied.

FIG. 27C is a table listing designing specifications in the implementation example illustrated in FIG. 15.

FIG. 28 is a diagram illustrating a test result of circuit operation of the similarity evaluation cell.

DESCRIPTION OF EMBODIMENTS

Some embodiments of the present invention will be described below in detail with reference to the accompanying drawings. However, the present invention is not limited to the illustrated embodiments and includes embodiments to be modified as appropriate within the scope of the present invention.

Terms Used in the Embodiments of the Present Invention

Figure 1A:
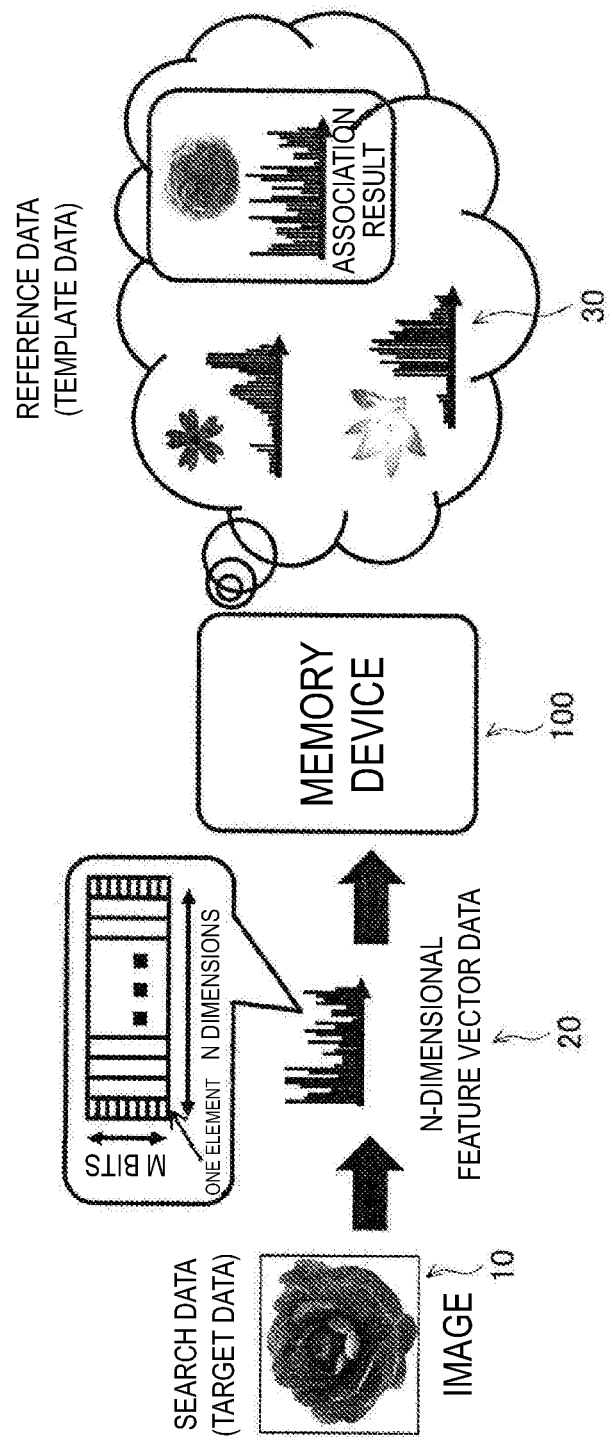
FIG. 1A is a diagram for description of a case to which a memory device according to an embodiment of the present invention is applied.

FIG. 1A is a diagram for description of a case to which a memory device 100 according to an embodiment of the present invention is applied. As illustrated in FIG. 1A, when search data 10 is input, the search data 10 is converted into feature vector data 20 of one or a plurality of dimensions. The converted data includes the feature vector data 20 of N (≥1) dimensions each composed of M (≥1) bits. The memory device 100 extracts most similar data from among stored reference data 30. The memory device 100 includes a memory area as described later.

FIG. 1B is a diagram for description of a case to which a memory system 200 according to an embodiment of the present invention is applied. As illustrated in FIG. 1B, when search data 10 is input, the search data 10 is converted into feature vector data 20 of one or a plurality of dimensions. The converted data includes the feature vector data 20 of N (≥1) dimensions each composed of M (≥1) bits. The memory system 200 extracts most similar data from among reference data 30 stored in each memory device. The memory device includes a memory area as described later.

The following describes the search data 10, the feature vector data 20, and the reference data 30.

The search data 10 is also called target data, and is input as data to be searched from among data stored in the memory area.

The reference data 30 is also called template data, and is stored in the memory area and searched based on the search data.

The search data 10 and the reference data 30 are each image data, sound data, or text data (sentence data) of any kind. The natural numbers M and N are set in accordance with the kind of data to be handled.

The feature vector data 20 is obtained by extracting N (≥1) feature amounts based on a large number of viewpoints and displaying a vector of ratios of the N feature amounts, each ratio of one feature amount being expressed in a number (this number is expressed in M bits). The number of feature amounts is referred to as a dimension number.

Figure 2:
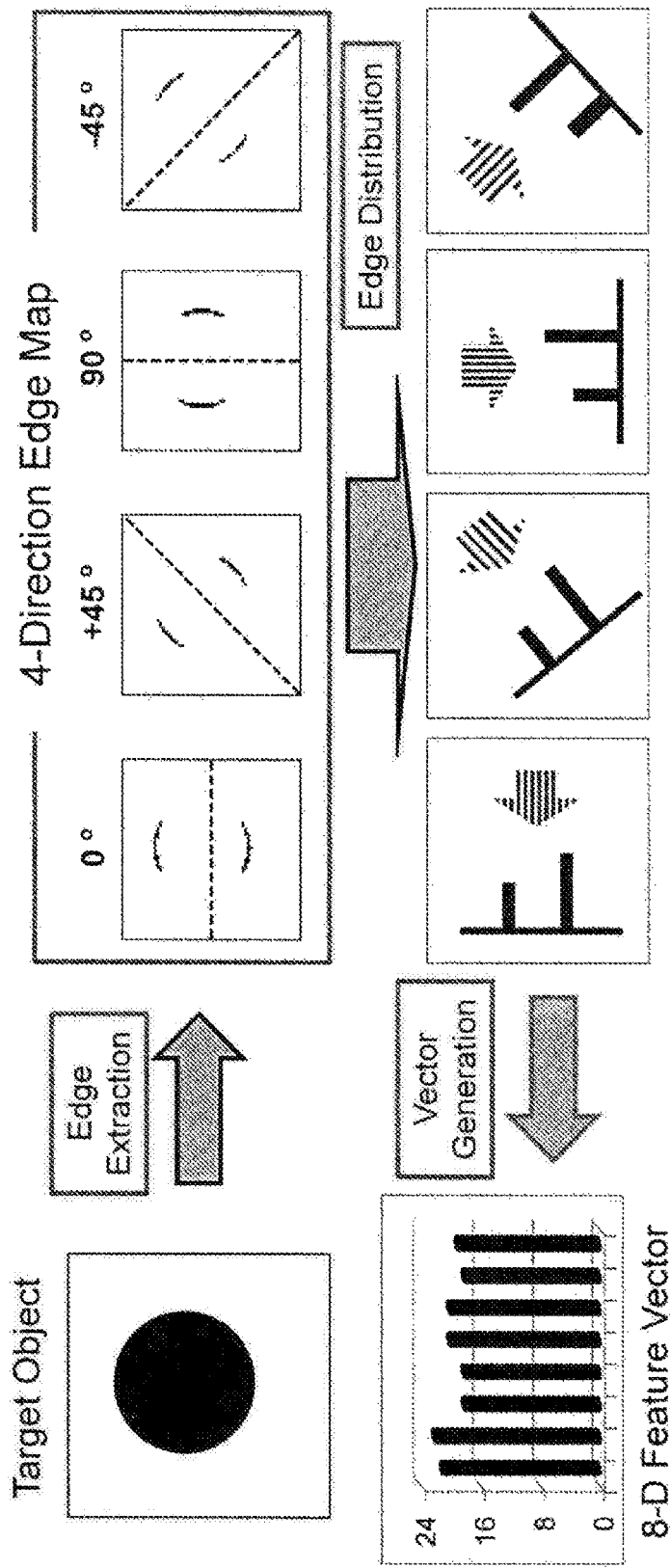
FIG. 2 is an explanatory diagram of feature vector data.

FIG. 2 is an explanatory diagram of the feature vector data 20. As illustrated in an upper part of FIG. 2, for example, a three-dimensional (RGB) vector data for color recognition indicates the ratio of each color of RGB included in search data. One-dimensional feature is expressed in M (for example, M=8) bits.

As illustrated in a lower part of FIG. 2, for example, eight-dimensional vector data for shape recognition is obtained by determining whether an outline included in the search data 10 includes a part extending along each reference outline as illustrated in "4-Direction Edge Map", counting, by the numbers of pixels, the part extending along the reference outline as illustrated in "Edge Distribution", producing distribution of the numbers of pixels in each component divided by a dotted line at 0°, 45°, 90°, or −45°, and expressing a distribution as an eight-dimensional feature vector ("8-D Feature Vector") as illustrated in "Vector Generation".

The feature vector data 20 is not limited to simple data as illustrated in FIG. 2 but may be complicated feature vector data such as 128-dimensional scale-invariant feature transform (SIFT) vector data and Bag-of-feature (Bof) vector data, which are extremely famous in the field of image recognition.

A memory grain is a memory subarray storing one-dimensional part (M bits) of the reference data 30. In the embodiment of the present invention, independent power source control (ON/OFF) is achieved by performing fine-grain power gating on the memory grain.

A local winner is reference data most similar to search data among reference data per row of a memory area. The memory area here refers to a memory unit in the memory device or refers to a memory unit in cores including both the main core and the branch core in the memory system. The local winner is obtained by the searching unit of the memory device (which is also called the core).

Local winner similarity is similarity between a local winner and search data. The local winner similarity is calculated, for example, as a current value at each searching unit and converted into a clock cycle number by a counter at each searching unit.

A global winner is reference data which is selected from among local winners and is most similar to search data among all the reference data stored in the memory area. In the memory device, a global winner is calculated by a comparing and updating circuit and similarity thereof is compared to that of a local winner to update a global winner with the one having higher similarity. In the memory system, the global winner is calculated only by the comparing and updating circuit of the main core and similarity thereof is compared to that of a local winner to update a global winner with the one having higher similarity.

Global winner similarity is similarity between a global winner and search data. To update a global winner, a global winner is temporality stored with an address thereof in a temporary storage circuit such as a register of the comparing and updating circuit, and similarity of the global winner is compared with similarity of a local winner input at deviated timing so that a global winner is replaced with the one having higher similarity. The global winner similarity is calculated by the comparing and updating circuit in the memory device, or calculated only by the comparing and updating circuit of the main core in the memory system.

In the embodiment of the present invention, data of M bits for each dimension number is stored as reference data in the memory area.

First Embodiment of the Present Invention

Figure 3:
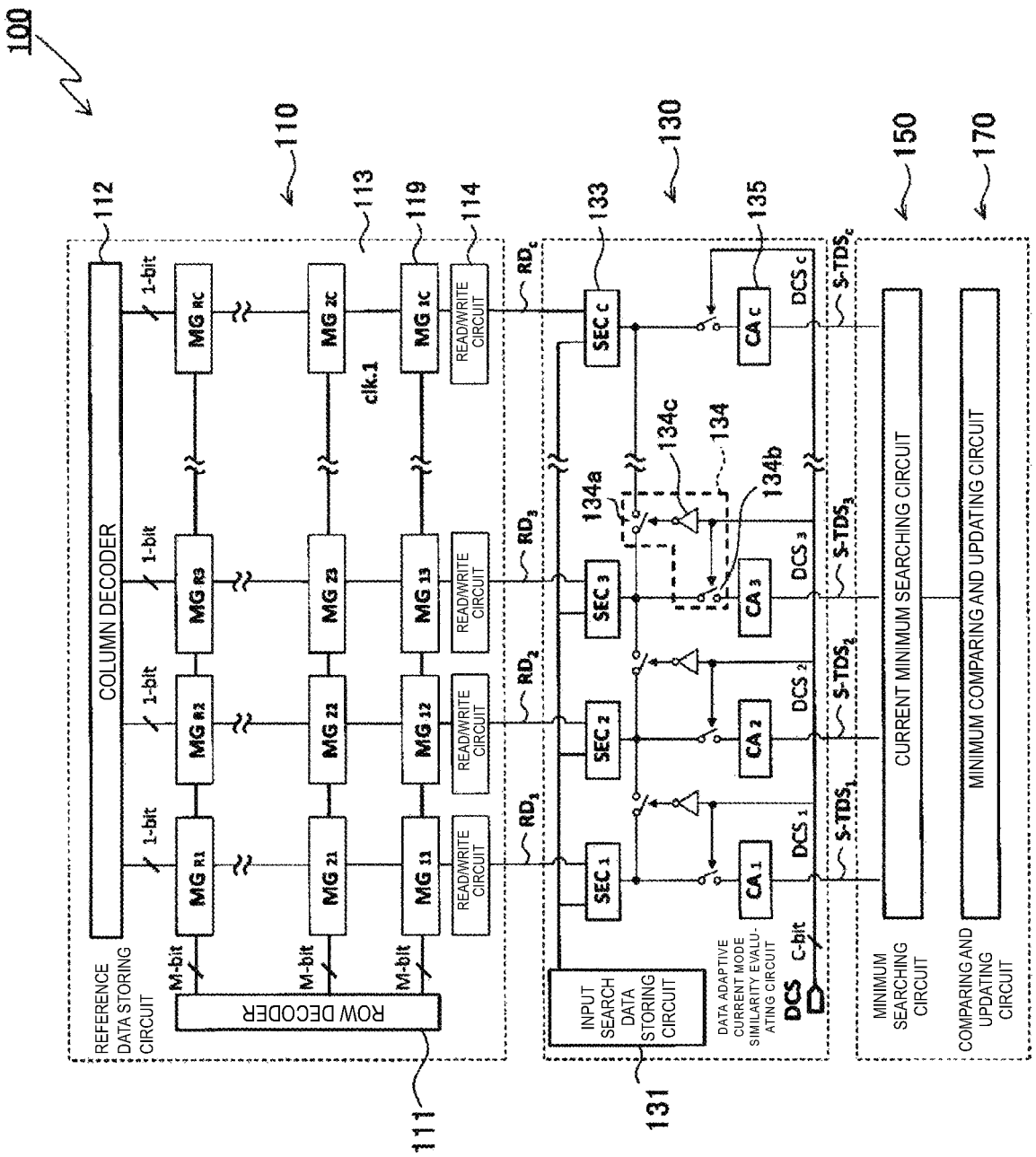
FIG. 3 is a configuration diagram of the memory device according to the first embodiment of the present invention.

FIG. 3 is a configuration diagram of the memory device according to the first embodiment of the present invention. The memory device 100 according to the embodiment of the present invention includes a memory unit 110, a similarity evaluating unit 130, a searching unit 150, and a comparing and updating unit 170.

The memory unit 110, called a reference data storing circuit, includes a row decoder 111, a column decoder 112, a memory area 113 and read/write circuits 114, and is configured to allow memory grains 119 in the memory area 113 to write and read reference data. In the memory area, a plurality of pieces of reference data are stored separately for each dimension of reference data. The reference data has N (≥1) dimensions each composed of M (≥1) bits. The memory area 113 contains, in a matrix format, memory grains (MG) 119 in an optional number (1≤k≤N) each composed of memories of M bits. In FIG. 3, memory grains 119 of (R×M) rows and C columns are provided and a read/write circuit 114 is provided at each column. Each of the read/write circuits 114 as a plurality of read circuits reads reference data from the corresponding memory grain 119. Herein, FIG. 3 illustrates a case where an optional number k is 1.

The similarity evaluating unit 130 includes at least, an input search data storing circuit 131, a plurality of similarity evaluation cells (SEC) 133, a current accumulator (CA) 135.

The input search data storing circuit 131 stores search data of N (≥1) dimensions each composed of M (≥1) bits and outputs separately according to a situation where search data is divided into data of each column and stored in the memory area 113.

Each of the similarity evaluation cells 133 outputs a similarity current value relevant to similarity between data read from the input search data storing circuit 131 and reference data read by the corresponding read/write circuit 114. "Data read from the input search data storing circuit 131" (referred to as "first data") is search data disassembled into data of each dimension and output from the input search data storing circuit 131, and a voltage value of the search data in each dimension. "Reference data read by the corresponding read/write circuit 114" (referred to as "second data") is a voltage value of reference data input from the read/write circuit 114. The first data and the second data are evaluated to be identical when the current value is zero. The first data and the second data are evaluated to be different from each other when the current value is large. Thus, the output current value is small when the search data is similar to the reference data.

Each of the current accumulators (CA) 135 accumulate currents outputs from the corresponding similarity evaluation cells 133 in an optional number. Each of the current accumulators 135 receives inputting of current values from the corresponding similarity evaluation cells 133 in an optional number and calculates, based on the currents, similarity between reference data and search data.

The searching unit 150 receives inputting of current values output from the plurality of current accumulators 135, detects a current of reference data most similar to search data, which is a current of similarity, and converts the detected value into predetermined data. A comparing and updating unit 170 compares reference data read from the memory area 113 for each column and updates reference data with reference data most similar to search data among reference data stored in the memory area 113.

In the memory device 100 illustrated in FIG. 3, each of the current accumulators 135 accumulates currents from the similarity evaluation cell 133 in accordance with the number of dimensions of reference data stored in the memory area 113 and an optional number. Thus, it is possible to flexibly correspond to the number of dimensions of reference data. The similarity evaluation cells 133 and the current accumulators 135 can also be realized in a relatively simple circuit configuration.

Further detailed description is provided for the embodiment illustrated in FIG. 3. The memory area 113 is configured as a reference data storing circuit composed of memory cell arrays of (R×M) rows and C columns and storing (R×C)/N pieces of reference data. The memory device 100 has C pieces of similarity evaluation cells 133, in which similarities of C/N pieces of reference data and search data are calculated in parallel and output as currents. The current accumulators 135 accumulate C pieces of similarity currents according to the number of dimensions of reference data.

The similarity evaluating unit 130 includes a switch 134 at each column. The switch 134 is achieved by cooperation of a first switch 134a and a second switch 134b. The first switch 134a is provided between a wire of the similarity evaluation cell 133 at the j-th column and the current accumulator 135 at the j-th column and a wire of the similarity evaluation cell 133 at the (j+1)-th column and the current accumulator 135 at the (j+1)-th column. The index j is a natural number of one to (maximum column number−1) inclusive. The second switch 134b is provided between the similarity evaluation cell 133 and the current accumulator 135 at each column.

The first switch 134a and the second switch 134b are each controlled by an external dimension control signal (DCS). A wire through which the external dimension control signal is input is connected with any one of a control electrode of the first switch 134a and a control electrode of the second switch 134b, and a NOT circuit 134c is provided between any of the wires.

With this configuration, the second switch 134b is off when the first switch 134a is on, or the second switch 134b is on when the first switch 134a is off. The dimension control signal controls the switch 134 in accordance with the dimension of reference data stored in the memory area 113.

At that time, by turning off the second switch 134b, it is controlled so as not to supply electrical power to the current accumulator 135 to which no current flows from the similarity evaluation cell 133, whereby power saving is achieved.

Therefore, by providing the switch 134, currents from the similarity evaluation cells 133 can be accumulated by the respective current accumulators 135, corresponding to an optional number and the number of dimensions of reference data stored in the memory area 113, whereby making it possible to flexibly correspond to the number of dimensions of reference data.

Second Embodiment of the Present Invention

Figure 4:
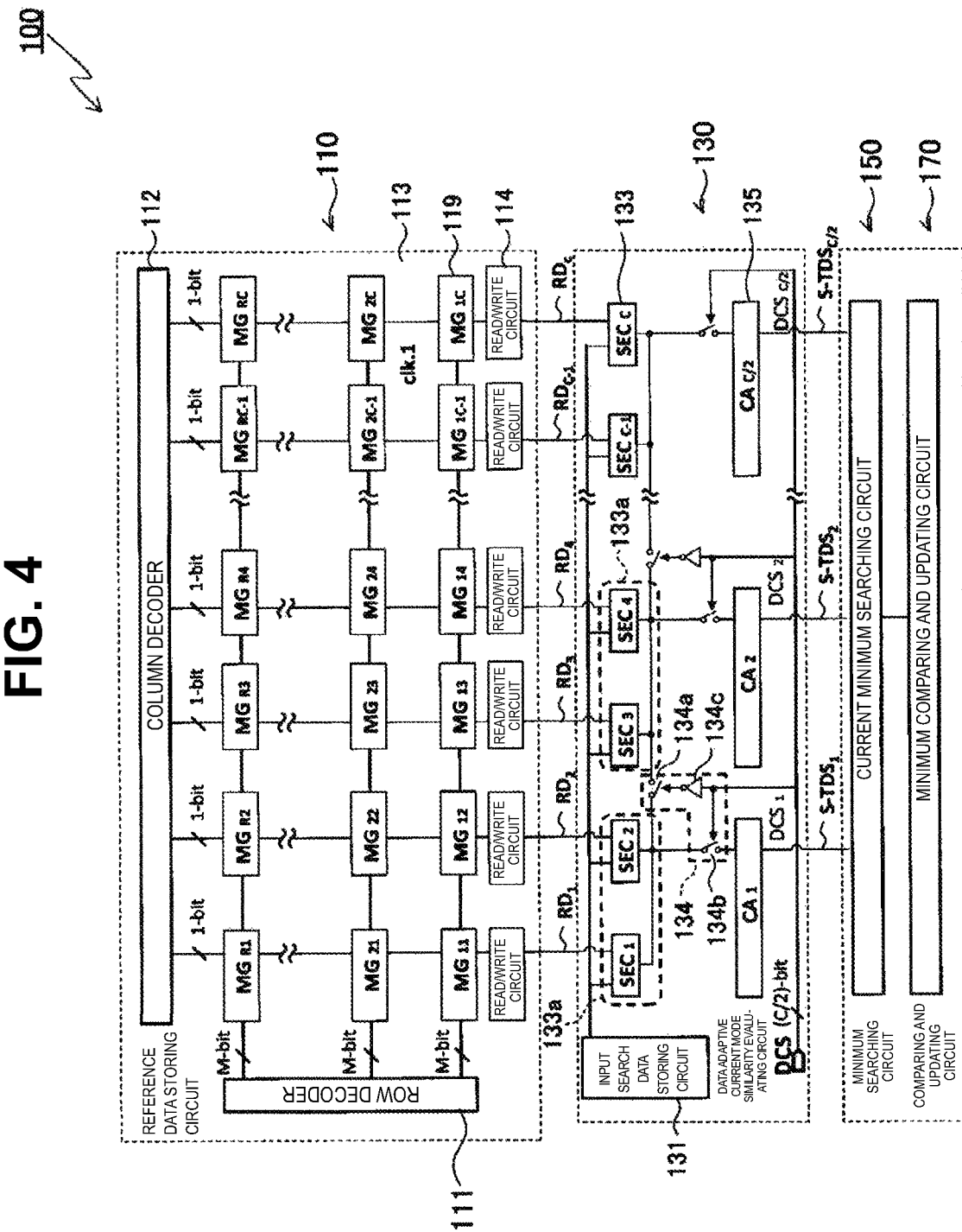
FIG. 4 is a configuration diagram of the memory device according to the second embodiment of the present invention.

FIG. 4 is a configuration diagram of the memory device 100 according to the second embodiment of the present invention. In the memory device 100 illustrated in FIG. 4, the similarity evaluating unit 130 is configured differently from FIG. 3 and the optional number k is 2 at designing and manufacturing. The plurality of similarity evaluation cells 133 is divided into cell groups. As illustrated in FIG. 4, odd-numbered similarity evaluation cells 133 and even-numbered similarity evaluation cells 133 form a cell group 133a, and the current accumulator 135 corresponds to one cell group 133a. Then, the switch 134 is provided so that the current accumulator 135 accumulates currents output from an optional number of the similarity evaluation cells 133 in another cell group 133a different from the corresponding one cell group 133a.

Specifically, FIG. 4 is different from FIG. 3 in that the switch 134 is not provided at each column, one of the odd-numbered similarity evaluation cells 133 and one of the even-numbered similarity evaluation cells 133 form the cell group 133a, the second switch 134b is provided between one of the even-numbered similarity evaluation cells 133 and the current accumulator 135 corresponding to the cell group 133a of the one even-numbered similarity evaluation cells 133, and the first switch 134a is provided between the cell group 133a and the adjacent cell group 133a.

Therefore, by turning on any one of the first switch 134a and the second switch 134b and turning off the other one, similarity currents from four of the similarity evaluation cells 133 can be accumulated or similarity currents from two of the similarity evaluation cells can also be accumulated.

At that time, by turning off the second switch 134b, it is controlled so as not to supply electrical power to the current accumulator 135 to which no current flows from the similarity evaluation cells 133, whereby power saving can be achieved.

Figure 7:
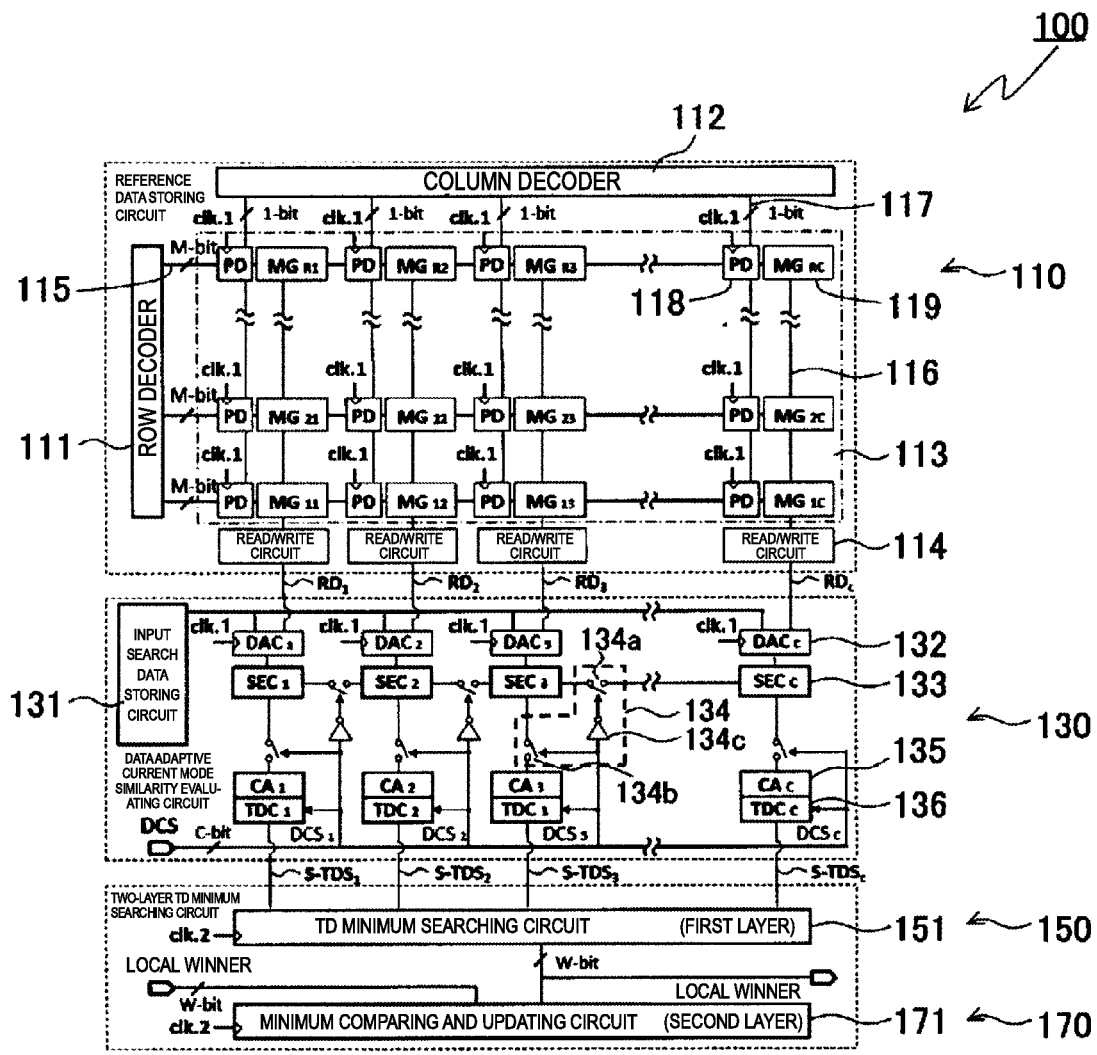
FIG. 7 is a configuration diagram of the memory device according to the fifth embodiment of the present invention.

In FIG. 4, each cell group includes two of the similarity evaluation cells 133 but may also include three or an optional number of those. This makes it possible to flexibly correspond to any numbers other than the dimension number of search data and reference data. As described later, the optional number of the similarity evaluation cells 133 in the cell group may be set to be equal to that of the memory grains 119 to which electrical power is supplied by one power driver 118 as illustrated in FIG. 7.

Third Embodiment of the Present Invention

Figure 5:
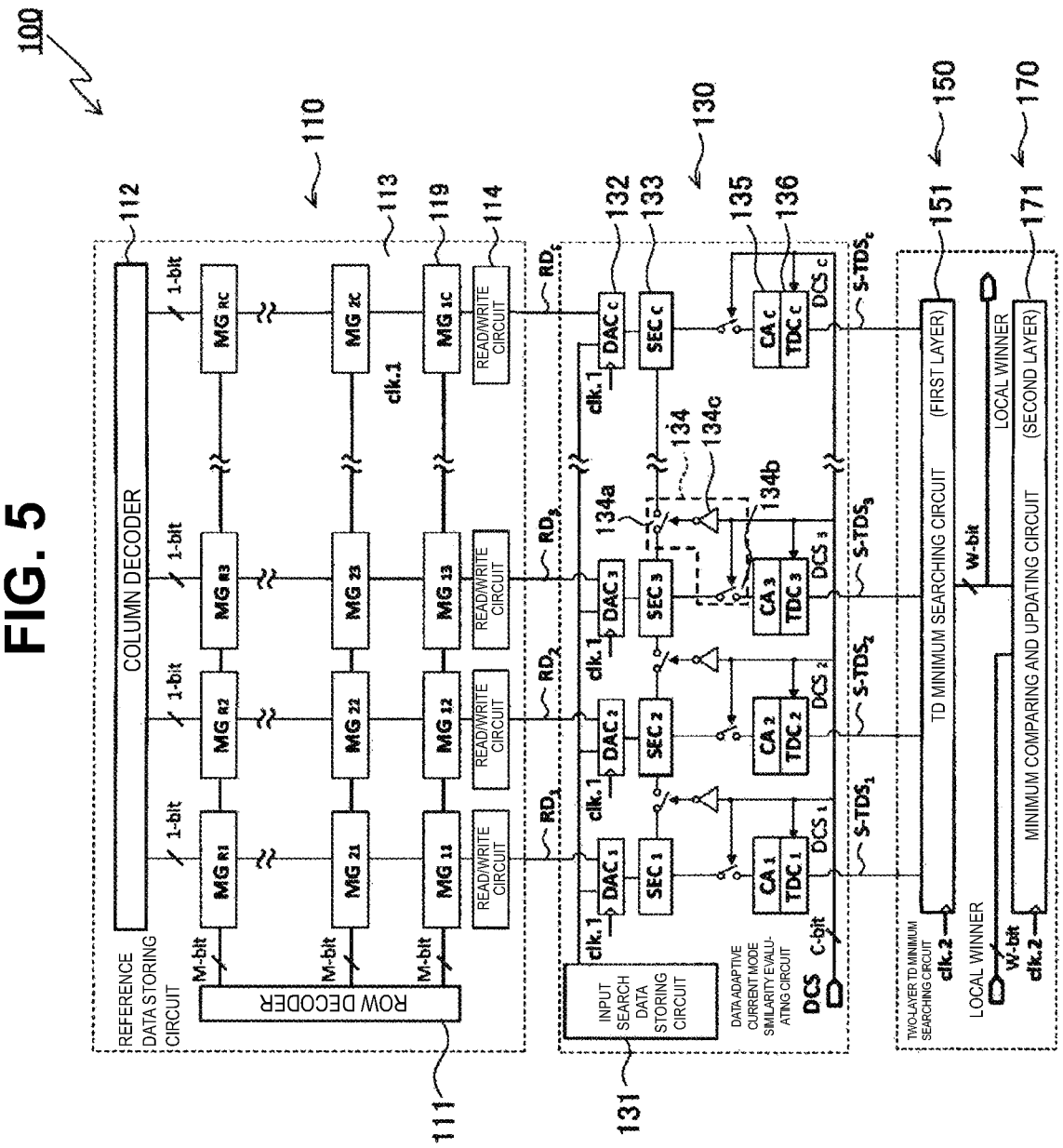
FIG. 5 is a configuration diagram of the memory device according to the third embodiment of the present invention.

FIG. 5 is a configuration diagram of the memory device 100 according to the third embodiment of the present invention, and specifically illustrates the embodiment of FIG. 3. In the memory device 100 illustrated in FIG. 5, the similarity evaluating unit 130 includes an input search data storing circuit 131, a digital analog convertors (DAC) 132, C pieces of the similarity evaluation cells 133 configured to calculate similarities of C/N pieces of reference data and search data in parallel to output as currents, switches 134, current accumulators (CA) 135 configured to accumulate C pieces of similarity currents in accordance with the number of dimensions of reference data, and time-domain convertors (TDC) 136 configured to convert the accumulated similarity current into C/N pieces of time-domain voltage delay signals. In the memory unit 110, the memory area 113 is composed of memory cell arrays of (R×M) rows and C columns and a reference data storing circuit configured to store (R×C)/N pieces of reference data is provided.

The numbers of the digital analog convertors 132, the similarity evaluation cells 133, the switches 134, the current accumulators 135, and the time-domain convertors 136 thus provided are equal to the number of column lines. At each column, digital data as a voltage value is input from the read/write circuit 114 to the digital analog convertor 132, converted into analog data by the digital analog convertor 132, and output to the similarity evaluation cells 133.

The similarity evaluation cells 133 calculate the similarity between two input data. The first data is data obtained by disassembling search data into each dimension and output from the input search data storing circuit 131, and is a voltage value of the search data of the dimension. The second data is a voltage value of reference data input from the read/write circuit 114 through the digital analog convertor 132.

The similarity evaluation cells 133 calculate the similarity between the first data and the second data as a current value and output the current value. The first data and the second data are evaluated to be identical when the current value is zero. The first data and the second data are evaluated to be different from each other when the current value is large. Thus, the output current value is small when the reference data is similar to the search data.

The switch 134 is provided at each column. The switch 134 is achieved by cooperation of a first switch 134a and a second switch 134b. The first switch 134a is provided between the similarity evaluation cell 133 at the j-th column and the similarity evaluation cell 133 at the (j+1)-th column. The index j is a natural number of one to (the number of columns−1) inclusive. The function of the switch 134 in FIG. 5 is similar to that of the switch 134 in FIG. 4. The second switch 134b is provided between the similarity evaluation cell 133 and the current accumulator 135 at each column. The first switch 134a and the second switch 134b are each controlled by an external dimension control signal (DCS). A wire through which the external dimension control signal is input is connected with any one of a control electrode of the first switch 134a and a control electrode of the second switch 134b, and a NOT circuit 134c is provided on the wire. With this configuration, the second switch 134b is off when the first switch 134a is on, or the second switch 134b is on when the first switch 134a is off. The dimension control signal controls the switch 134 in accordance with the dimension of reference data stored in the memory area 113.

When N-dimensional reference data is stored in a dimensionally divided manner in the memory grain $MG_{i,j}$ to the memory grain $MG_{i,j+n-1}$, similarities at the similarity evaluation cell $SEC_j$ at the j-th column to the similarity evaluation cell $SEC_{j+N-1}$ at the (j+N-1)-th column need to be added to evaluate whether the N-dimensional reference data is similar to search data.

In the embodiment of the present invention, to add the similarities, the first switch 134a is provided between the similarity evaluation cell $SEC_j$ at the j-th column and the similarity evaluation cell $SEC_{j+1}$ at the (j+1)-th column, and the second switch 134b is provided between the similarity evaluation cell $SEC_j$ at the j-th column and the current accumulator $CA_j$ at the j-th column.

N of the similarity evaluation cells 133 are connected through the first switches 134a in response to the external dimension control signal. Voltages of search data of the respective dimensions are applied to input terminals of the corresponding similarity evaluation cells 133, and current values output from the similarity evaluation cells 133 are input to and temporarily stored in the current accumulator 135. Thereafter, voltages of reference data of the respective dimensions are applied to the input terminals of the corresponding similarity evaluation cells 133, and current values output from the similarity evaluation cells 133 are input to the corresponding current accumulators 135 to calculate differences with the current values stored therein. In this manner, whether the reference data dispersively stored in a plurality of columns is similar to the search data can be determined based on current values through cooperation of the similarity evaluation cells 133 and the current accumulator 135.

Each time-domain convertor 136 converts the current value output from the corresponding current accumulator 135 into a delay time. Thus, the current value is input to the time-domain convertor 136 from the similarity evaluation cell 133 having the largest column number (e.g. rightmost) among the similarity evaluation cells 133 connected through the switches 134. Accordingly, whether the reference data dispersively stored in the plurality of columns is similar to the search data can be determined based on a time delay value. The time delay value decreases as the similarity increases. Each converted delay time signal is input to the searching unit 150.

The searching unit 150 includes a TD minimum searching circuit 151 configured to detect the shortest value from among C/N pieces of time-domain voltage delay signals and convert the shortest delay into the minimum clock number. The TD minimum searching circuit 151 searches for the shortest time delay, in other words, the time-domain minimum value from among the time delay signals input from the respective time-domain convertors 136 at the similarity evaluating unit 130. The searched shortest delay time value is counted by a W-bit counter and output to the comparing and updating unit 170.

The comparing and updating unit 170 includes a minimum comparing and updating circuit 171 configured to compare an obtained minimum clock number with a stored and previously calculated clock number and update the smaller clock number. The minimum comparing and updating circuit 171, at each repetition of reading from the memory unit 110, compares the count value input from the searching unit 150 with a count value stored in the comparing and updating unit, and stores the smaller count value. Accordingly, when the repetition of reading from the memory unit 110 ends, a small count value is determined, and as a result, the count value of reference data most similar to the search data is determined. The address of the most similar reference data in the memory unit 110 is obtained by associating the count value with an address at the memory unit 110.

Operation of the memory device 100 illustrated in FIG. 5 will be described below.

First, the input search data storing circuit 131 divides input search data into data of each dimension, converts each divided data into an analog voltage through the digital analog convertor 132, and inputs the analog voltage to the corresponding similarity evaluation cell 133.

Subsequently, one-dimensional reference data (M bits) output from the C memory grains 119 through the read/write circuits 114, respectively, is converted into analog voltages at the digital analog convertors 132 and input to the C similarity evaluation cells 133 in parallel after the inputting of the search data. When the digital analog convertors 132 are serial, conversion of M-bit data takes a time of M clocks.

Then, each similarity evaluation cell 133 outputs, as a current for the corresponding dimension, the similarity between the voltage of the search data (one-dimensional) and the voltage of the reference data (one-dimensional).

Then, first, each first switch 134a between the similarity evaluation cells 133 is controlled to turn on in accordance with the dimension number of the reference data and the search data in response to an external dimension control signal to add currents from the similarity evaluation cells 133 between which the first switch 134a is on, and the currents from the C similarity evaluation cells 133 are accumulated at the C/N current accumulators 135 and output to the corresponding time-domain convertors 136. A smaller current has a higher similarity. The same dimension control signal turns off the second switches 134b to deactivate unnecessary connection between the current accumulator 135 and the time-domain convertor 136.

Subsequently, the time-domain convertors 136 convert the accumulated C/N similarity currents into time domain voltage delay signals, and output the signals to the minimum searching circuit (Time Domain (TD) minimum searching circuit) 151 as a searching circuit in parallel.

Subsequently, in minimum searching processing at a first level (local), the minimum searching circuit (Time Domain (TD) minimum searching circuit) 151 determines a time domain voltage delay signal having the highest similarity, in other words, the shortest delay among the time domain voltage delay signals corresponding to C/N pieces of the reference data per row, and the delay is converted into a digital value as the number of clocks in the delay through the W-bit counter and output to the minimum comparing and updating circuit 171. The W-bit counter is converted into a time domain voltage delay signal having a delay of $2^W$ clocks at maximum, and the resolution of similarity current conversion proportional to this maximum delay is obtained. Thus, a smaller similarity current difference can be obtained with a larger W.

Subsequently, in minimum searching processing at a second level (global), the minimum comparing and updating circuit 171 compares, with values of at all steps stored in the circuit, a digital delay value of a winner (local winner) obtained at a main core 210 or a digital delay value of a winner (local winner) obtained at a branch core 220 and input, and then updates the smaller value by rewriting. Through repetition of this updating, a most similar piece among all pieces of reference data in the main core 210 and the branch core 220 is lastly stored in the minimum comparing and updating circuit 171 as an association processing result. The main core 210 and the branch core 220 will be described below in detail with reference to FIG. 12.

Fourth Embodiment of the Present Invention

Figure 6:
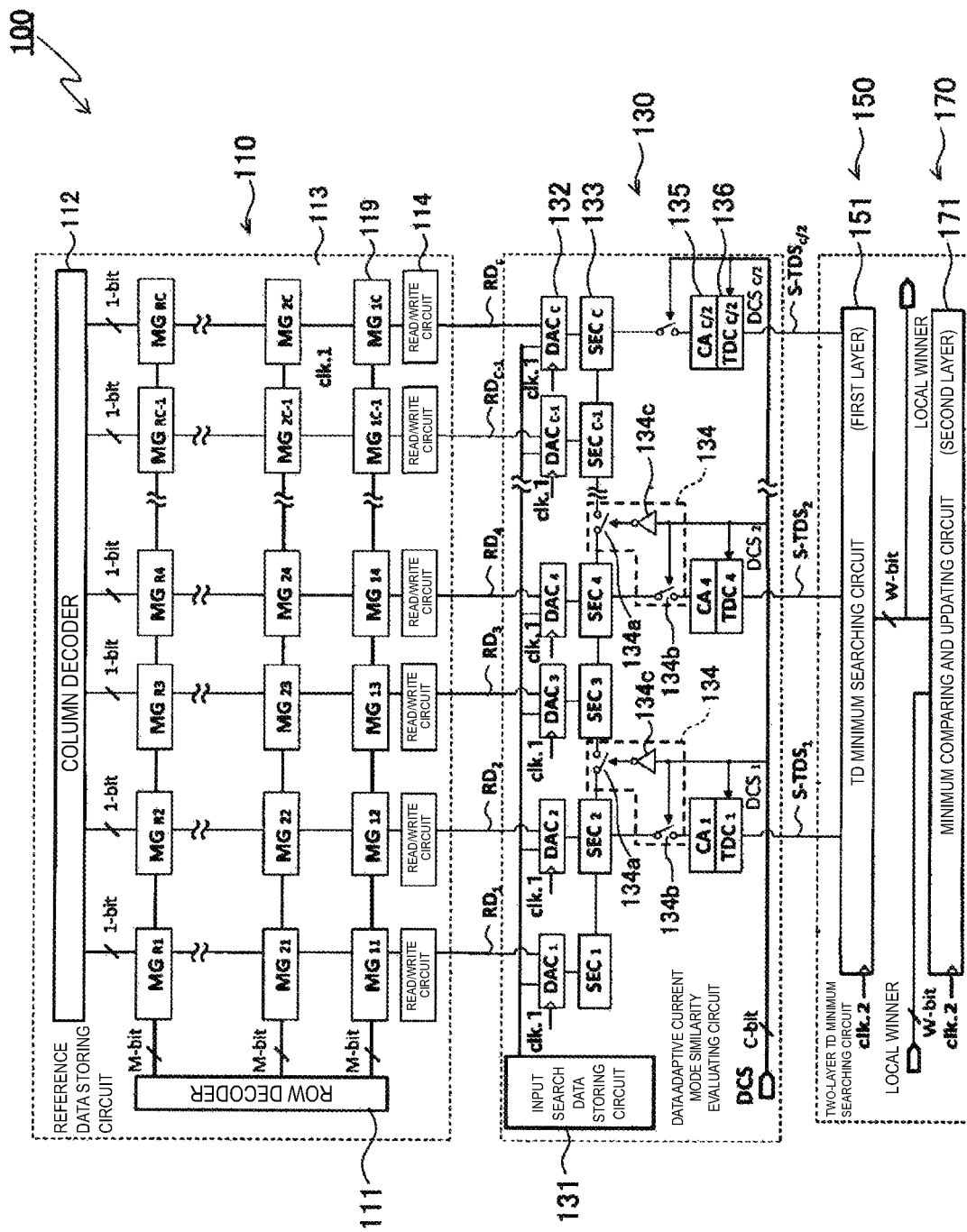
FIG. 6 is a configuration diagram of the memory device according to the fourth embodiment of the present invention.

FIG. 6 is a configuration diagram of the memory device according to the fourth embodiment of the present invention, and illustrates a specific embodiment of the memory device 100 of FIG. 4. In the memory device 100 illustrated in FIG. 6, a digital analog convertor 132 is provided in the front stage of each similarity evaluation cell 133. The digital analog convertor 132 converts an input digital voltage into an analog voltage and outputs the analog voltage to the similarity evaluation cell 133. A time-domain convertor 136 is provided in the rear stage of each current accumulator 135. The time-domain convertor 136 converts a current value output from the current accumulator 135 into a delay time. Thus, a current value is input to the time-domain convertor 136 from the endmost (e.g. rightmost) similarity evaluation cell 133 among the similarity evaluation cells 133 connected through the switches 134. Accordingly, whether the reference data dispersively stored in the plurality of columns is similar to the search data can be determined based on a time delay value.

In the embodiments illustrated in FIGS. 5 and 6, the digital analog convertor 132 is provided in the front stage of the similarity evaluation cell 133 and, based on the data converted through the digital analog convertor 132, the similarity evaluation cell 133 obtains an analog current as a value to evaluate the similarity and outputs the analog current to the current accumulator 135. Thus, whether reference data is similar to search data is obtained as a difference of current values.

Fifth Embodiment of the Present Invention

In the embodiment of the present invention, it is not necessary to provide the digital analog convertor 132 in the front stage of the similarity evaluation cell 133 and the following configuration may also be adopted. A digital voltage value of the search data and a digital voltage value of the reference data are input sequentially to the similarity evaluation cell 133. The similarity evaluation cell 133 obtains a digital value to evaluate the similarity. The digital value is converted into an analog value by a digital analog convertor (not shown) provided in the rear stage of the similarity evaluation cell 133 and output to the current accumulator 135. For such a similarity evaluation cell 133, a circuit used in the digital approach may be modified as appropriate and used.

Sixth Embodiment of the Present Invention

In the above embodiment, an output from the current accumulator 135 is converted into a delay time through the time-domain convertor 136 to obtain the shortest delay time. However, the present invention is not limited to the above embodiment and the following configuration may also be adopted. A circuit that directly compares and updates the minimum value of an analog voltage in the form of an analog value without making any changes is provided, or a circuit that converts the minimum value of an analog voltage into a digital value and a circuit that compares and updates the digital value are provided. As an example, resistors are connected to output ends of the respective current accumulators to convert analog currents flowing from the respective current accumulators into analog voltages from which the minimum value is searched. The searching unit 150 illustrated in FIG. 3 to FIG. 6 may be composed of a minimum analog voltage searching circuit. A specific example of the minimum analog voltage searching circuit will be described below in detail with reference to FIG. 33.

Seventh Embodiment of the Present Invention

Next, a preferred embodiment of the memory unit 110 in the memory device 100 according to the embodiment of the present invention is described. FIG. 7 is a configuration diagram of the memory device according to the seventh embodiment of the present invention and provided to explain details of the memory unit in the memory device 100. The memory unit 110 includes a reference data storing circuit that is composed of memory arrays of (R×M) rows and C columns and configured to store (R×C)/N pieces of reference data. Although FIG. is a configuration diagram corresponding to FIG. 5, other embodiments as illustrated in FIGS. 3, 4 and 6 may also be employed.

The reference data storing circuit as the memory unit 110 includes R×C (C≥N) memory grains (MG) 119 configured to store one-dimensional data, and each memory grain 119 stores an M-bit value. A power driver (PD) 118 for power gating is installed at each memory grain 119, and independently controls electrical power supply through a row decoder, a column decoder, and clock 1 (clk.1). Accordingly, C/N pieces of reference data are stored in the memory grains (MG) 119 on one row and output to the similarity evaluation cells 133 in parallel to execute associative recognition.

The following describes the memory unit 110 of the memory device 100 illustrated in FIG. 7 further in detail. The reference data storing circuit as the memory unit 110 includes a row decoder 111, a column decoder 112, the memory area 113, and a read/write circuit 114. The memory area 113 includes a plurality of row lines 115, a plurality of bit lines 116, a plurality of column lines 117, a plurality of the power drivers (PD) 118, a plurality of the memory grains (MG) 119. Each memory grain 119 is composed of a nonvolatile memory.

The row decoder 111 is connected with the plurality of row lines 115, and the column decoder 112 is connected with the plurality of column lines 117.

The memory area 113 is divided into a plurality of regions. Each region is specified by the column lines 117 in an optional number of one to N inclusive and the M row lines 115, and provided with a pair of the corresponding power driver 118 and memory grain 119. The optional number of the column lines 117, the number of the row lines 115, and the number of the bit lines 116 are set at designing and manufactured in accordance with the settings. The "optional number" includes a number determined by a user of the memory device or a constant value simply determined at designing and manufacturing. In FIG. 7, each region includes one of the column lines 117, M of the row lines 115, and M of the bit lines 116. The natural numbers M and N are defined in the same manner for the search data 10 and the reference data 30 described above as referring to FIGS. 1 and 2.

In the embodiment of the present invention, the memory grains 119 each composed of nonvolatile memories of M bits and the power drivers 118 paired with the memory grains 119 and configured to supply electrical power to the memory grains 119 are provided in each region specified by the column lines 117 in the optional number and the M row lines 115 in the memory area 113. The column lines 117 in the optional number are provided in each region. The "optional number" includes a number determined by the user of the memory device or a constant value simply determined at designing and manufacturing. The optional number of the column lines 117 is equal to the optional number of the memory grains 119 for each region, and is equal to one in FIG. 7.

In the embodiment of the present invention, each power driver 118 receives inputting of a control signal from each of the column lines 117 in the optional number, inputting of a control signal from each of the M row lines 115, and inputting of a clock signal, and supplies electrical power to the memory grain 119 paired with the power driver 118 in synchronization with the clock signal. Accordingly, the reference data of each dimension stored in the memory grain 119 is read and output to the read/write circuit 114 at the corresponding column through the bit lines 116.

Accordingly, electrical power is supplied not to the entire memory area 113 but to the memory grain 119 of each region to be read, and thus electrical power is supplied only to a necessary place only in a necessary time through inputting of the clock signal. This leads to significant reduction of electric power consumption at reading of the reference data stored in the memory area 113.

As illustrated in FIG. 7, the memory grains 119 are provided in an R×C matrix of $MG_{11}$ to $MG_{RC}$. With this configuration, when one or a plurality of the power drivers 118 are specified by one or a plurality of the row lines 115 to which a control signal flows from the row decoder 111 and one or a plurality of the column lines 117 to which a control signal flows from the column decoder 112, and clock signal "1" is input to each specified power driver 118, electrical power is supplied from the power driver 118 to the memory grain 119 paired with the power driver 118 only during the inputting. When clock signal "0" is input to the specified power driver 118, supply of electrical power to the memory grain 119 paired with the power driver 118 is stopped. Alternatively, the power driver 118 may supply the electrical power to the memory grain 119 paired with the power driver 118 when clock signal "0" is input to the power driver 118, and the power driver 118 may supply no electrical power to the memory grain 119 paired with the power driver 118 when clock signal "1" is input to the power driver 118. The clock signals "0" and "1" correspond to "H" and "L".

The inputting of control signals from the M row lines 115 may be sequentially performed for each set of row lines in a predetermined number of one to M or may be simultaneously performed for the first to M-th row lines.

Figure 8:
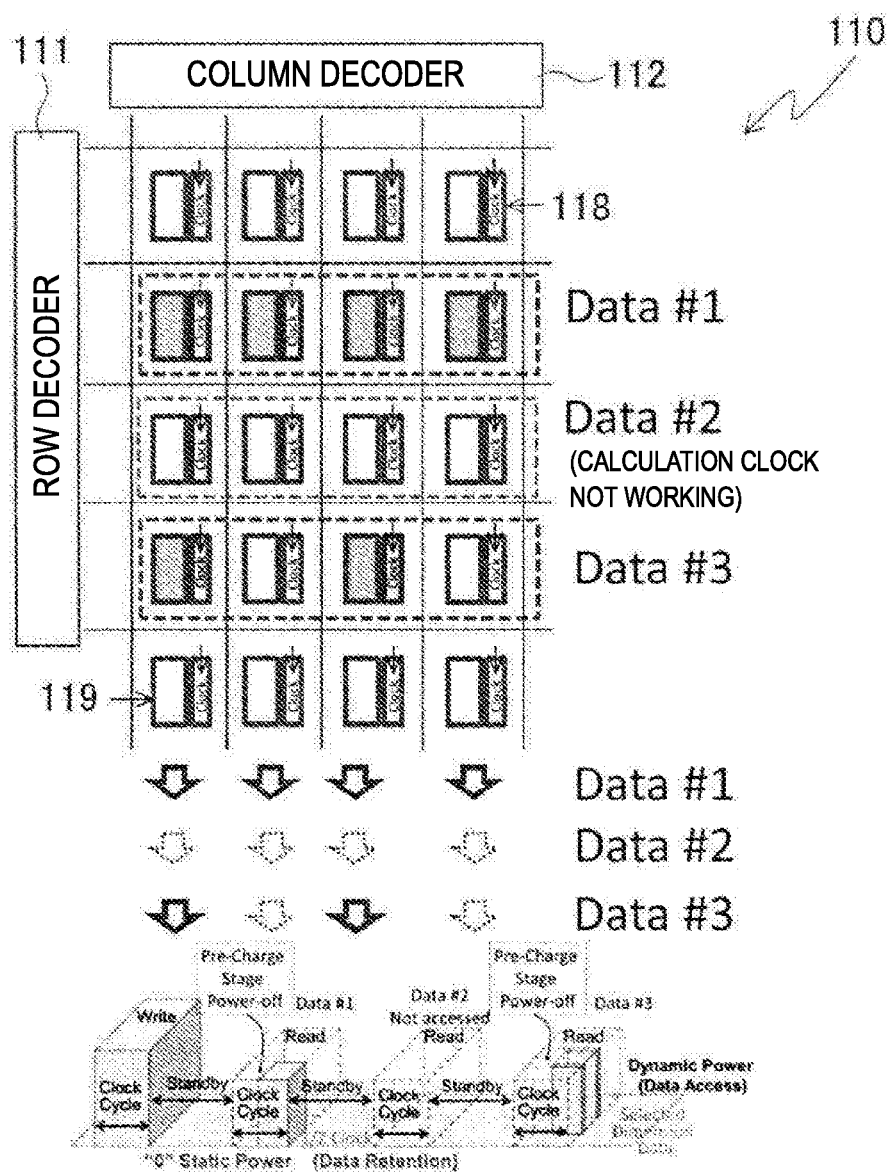
FIG. 8 is a diagram schematically illustrating a memory unit in the memory device according to the fifth embodiment of the present invention and operation and electric power consumption thereof.
Figure 9:
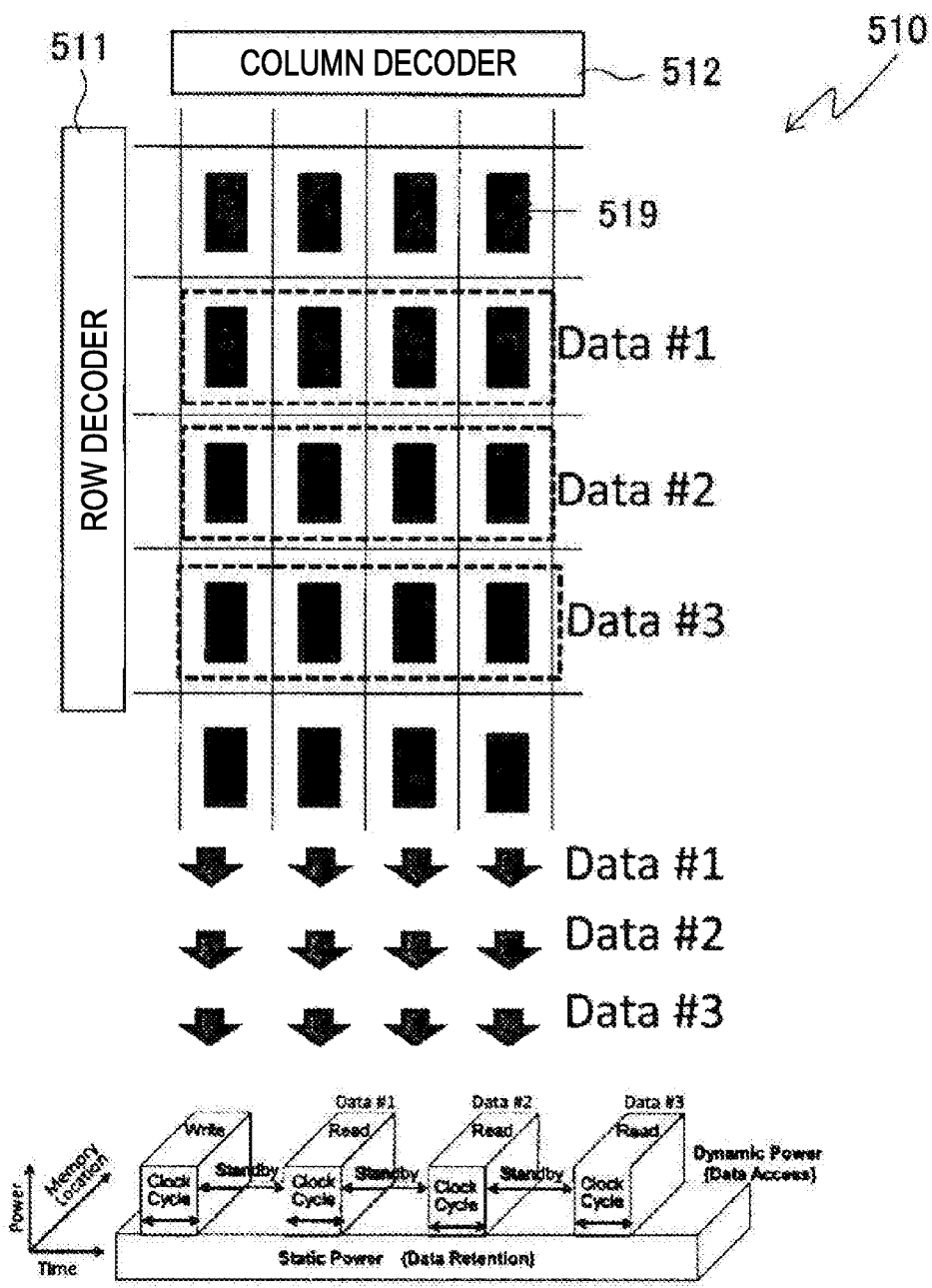
FIG. 9 is a diagram schematically illustrating a memory unit in a conventional approach and operation and electric power consumption thereof.
Figure 10:
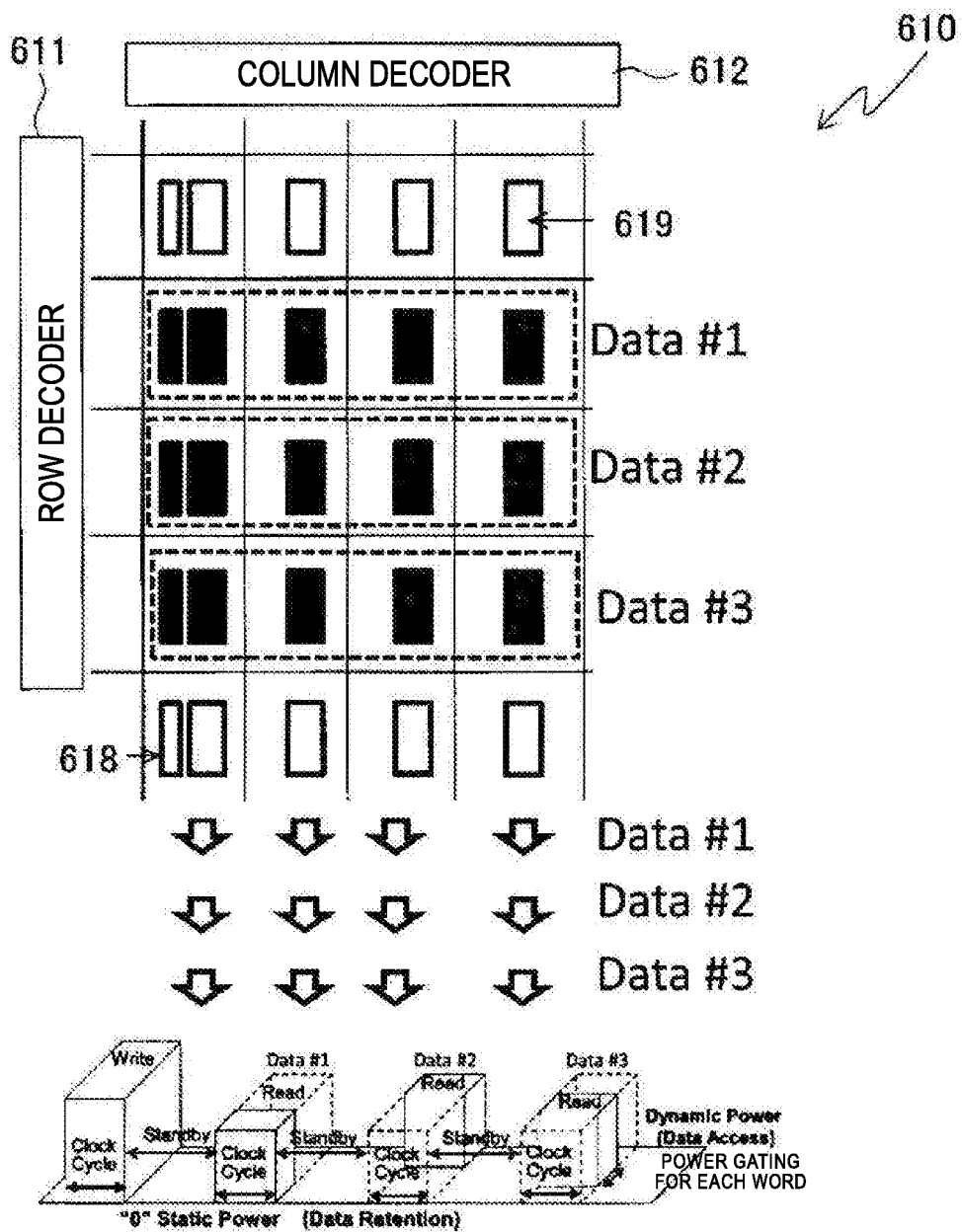
FIG. 10 is a diagram schematically illustrating a memory unit composed of a conventional STT-MRAM and operation and electric power consumption thereof.

The following describes power saving achieved in the memory device 100 illustrated in FIG. 7 in detail. FIGS. 8 to 10 are diagrams for comparing the memory unit and operation and electric power consumption thereof in the memory device according to the embodiment of the present invention with those of a conventional technology.

FIG. 8 is a diagram schematically illustrating the memory unit and operation and electric power consumption thereof in the memory device according to the fifth embodiment of the present invention. The upper part of FIG. 8 schematically illustrates the memory unit 110. The middle part of FIG. 8 illustrates regions at rows from which data is read when Data #1, Data #2, and Data #3 are sequentially read at each row. In the lower part of FIG. 8, the horizontal axis represents time, the vertical axis represents electric power consumption, and the depth axis represents the position of a memory grain.

The power drivers 118 are provided for the respective dimensions of reference data (respective memory grains) to allow simultaneous activation of a plurality of optional column lines 117 as well as fine-grain power gating so that electrical power is flexibly supplied only to a necessary memory grain 119 corresponding to each necessary data dimension in one Data. In addition, an operation calculation clock signal is input to each power driver 118 so that electrical power is supplied from the power driver 118 to the corresponding memory grain 119 in synchronization with the clock signal.

Through this reading control, electrical power is consumed only when data necessary for calculation is in a calculation operation, and not when no clock signal of calculation operation is input. Moreover, electrical power is consumed only when a clock pulse is "0" at reading. When the clock pulse is "1" (in the first half of a clock), the bit line 116 is pre-charged to 0 V, and thus no electrical power needs to be supplied, which halves electric power consumption in the calculation operation.

For example, as for Data #1, electric power consumption is halved at reading when data output is necessary for all dimensions of reference data because a clock is used. This is because of the following reason. By introducing clock control, the memory grains 119 are supplied with no electrical power but pre-charged in the first half of a clock, in other words, when a clock signal is "H". A specified memory grain 119 is supplied with electrical power to read data in the second half of a clock, in other words, when a clock signal is "L". This pre-charge prevents occurrence of "disturb" false operation when electrical power supply is switched at high speed, and thus data is not rewritten when the reference data is read.

As for Data #2, an operation calculation clock is controlled so that the power drivers 118 are not operated, and thus memory operation dynamically stops, which leads to minimization of electric power consumption.

As for Data #3, when data output is necessary for some dimensions of reference data, electrical power is supplied only to a minimum necessary number of the memory grains 119, thereby achieving optimization of electric power consumption.

In memory device 100 illustrated in FIG. 7, the memory unit 110 is composed of a nonvolatile memory based on cycle-based fine-grain controllable power gating. With this configuration, electric power consumption is zero at standby, and electrical power is supplied to a necessary part of the memory unit 110 but not to an unnecessary part, thereby reducing electric power consumption.

Nonvolatile memories have been developed with focus on various different specifications such as small area, fast speed, high stability, and low write current. In this example, a fast and stable nonvolatile memory cell is needed to achieve cycle-based fine-grain controllable power gating. In the embodiment of the present invention, typically, a differential-pair STT-MRAM memory cell is preferably used. This will be described later in detail in an implementation example.

As described later in the implementation example, searching can be performed at high speed and cycle-based fine-grain controllable power gating can be achieved because of the following reasons.

The first reason is that a differential-pair STT-MRAM memory cell (for example, 4T-2MTJ cell), which is capable of responding swiftly at electrical power supply and performing fast and stable operation, is employed. The 4T-2MTJ cell is characterized in that it can perform faster data reading from MTJ and causes no "disturb" false operation due to fast on and off operations of a power source.

The second reason is that bit lines are pre-charged to 0 V before electrical power supply to avoid accumulation of unnecessary electric charge and hence allow data reading at high speed.

In memory device 100 illustrated in FIG. 7, significantly low electrical power consumption at an associative memory can be achieved by employing a nonvolatile memory device based on cycle-based fine-grain controllable power gating. The system is reconstructed in accordance with the dimension number of data through the switches 134 of the similarity evaluating unit 130, and the nonvolatile memory device based on cycle-based fine-grain controllable power gating supplies electrical power to a minimum necessary number of memories in accordance with the reconstruction, thereby optimizing electric power consumption at operation.

The following describes memory units of a conventional NNS associative memory in a digital approach and an analog approach (hereinafter referred to as "conventional approach"). FIG. 9 is a diagram schematically illustrating a memory unit 510 in the conventional approach and operation and electric power consumption thereof. The upper part of FIG. 9 schematically illustrates the memory unit 510. The middle part of FIG. 9 illustrates regions at rows from which data is read when Data #1, Data #2, and Data #3 are sequentially read at each row. In the lower part of FIG. 9, the horizontal axis represents time, the vertical axis represents electric power consumption, and the depth axis represents the position of a memory grain.

In the conventional approach, the memory area of the memory unit 510 is composed of a volatile SRAM. Thus, when reference data is written to all memory grains 519, electrical power needs to be constantly supplied at reading of Data #1, reading of Data #2, and reading of Data #3. Reference sign 511 denotes a row decoder, and Reference sign 512 denotes a column decoder.

FIG. 10 is a diagram schematically illustrating a memory unit composed of a conventional STT-MRAM and operation and electric power consumption thereof. The upper part of FIG. 10 schematically illustrates a memory unit 610. The middle part of FIG. 10 illustrates regions at rows from which data is read when Data #1, Data #2, and Data #3 are sequentially read at each row. In the lower part of FIG. 10, the horizontal axis represents time, the vertical axis represents electric power consumption, and the depth axis represents the position of a memory grain.

In a conventional STT-MRAM disclosed in Non Patent Literature 9, a fine-grain power gating technology is employed so that a power driver 618 is provided for each reference data of one Data, in other words, for each set of N memory grains 619, and independently supplied with electric power. Thus, electrical power can be supplied in accordance with the location of access reference data specified by the addresses of a column decoder and a row decoder at writing of reference data, reading of Data #1, reading of Data #2, and reading of Data #3, and no electrical power needs to be supplied to an unnecessary memory place. However, power gating is provided for each Data, and thus all memory grains 619 are simultaneously supplied with electrical power to read data of all dimensions in one Data. Reference sign 611 denotes a row decoder, and Reference sign 612 denotes a column decoder.

Figure 11A:
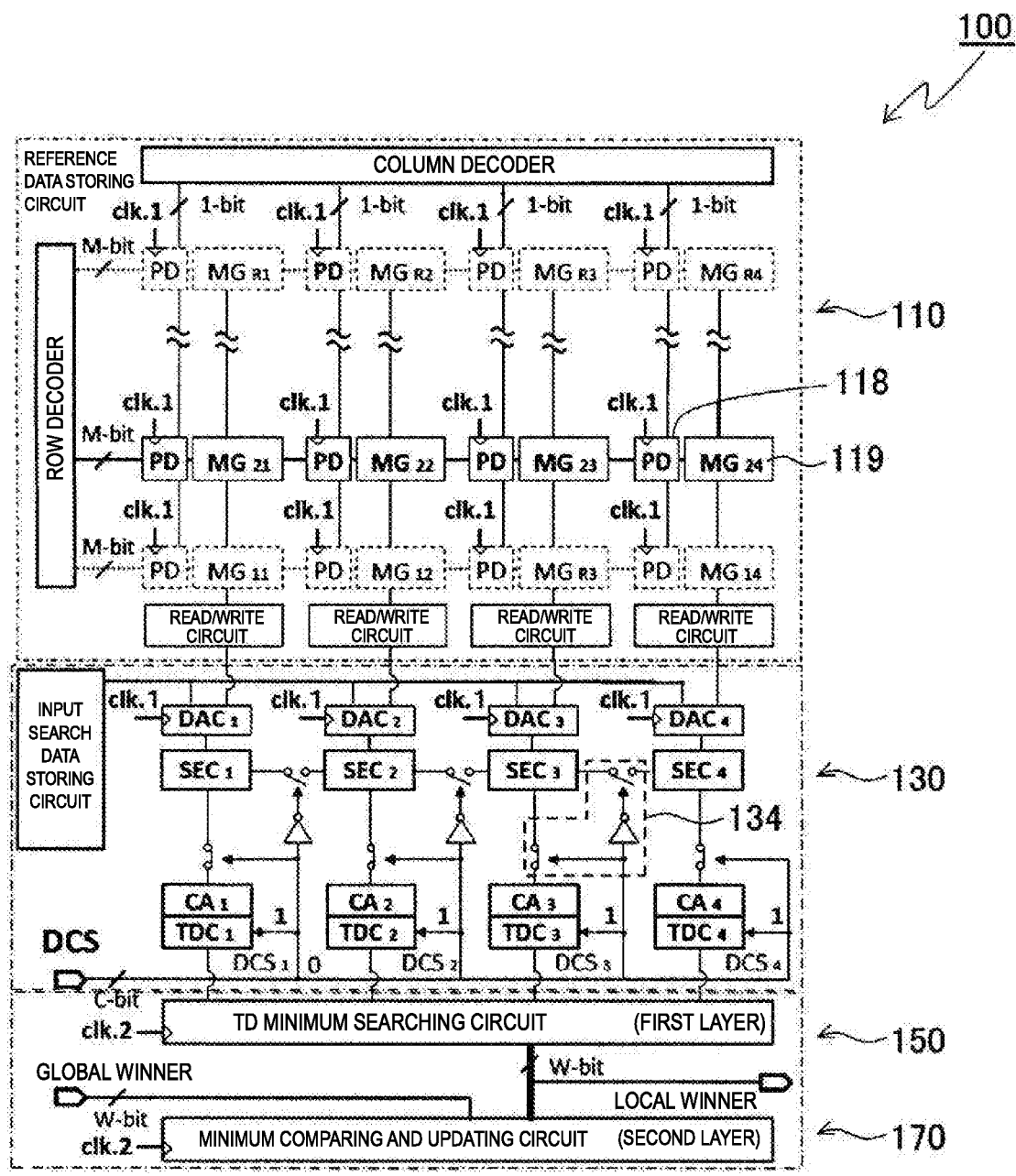
FIG. 11A is a diagram illustrating reconstruction of the memory device when reference data is one-dimensional.
Figure 11B:
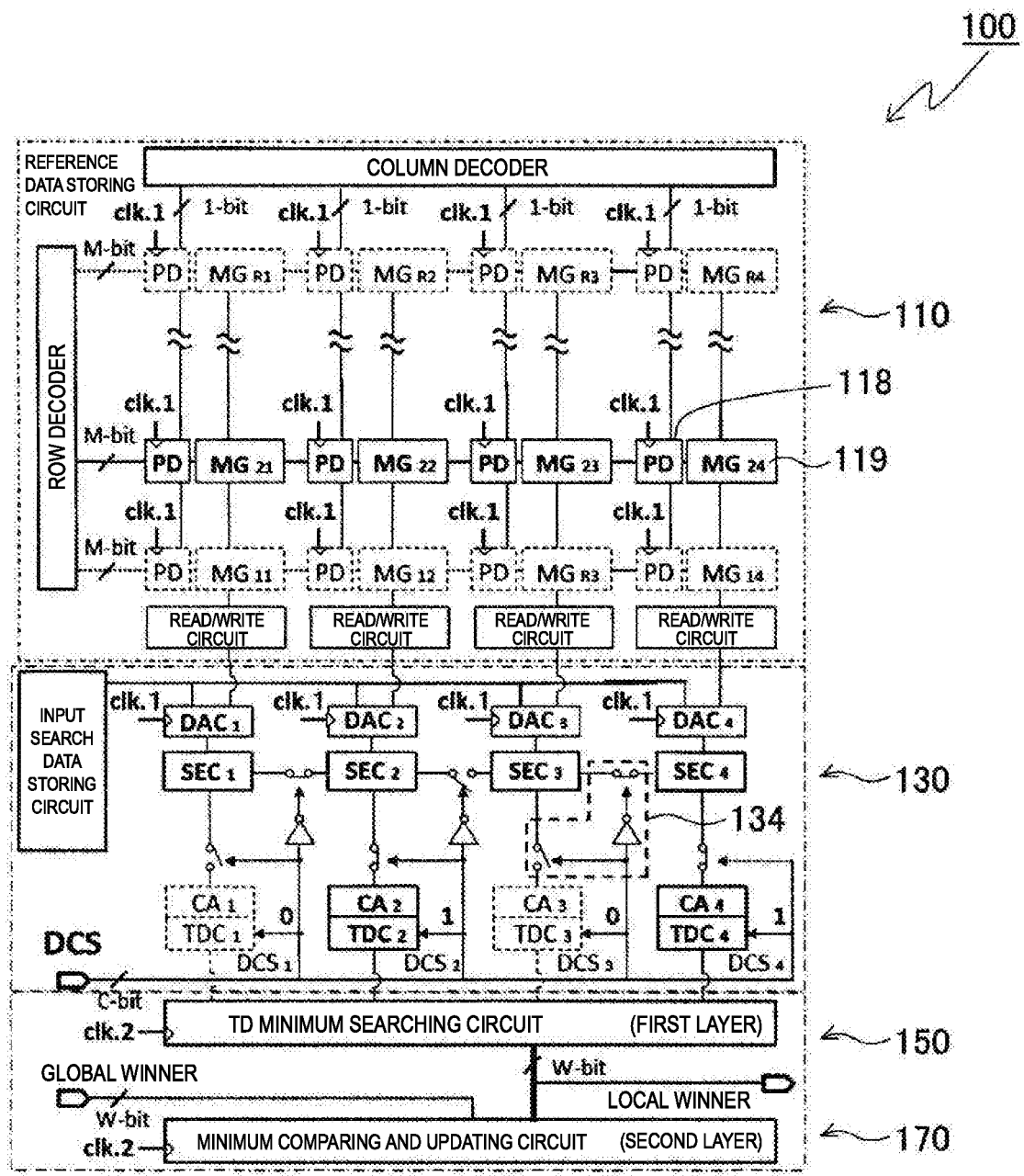
FIG. 11B is a diagram illustrating reconstruction of the memory device when reference data is two-dimensional.
Figure 11C:
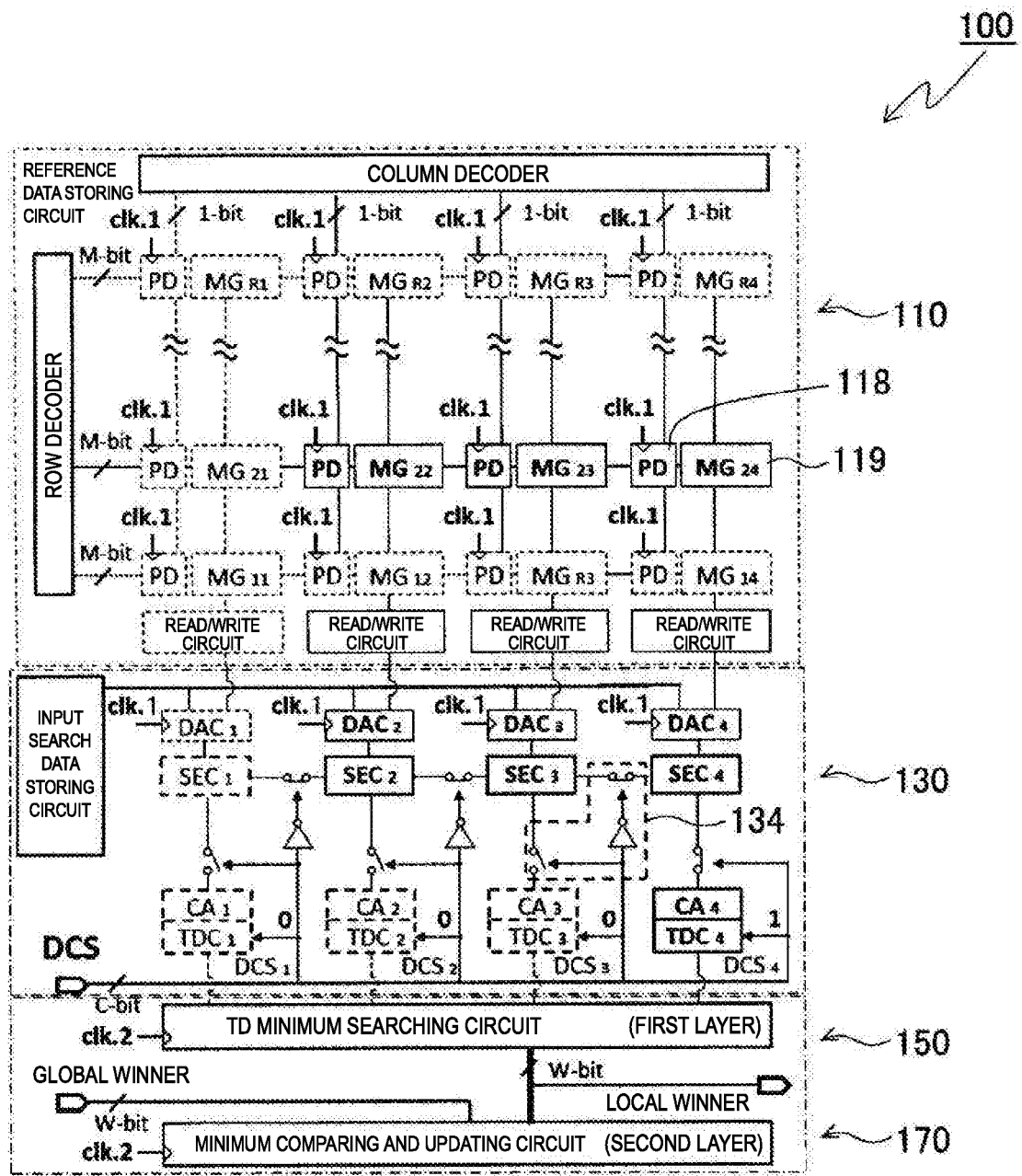
FIG. 11C is a diagram illustrating reconstruction of the memory device when reference data is three-dimensional.
Figure 11D:
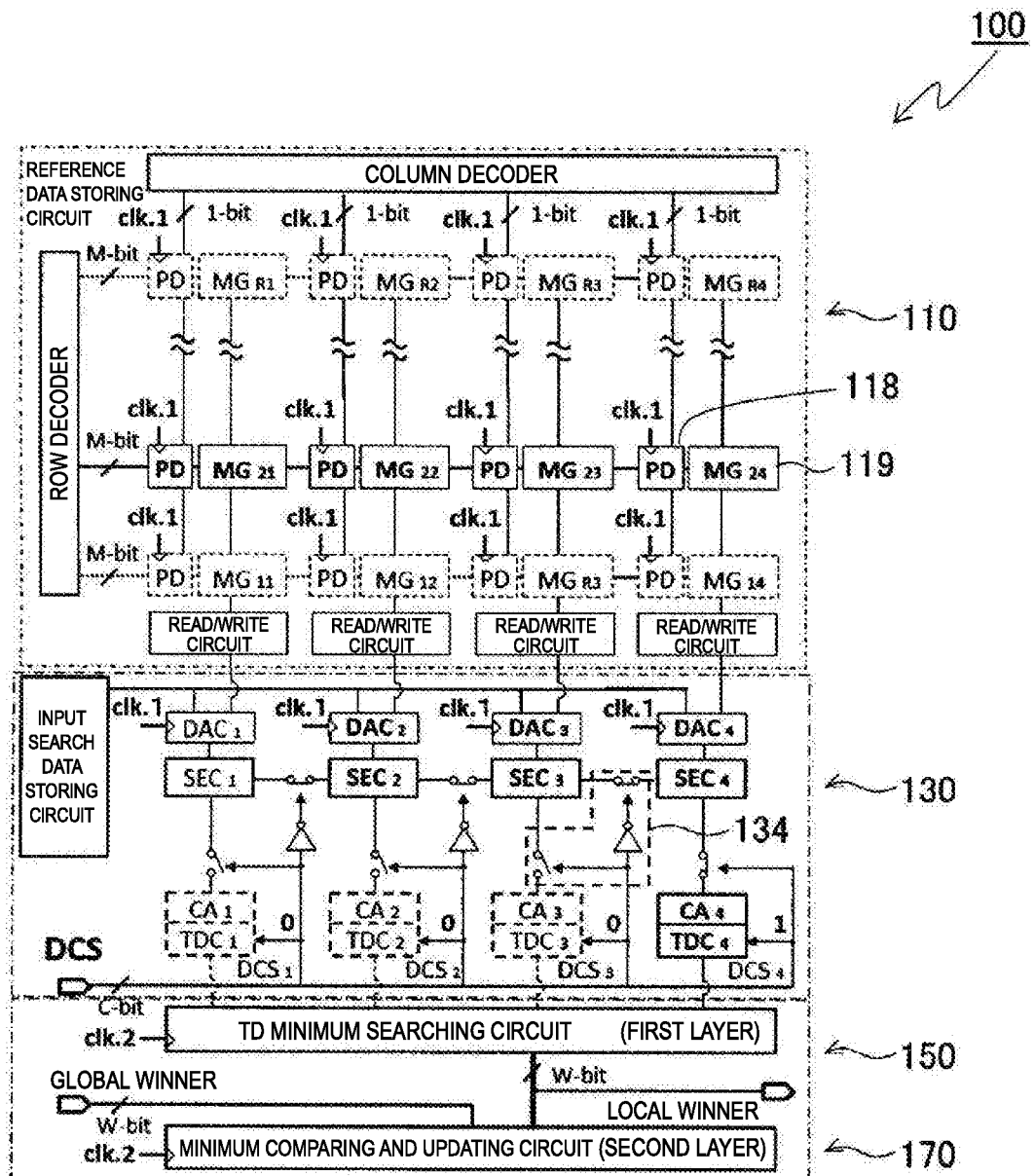
FIG. 11D is a diagram illustrating reconstruction of the memory device when reference data is four-dimensional.

The following describes a system architecture (the case of the column number C=4) reconstructed in accordance with one to four-dimensional reference data as a chip including an RX4 matrix of memory grains. FIG. 11A is a diagram illustrating reconstruction of the memory device when reference data is one-dimensional. FIG. 11B is a diagram illustrating reconstruction of the memory device when reference data is two-dimensional. FIG. 11C is a diagram illustrating reconstruction of the memory device when reference data is three-dimensional. FIG. 11D is a diagram illustrating reconstruction of the memory device when reference data is four-dimensional. These diagrams illustrate operation states of cycle-based fine-grain controllable power gating of the nonvolatile memory device, and illustrate, with dotted lines, any memory grain 119 supplied with no electrical power in the memory unit 110. Similarly, in the similarity evaluating unit 130, any deactivated part is illustrated with dotted lines, and any non-deactivated part is illustrated with solid lines.

Eighth Embodiment of Present Invention

Figure 12:
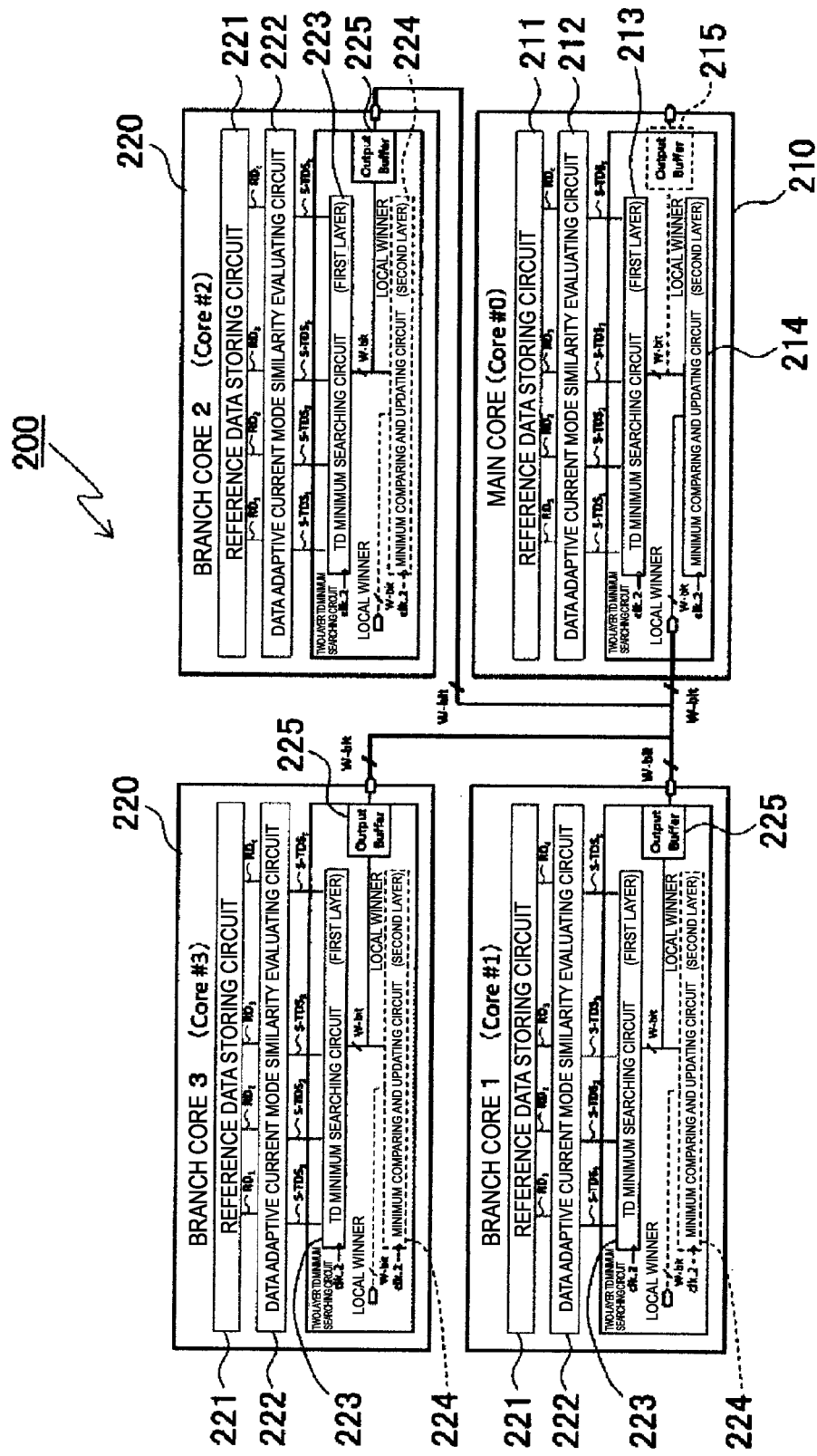
FIG. 12 is a configuration diagram of the memory system according to the eighth embodiment of the present invention.

FIG. 12 is a configuration diagram of a memory system of the eighth embodiment of the present invention. The memory system 200 includes a plurality of the memory devices 100, one of which is the main core 210 and any other of which is the branch core 220. The main core 210 and each branch core 220 have identical configurations. Specifically, both the main core 210 and the branch core 220 include reference data storing circuits 211 and 221 as a memory unit, data adaptive current mode similarity evaluating circuits 212 and 222 as a similarity evaluating unit, time-domain minimum searching circuits 213 and 223 as a searching unit, minimum comparing and updating circuits 214 and 224 as a comparing and updating unit, and output buffers 215 and 225.

Each of the reference data storing circuits 211 and 221 includes a column decoder, a row decoder, memory grains provided in a matrix format as a memory area, and a read/write circuit. The read/write circuit writes and reads reference data to/from each memory grain. Specifically, the reference data storing circuits 211 and 221 write and read reference data to/from the memory grains for each row.

Each of the data adaptive current mode similarity evaluating circuits 212 and 222 includes at least an input search data storing circuit, similarity evaluation cells, current accumulators, and time-domain convertors. Search data stored in the input search data storing circuit is divided and input to the similarity evaluation cells at respective columns. Similarity between the reference data read from the memory grain for each column of each row of the reference data storing circuit and the search data is evaluated in the similarity evaluation cell and input to the current accumulator as a current value. The current accumulators accumulate current values of input similarities and output the current values to the time-domain convertors. The time-domain convertors convert the input current values into delay times. The "data adaptive" herein means the applicability to dimension numbers of search data and reference data and optional numbers and details thereof are as described above.

The time-domain minimum searching circuits 213 and 223 as a searching unit receive inputting of current values output from the data adaptive current mode similarity evaluating circuits 212 and 222, detect a current of reference data most similar to search data, which is a current of similarity, convert the detected value into delay time data, and obtain most similar reference data for each row from reference data stored in the reference data storing circuits 211 and 221, or a reference data candidate having high similarity as a local winner.

The minimum comparing and updating circuit 214 as a comparing and updating unit is activated only in the main core 210 and configured to compare reference data read for each row from the reference data storing circuits 211 and 221 and update reference data most similar to search data.

Thus, the minimum comparing and updating circuit 214 as a comparing and updating unit obtains a reference data candidate having the highest similarity as a global winner from among local winners obtained in each reading and similarity evaluation at the time-domain minimum searching circuits 213 and 223 as a searching unit, and the similarity of the global winner is stored in a temporary storage circuit.

The output buffer 225 is activated only in the branch core 220 and configured to temporarily store local winners obtained at the time-domain minimum searching circuit 223 in the branch core 220 and output the local winners to the minimum comparing and updating circuit 214 in the main core 210.

An output buffer 215 is deactivated in the main core 210, and a minimum comparing and updating circuit 224 is deactivated in the branch core 220. In FIG. 12, each deactivated element is illustrated with dotted lines.

In the memory system 200 illustrated in FIG. 12, the minimum comparing and updating circuit 214 as a comparing and updating unit compares the similarity of the local winner obtained by the time-domain minimum searching circuit 213 as a searching unit in the main core 210 and the similarity of the global winner stored in the temporary storage circuit, and compares the similarity of the local winner calculated by the time-domain minimum searching circuit 223 as a searching unit in the branch core 220 and the similarity of the global winner stored in the temporary storage circuit.

Thus, the candidates obtained in the main core 210 and the branch core 220, or the reference data candidates similar to the search data do not need to be compared again, so that no circuit for re-comparing is required and the device can be made compact. Comparing and updating are also be performed only at the minimum comparing and updating circuit 214 as a comparing and updating unit in the main core 210. Hence, searching by the searching unit can be performed in parallel with comparing and updating, thereby enabling processing for shorter time.

A minimum comparing and updating circuit 214 is activated only in the main core 210, and at each clock (clock 1), a result of the local winner (W bits) of each branch core 220 input to the minimum comparing and updating circuit 214 through a pipeline is compared with a self association result at the previous step, and the smaller result is updated by rewriting. Accordingly, reference data most similar to search data is detected from the entire multicore system. The number of connectable chips of the multicore system is determined by W of the local winner and the bit number M of one-dimensional data.

Figure 13:
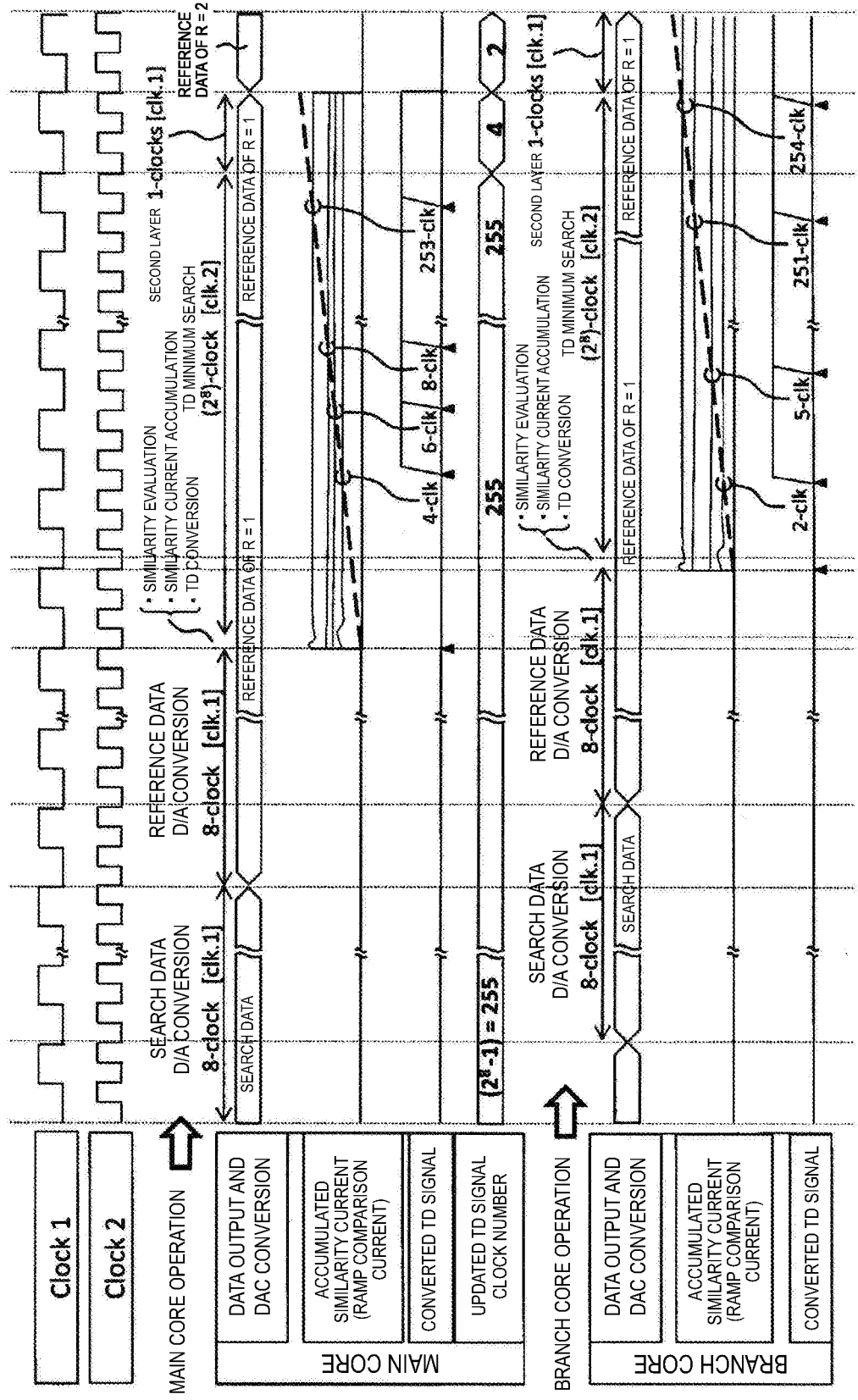
FIG. 13 is a time chart of claimed parts of a similarity evaluating unit, a searching unit, and a comparing and updating unit in the memory system illustrated in FIG. 12.

FIG. 13 is a time chart of main parts of a similarity evaluating unit, a searching unit, and a comparing and updating unit in the memory system illustrated in FIG. 12. FIG. 13 assumes a case with C=4, N=1, W=8, R=no restriction, illustrates exemplary operation at the main core 210 and each branch core 220, mainly illustrating system operation of current-mode similarity evaluation and two-level pipeline TD minimum searching.

Figure 14:
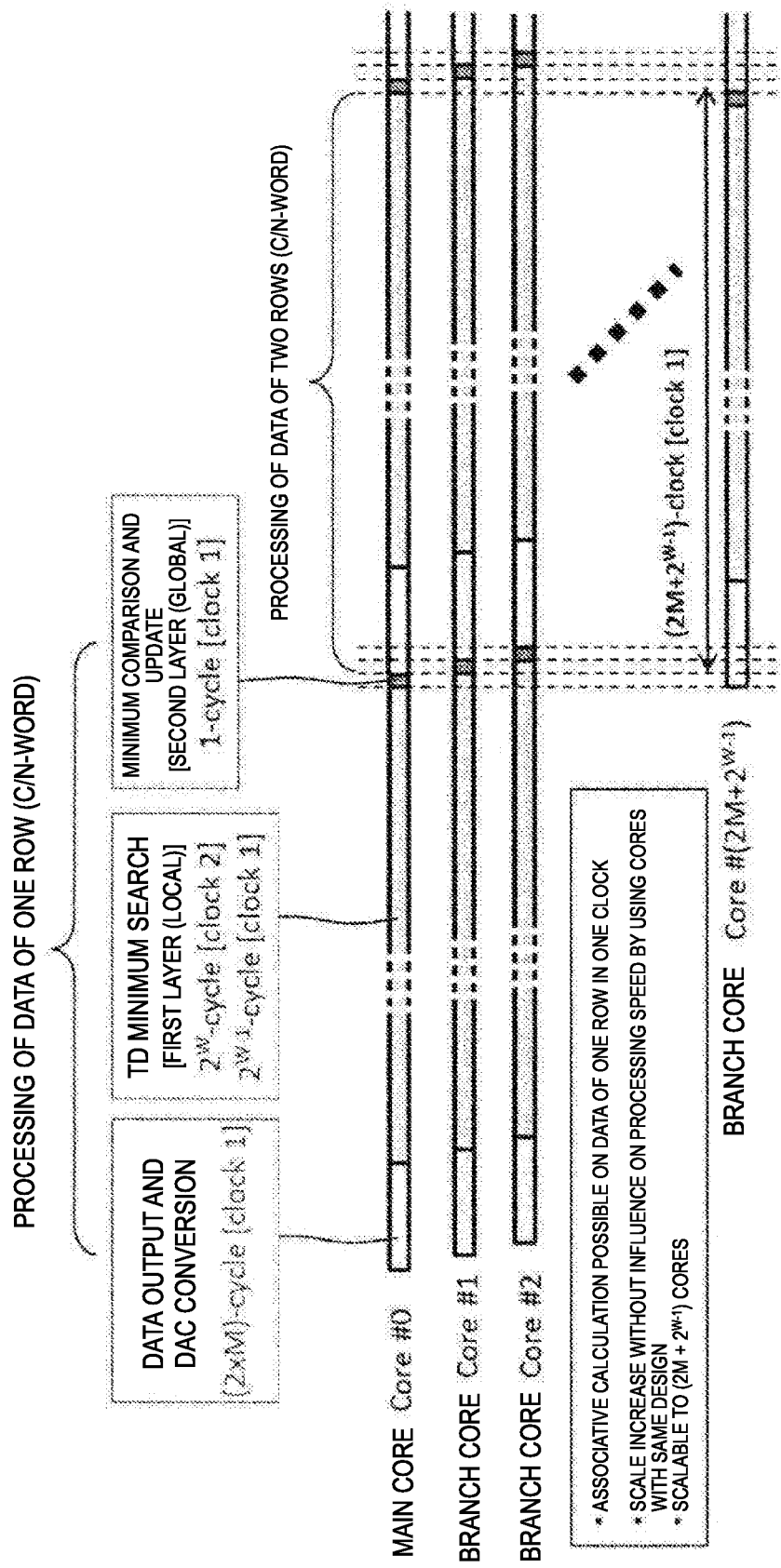
FIG. 14 is a diagram for description of operation of the memory system illustrated in FIG. 12.

FIG. 14 is a diagram for description of operation of the memory system 200 illustrated in FIG. 12. Each (one Data) of reference data and search data are composed of data of N ($\geq 1$) dimensions, and data of each dimension is expressed in an M-bit digital value. The reference data storing circuit as the memory unit 110 is composed of a memory cell array of (R×M) rows and C columns, one-dimensional data of R×C ($C \geq N$) is stored in the memory grains 119, and an M-bit value is stored in each memory grain 119. The main core 210 takes ($2M+2^{W-1}$)-clock to process "Data output and DAC conversion" and "TD minimum searching" on the second row, and during this time, "minimum comparing and updating" processing of the local winner from each branch core 220 is simultaneously executed, and thus ($2M+2^{W-1}$) cores can be connected to an identical system. Thus, a 144-core system is achieved when the memory bit number M of one-dimensional data is eight and the counter bit number W is eight.

As illustrated in FIG. 14, time domain minimum searching takes a longest time, and data D/A conversion and similarity evaluation take shorter processing times.

In the embodiment of the present invention, digital analog conversion is performed for each row of the memory area, which causes delay. Although the digital analog conversion processing causes delay, the time domain minimum searching takes the longer processing time and is dominant. In an NNS associative memory in the conventional analog approach, a plurality of dimensions of reference data are converted through one D/A conversion. In the embodiment of the present invention, one piece of one-dimensional data is converted by one digital analog convertor, which eliminates conversion overhead to achieve faster processing. In an NNS associative memory in any of the analog approach and the digital approach, and in the embodiment of the present invention, the processing time of searching for a minimum value that is, an earliest time-domain signal from a time-domain signal is more dominant than D/A conversion. For example, the D/A conversion needs a time of 8-cycle, and the time domain minimum searching needs a time of 100 to 200-cycle. This is because a ramp signal needs to be long enough to achieve a resolution for distinguishing an early time-domain signal and a late time-domain signal. Similarity currents having a small difference therebetween cannot be distinguished from each other when a time from 0 V to, for example, 1 V is insufficiently long. Specifically, since a similarity, which is a digital value in a case of an associative memory in the digital approach, or a current value in cases of an associative memory in the analog approach and the embodiment of the present invention, is converted into delay of a time-domain signal, the difference between time-domain signal delays converted from similarities having a small difference therebetween is small, and thus the distinction is difficult without measurement in a sufficiently long time.

In the embodiment of the present invention, multicore-based pipeline operation is employed to improve a time-domain minimum searching speed. The pipeline absorbs a time taken for local long time-domain minimum searching processing at each core so that the processing is completed in one clock. When this multicore-based pipeline scheme is not used, information on similar reference data is obtained at a speed equivalent to that for an associative memory in the conventional analog approach. Additionally, the number of dimensions of reference data and search data can be adjusted optionally and therefore an increase in the number of dimensions is accompanied by an increase in the number of memory grains for storing reference data. Assuming that data is processed only by one core, it takes ($2M+2^{W-1}$)-clock to process "TD minimum searching" processing per row in the memory area as illustrated in FIG. 14 and the number of rows to process is increased in the memory area in accordance with an increase in the number of dimensions. However, owing to the time-domain minimum searching processing using a plurality of cores as in the case of the embodiment of the present invention, an increase in the time to search for reference data similar to search data can be suppressed.

[Memory System in the Embodiment of the Present Invention]

FIG. 12 is a configuration diagram of a memory system in the embodiment of the present invention. The memory system 200 includes a plurality of the memory devices, one of which is the main core 210 and any other of which is the branch core 220. The main core 210 and each branch core 220 have identical configurations. Specifically, both the main core 210 and the branch core 220 include reference data storing circuits 211 and 221 as a memory unit, data adaptive current mode similarity evaluating circuits 212 and 222 as a similarity evaluating unit, time-domain minimum searching circuits 213 and 223 as a searching unit, minimum comparing and updating circuits 214 and 224 as a comparing and updating unit, and output buffers 215 and 225.

Each of the reference data storing circuits 211 and 221 includes a column decoder, a row decoder, memory grains provided in a matrix format as a memory area, and a read/write circuit. The read/write circuit writes and reads reference data to/from each memory grain. Specifically, the reference data storing circuits 211 and 221 write and read reference data to/from the memory grains for each row.

Each of the data adaptive current mode similarity evaluating circuits 212 and 222 includes at least an input search data storing circuit, similarity evaluation cells, current accumulators, and time-domain convertors. Search data stored in the input search data storing circuit is divided and input to the similarity evaluation cells at respective columns. Similarity between the reference data read from the memory grain for each column of each row of the reference data storing circuit and the search data is evaluated in the similarity evaluation cell and input to the current accumulator as a current value. The current accumulators accumulate current values of input similarities and output the current values to the time-domain convertors. The time-domain convertors convert the input current values into delay times. The "data adaptive" herein means the applicability to dimension numbers of search data and reference data and optional numbers and specific configurations of the memory devices constituting the main core 210 and the branch core 220 are as described later in detail with reference to, for example, FIG. 5.

The time-domain minimum searching circuits 213 and 223 as a searching unit receive inputting of current values output from the data adaptive current mode similarity evaluating circuits 212 and 222, detect a current of reference data most similar to search data, which is a current of similarity, convert the detected value into delay time data, and obtain most similar reference data for each row from reference data stored in the reference data storing circuits 211 and 221, or a reference data candidate having high similarity as a local winner.

The minimum comparing and updating circuit 214 as a comparing and updating unit is activated only in the main core 210 and configured to compare reference data read for each row from the reference data storing circuits 211 and 221 and update reference data most similar to search data.

Thus, the minimum comparing and updating circuit 214 as a comparing and updating unit obtains a reference data candidate having the highest similarity as a global winner from among local winners obtained in each reading and similarity evaluation at the time-domain minimum searching circuits 213 and 223 as a searching unit, and the similarity of the global winner is stored in a temporary storage circuit.

The output buffer 225 is activated only in the branch core 220 and configured to temporarily store local winners obtained at the time-domain minimum searching circuit 223 in the branch core 220 and output the local winners to the minimum comparing and updating circuit 214 in the main core 210.

An output buffer 215 is deactivated in the main core 210, and a minimum comparing and updating circuit 224 is deactivated in the branch core 220. In FIG. 12, each deactivated element is illustrated with dotted lines.

In the memory system 200 illustrated in FIG. 12, the minimum comparing and updating circuit 214 as a comparing and updating unit compares the similarity of the local winner obtained by the time-domain minimum searching circuit 213 as a searching unit in the main core 210 and the similarity of the global winner stored in the temporary storage circuit, and compares the similarity of the local winner calculated by the time-domain minimum searching circuit 223 as a searching unit in the branch core 220 and the similarity of the global winner stored in the temporary storage circuit.

Thus, the candidates obtained in the main core 210 and the branch core 220, or the reference data candidates similar to the search data do not need to be compared again so that no circuit for re-comparing is required and the device can be made compact. Comparing and updating are also be performed only at the minimum comparing and updating circuit 214 as a comparing and updating unit in the main core 210. Hence, searching by the searching unit can be performed in parallel with comparing and updating, thereby enabling processing for shorter time.

A minimum comparing and updating circuit 214 is activated only in the main core 210, and at each clock (clock 1), a result of the local winner (W bits) of each branch core 220 input to the minimum comparing and updating circuit 214 through a pipeline is compared with an association result at the previous step, and the smaller result is updated by rewriting. Accordingly, reference data most similar to search data is detected from the entire multicore system. The number of connectable chips of the multicore system is determined by W of the local winner and the bit number M of one-dimensional data.

As a premise to explain details of the memory system 200, several specific configurations of the main core 210 and the branch core 220 are described.

[Specific Configuration 1 of the Main Core and the Branch Core]

FIG. 5 is a structure diagram of the memory device 100 serving as a main core and a branch core to form the memory system illustrated in FIG. 12. The memory device 100 includes a memory unit 110, a similarity evaluating unit 130, a searching unit 150 and a comparing and updating unit 170. The comparing and updating unit 170 may be deactivated in the branch core 220.

The memory unit 110, which is also called a reference data storing circuit, includes a row decoder 111, a column decoder 112, a memory area 113 and read/write circuits 114, and is configured to allow memory grains 119 in the memory area 113 to write and read reference data. The memory area 113 stores a plurality pieces of reference data of N ($\geq 1$) dimensions each composed of M ($\geq 1$) bits and divided into data of each dimension. The memory area 113 contains, in a matrix format, memory grains (MG) 119 in an optional number ($1 \leq k \leq N$) each composed of memories of M bits. In FIG. 5, memory grains 119 of (R×M) rows and C columns are provided and a read/write circuit 114 is provided at each column. Each of the read/write circuits 114 as a plurality of read circuits reads reference data from the corresponding memory grain 119. Herein, FIG. 5 illustrates a case where an optional number k is 1.

The similarity evaluating unit 130 includes an input search data storing circuit 131, digital analog convertors (DAC) 132, C pieces of similarity evaluation cells (SEC) 133 configured to calculate similarities of C/N pieces of reference data and search data in parallel and output the similarities as currents, switches 134, current accumulators (CA) 135 configured to accumulate C pieces of similarity currents in accordance with the number of dimensions of reference data, and time-domain convertors (TDC) 136 configured to converts the accumulated similarity currents into C/N pieces of time-domain voltage delay signals.

The numbers of the digital analog convertors 132, the similarity evaluation cells 133, the switches 134, the current accumulators 135, and the time-domain convertors 136 thus provided are equal to the number of column lines. At each column, digital data as a voltage value is input from the read/write circuit 114 to the digital analog convertor 132, converted into analog data by the digital analog convertor 132, and output to the similarity evaluation cells 133.

The similarity evaluation cells 133 calculate the similarity between two input data. The first data is data obtained by disassembling search data into each dimension and output from the input search data storing circuit 131, and is a voltage value of the search data of the dimension. The second data is a voltage value of reference data input from the read/write circuit 114 through the digital analog convertor 132.

The similarity evaluation cells 133 calculate the similarity between the first data and the second data as a current value and output the current value. The first data and the second data are evaluated to be identical when the current value is zero. The first data and the second data are evaluated to be different from each other when the current value is large. Thus, the output current value is small when the reference data is similar to the search data.

In the preferred memory device 100, the switch 134 is provided at each column. The switch 134 is achieved by cooperation of a first switch 134a and a second switch 134b. The first switch 134a is provided between the similarity evaluation cell 133 at the j-th column and the similarity evaluation cell 133 at the (j+1)-th column. The index j is a natural number of one to (the number of columns−1) inclusive. The second switch 134b is provided between the similarity evaluation cell 133 and the current accumulator 135 at each column. The first switch 134a and the second switch 134b are each controlled by an external dimension control signal (DCS). A wire through which the external dimension control signal is input is connected with any one of a control electrode of the first switch 134a and a control electrode of the second switch 134b, and a NOT circuit 134c is provided on the wire. With this configuration, the second switch 134b is off when the first switch 134a is on, or the second switch 134b is on when the first switch 134a is off. The dimension control signal controls the switch 134 in accordance with the dimension of reference data stored in the memory area 113.

In the preferred memory device 100, when N-dimensional reference data is stored in a dimensionally divided manner in the memory grain $MG_{i,j}$ to the memory grain $MG_{i,j+n-1}$, similarities at the similarity evaluation cell $SEC_j$ at the j-th column to the similarity evaluation cell $SEC_{j+N-1}$ at the (j+N−1)-th column need to be added to evaluate whether the N-dimensional reference data is similar to search data.

In the preferred memory device 100, to add the similarities, the first switch 134a is provided between the similarity evaluation cell $SEC_j$ at the j-th column and the similarity evaluation cell $SEC_j$ at the (j+1)-th column, and the second switch 134b is provided between the similarity evaluation cell $SEC_j$ at the j-th column and the current accumulator $CA_j$ at the j-th column.

N of the similarity evaluation cells 133 are connected through the first switches 134a in response to the external dimension control signal. Voltages of search data of the respective dimensions are applied to input terminals of the corresponding similarity evaluation cells 133, and current values output from the similarity evaluation cells 133 are input to and temporarily stored in the current accumulator 135. Thereafter, voltages of reference data of the respective dimensions are applied to the input terminals of the corresponding similarity evaluation cells 133, and current values output from the similarity evaluation cells 133 are input to the corresponding current accumulators 135 to calculate differences with the current values stored therein. In this manner, whether the reference data dispersively stored in a plurality of columns is similar to the search data can be determined based on current values through cooperation of the similarity evaluation cells 133 and the current accumulator 135.

Each time-domain convertor 136 converts the current value output from the corresponding current accumulator 135 into a delay time. Thus, in the preferred memory device 100, the current value is input to the time-domain convertor 136 from the similarity evaluation cell 133 having the largest column number (e.g. rightmost) among the similarity evaluation cells 133 connected through the switches 134. Accordingly, whether the reference data dispersively stored in the plurality of columns is similar to the search data can be determined based on a time delay value. The time delay value decreases as the similarity increases. Each converted delay time signal is input to the searching unit 150.

The searching unit 150 includes the TD (time-domain) minimum searching circuit 151 configured to detect the shortest value from among C/N pieces of time-domain voltage delay signals and convert the shortest delay into a minimum clock number by a counter. The TD minimum searching circuit 151 searches for the shortest time delay, in other words, the time-domain minimum value from among the time delay signals input from the respective time-domain convertors 136 at the similarity evaluating unit 130. The searched shortest delay time value is counted by a W-bit counter and the count value is output to the comparing and updating unit 170.

The comparing and updating unit 170 includes the minimum comparing and updating circuit 171 configured to compare the obtained minimum clock number with a previously calculated stored clock number and update the smaller clock number. The minimum comparing and updating circuit 171, at each repetition of reading from the memory unit 110, compares the count value input from the searching unit 150 with a count value stored in the comparing and updating unit, and stores the smaller count value. Accordingly, when the repetition of reading from the memory unit 110 ends, a small count value is determined, and as a result, the count value of reference data most similar to the search data is determined. The address of the most similar reference data in the memory unit 110 is obtained by associating the count value with an address at the memory unit 110.

Operation of the memory device 100 illustrated in FIG. 5 will be described below.

First, the input search data storing circuit 131 divides input search data into data of each dimension, converts each divided data into an analog voltage through the digital analog convertor 132, and inputs the analog voltage to the corresponding similarity evaluation cell 133.

Subsequently, one-dimensional reference data (M bits) output from the C memory grains 119 through the read/write circuits 114, respectively, is converted into analog voltages at the digital analog convertors 132 and input to the C similarity evaluation cells 133 in parallel after the inputting of the search data. When the digital analog convertors 132 are serial, conversion of M-bit data takes a time of M clocks.

Then, each similarity evaluation cell 133 outputs, as a current for the corresponding dimension, the similarity between the voltage of the search data (one-dimensional) and the voltage of the reference data (one-dimensional).

Then, first, each first switch 134a between the similarity evaluation cells 133 are controlled to turn on in accordance with the dimension number of the reference data and the search data in response to an external dimension control signal to add currents from the similarity evaluation cells 133 between which the first switch 134a is on, and the currents from the C similarity evaluation cells 133 are accumulated at the C/N current accumulators 135 and outputs to the corresponding time-domain convertors 136. A smaller current has a higher similarity. The same dimension control signal turns off the second switches 134b to deactivate unnecessary connection between the current accumulator 135 and the time-domain convertor 136.

Subsequently, the time-domain convertors 136 convert the accumulated C/N similarity currents into time domain voltage delay signals, and output the signals to the minimum searching circuit (Time Domain (TD) minimum searching circuit) 151 as a searching circuit in parallel.

Subsequently, in minimum searching processing at a first level (local), the minimum searching circuit (Time Domain (TD) minimum searching circuit) 151 determines a time domain voltage delay signal having the highest similarity, in other words, the shortest delay among the time domain voltage delay signals corresponding to C/N pieces of the reference data per row, and the delay is converted into a digital value as the number of clocks in the delay through the W-bit counter and output to the minimum comparing and updating circuit 171. The W-bit counter is converted into a time domain voltage delay signal having a delay of $2^W$ clocks at maximum, and the resolution of similarity current conversion proportional to this maximum delay is obtained. Thus, a smaller similarity current difference can be obtained with a larger W.

Subsequently, in minimum searching processing at a second level (global), the minimum comparing and updating circuit 171 compares, with values of at all steps stored in the circuit, a digital delay value of a winner (local winner) obtained at a main core 210 or a digital delay value of a winner (local winner) obtained at a branch core 220 and input, and then updates the smaller value by rewriting. Through repetition of this updating, a most similar piece among all pieces of reference data in the main core 210 and the branch core 220 is lastly stored in the minimum comparing and updating circuit 171 as an association processing result.

[Operation of the Memory System]

Operation of the memory system 200 illustrated in FIG. 12 is described.

FIG. 13 is a time chart of main parts of a similarity evaluating unit, a searching unit, and a comparing and updating unit in the memory system illustrated in FIG. 12.

FIG. 13 assumes a case with C=4, N=1, W=8, R=no restriction, illustrates exemplary operation at the main core 210 and each branch core 220, mainly illustrating system operation of current-mode similarity evaluation and two-level pipeline TD minimum searching.

FIG. 14 is a diagram for description of operation of the memory system 200 illustrated in FIG. 12. Each (one Data) of reference data and search data are composed of data of N (≥1) dimensions, and data of each dimension is expressed in an M-bit digital value. The reference data storing circuit as the memory unit 110 is composed of a memory cell array of (R×M) rows and C columns, one-dimensional data of R×C (C≥N) is stored in the memory grains 119, and an M-bit value is stored in each memory grain 119. The main core 210 takes $(2M+2^{W-1})$-clock to process "Data output and DAC conversion" and "TD minimum searching" on the second row, and during this time, "minimum comparing and updating" processing of the local winner from each branch core 220 is simultaneously executed, and thus $(2M+2^{W-1})$ cores can be connected to an identical system. Thus, a 144-core system is achieved when the memory bit number M of one-dimensional data is eight and the counter bit number W is eight.

As illustrated in FIG. 14, time domain minimum searching takes a longest time, and data D/A conversion and similarity evaluation take shorter processing times.

In the embodiment of the present invention, digital analog conversion is performed for each row of the memory area, which causes delay. Although the digital analog conversion processing causes delay, the time domain minimum searching takes the longer processing time and is dominant. In an NNS associative memory in the conventional analog approach, a plurality of dimensions of reference data are converted through one D/A conversion. In the embodiment of the present invention, one piece of one-dimensional data is converted by one digital analog convertor, which eliminates conversion overhead to achieve faster processing. In an NNS associative memory in any of the analog approach and the digital approach, and in the embodiment of the present invention, the processing time of searching for a minimum value that is, an earliest time-domain signal from a time-domain signal is more dominant than D/A conversion. For example, the D/A conversion needs a time of 8-cycle, and the time domain minimum searching needs a time of 100 to 200-cycle. This is because a ramp signal needs to be long enough to achieve a resolution for distinguishing an early time-domain signal and a late time-domain signal. Similarity currents having a small difference therebetween cannot be distinguished from each other when a time from 0 V to, for example, 1 V is insufficiently long. Specifically, since a similarity, which is a digital value in a case of an associative memory in the digital approach, or a current value in cases of an associative memory in the analog approach and the embodiment of the present invention, is converted into delay of a time-domain signal, the difference between time-domain signal delays converted from similarities having a small difference therebetween is small, and thus the distinction is difficult without measurement in a sufficiently long time.

In the embodiment of the present invention, multicore-based pipeline operation is employed to improve a time-domain minimum searching speed. The pipeline absorbs a time taken for local long time-domain minimum searching processing at each core so that the processing is completed in one clock. As such, comparing and updating are performed only at the comparing and updating unit in the main core 210 and searching by the searching unit is performed in parallel with comparing and updating. Thus, comparing and updating in each core can be processed through a pipeline and associative calculation is completed for reference data read in each reading by an optional clock number, for example, one clock. When this multicore-based pipeline scheme is not used, information on similar reference data is obtained at a speed equivalent to that for an associative memory in the conventional analog approach. Additionally, the number of dimensions of reference data and search data can be adjusted optionally and therefore an increase in the number of dimensions is accompanied by an increase in the number of memory grains for storing reference data. Assuming that data is processed only by one core, it takes (2M+ $2^{\overline{W}-1}$)-clock to process "TD minimum searching" processing per row in the memory area as illustrated in FIG. 14 and the number of rows to process is increased in the memory area in accordance with an increase in the number of dimensions. However, owing to the time-domain minimum searching processing using a plurality of cores as in the case of the embodiment of the present invention, an increase in the time to search for reference data similar to search data can be suppressed.

The main core 210 and the branch core 220 may not be configured as illustrated in the memory device 100 of FIG. 5 or may be provided as the memory device 100 to be explained below with reference to FIGS. 3, 4, 6 and 7. In this case, a design change may be demanded as needed.

[Specific Configuration 2 of the Main Core and the Branch Core]

FIG. 3 is a configuration diagram of the memory device serving as a main core and a branch core to form the memory system illustrated in FIG. 12. The memory device 100 includes a memory unit 110, a similarity evaluating unit 130, a searching unit 150 and a comparing and updating unit 170 similarly to the configuration in FIG. 5. It is different from the embodiment illustrated in FIG. 5 in that a digital analog convertor 132 and a time-domain convertors 136 are not provided. The function of the switch 134 in FIG. 7 is similar to that of the switch 134 in FIG. 5.

[Specific Configuration 3 of the Main Core and the Branch Core]

FIG. 4 is a configuration diagram of the memory device 100 serving as a main core and a branch core to form the memory system illustrated in FIG. 12. In the embodiment illustrated in FIG. 4, a similarity evaluating unit 130 is configured differently from FIG. and the optical number k is 2 at designing and manufacturing. A plurality of similarity evaluation cells 133 are divided into cell groups. As illustrated in FIG. 4, odd-numbered similarity evaluation cells 133 and even-numbered similarity evaluation cells 133 form a cell group 133a, and the current accumulator 135 corresponds to one cell group 133a. Then, a switch 134 is provided so that the current accumulator 135 accumulate currents output from the similarity evaluation cells 133 in an optional number in another cell group 133a different from the corresponding one cell group 133a.

Specifically, FIG. 4 is different from FIG. 3 in that the switch 134 is not provided at each column and one of the odd-numbered similarity evaluation cells 133 and one of the even-numbered similarity evaluation cells 133 form the cell group 133a. The second switch 134b is provided between one of the even-numbered similarity evaluation cells 133 and the current accumulator 135 corresponding to the cell group 133a, and the first switch 134a is provided between the cell group 133a and the adjacent cell group 133a.

Therefore, by turning on any one of the first switch 134a and the second switch 134b and turning off the other one, similarity currents from four of the similarity evaluation cells 133 can be accumulated or similarity currents from two of the similarity evaluation cells can also be accumulated.

At that time, by turning off the second switch 134b to make a control so as not to supply electrical power to the current accumulator 135 to which no current flows from the similarity evaluation cells 133, power saving can be achieved.

Herein, In FIG. 4, a cell group includes two similarity evaluation cells 133 but may also include three or an optional number of those. This makes it possible to flexibly correspond to any numbers other than the dimension number of search data and reference data. The optional number of the similarity evaluation cells 133 in the cell group may be set to be equal to that of the memory grains 119 to which electrical power is supplied by one power driver 118 illustrated in FIG. 7.

[Specific Configuration 4 of the Main Core and the Branch Core]

FIG. 6 is a configuration diagram of the memory device serving as a main core and a branch core to form the memory system illustrated in FIG. 12, and a configuration diagram illustrating a specific embodiment of the memory device 100 of FIG. 4. The memory device 100 illustrated in FIG. 6 includes a digital analog convertor 132 in the front stage of each similarity evaluation cell 133. The digital analog convertor 132 converts an input digital voltage into an analog voltage and outputs the analog voltage to the similarity evaluation cell 133. A time-domain convertor 136 is provided in the rear stage of each current accumulator 135. The time-domain convertor 136 converts a current value output from the current accumulator 135 into a delay time. Thus, a current value is input to the time-domain convertor 136 from the endmost (e.g. rightmost) similarity evaluation cell 133 among the similarity evaluation cells 133 connected through the switches 134. Accordingly, whether the reference data dispersively stored in the plurality of columns is similar to the search data can be determined based on a time delay value.

In the embodiments illustrated in FIGS. 5 and 6, the digital analog convertor 132 is provided in the front stage of the similarity evaluation cell 133 and, based on the data converted through the digital analog convertor 132, the similarity evaluation cell 133 obtains an analog current as a value to evaluate the similarity and outputs the analog current to the current accumulator 135. Thus, whether reference data is similar to search data is obtained as a difference of current values.

[Specific Configuration 5 of the Main Core and the Branch Core]

In the embodiment of the present invention, it is not necessary to provide the digital analog convertor 132 in the front stage of the similarity evaluation cell 133 and the following configuration may also be adopted. A digital voltage value of the search data and a digital voltage value of the reference data are input sequentially to the similarity evaluation cell 133. The similarity evaluation cell 133 obtains a digital value to evaluate the similarity and the digital value is converted into an analog value by a digital analog convertor (not shown) provided in the rear stage of the similarity evaluation cell 133 and output to the current accumulator 135. For such a similarity evaluation cell 133, a circuit used in the digital approach may be modified as appropriate and used.

[Specific Configuration 6 of the Main Core and the Branch Core]

In the above embodiment, an output from the current accumulator 135 is converted into a delay time through the time-domain convertor 136 to obtain the shortest delay time. However, the present invention is not limited to the above embodiment and the following configuration may also be adopted. A circuit that directly compares and updates the minimum value of an analog voltage in the form of an analog value without making any changes is provided, or a circuit that converts the minimum value of an analog voltage into a digital value and a circuit that compares and updates the digital value are provided. As an example, resistors are connected to output ends of the respective current accumulators to convert analog currents flowing from the respective current accumulators into analog voltages from which the minimum value is searched. To do so, the searching unit 150 illustrated in, for example, FIGS. 5, 3, 4 and 6 is composed of a minimum analog voltage searching circuit. A specific example of the minimum analog voltage searching circuit will be described below in detail with reference to FIG. 33. In this case, It is necessary to provide an analog digital converter or the like to convert an output value into a digital value.

[Specific Configuration 7 of the Main Core and the Branch Core]

Next, the memory unit 110 in the memory device 100 is described to form a main core and a branch core. FIG. is a configuration diagram of the memory device including a preferred memory unit. The memory unit 110 includes a reference data storing circuit that is composed of memory arrays of (R×M) rows and C columns and configured to store (R×C)/N pieces of reference data. Although FIG. 10 is a configuration diagram corresponding to FIG. 4, other embodiments as illustrated in FIGS. 3, 4 and 6 may also be employed.

The reference data storing circuit as the memory unit 110 includes R×C (C≥N) memory grains (MG) 119 configured to store one-dimensional data, and each memory grain 119 stores an M-bit value. A power driver (PD) 118 for power gating is installed at each memory grain 119, and independently controls electrical power supply through a row decoder, a column decoder, and clock 1 (clk.1). Accordingly, C/N pieces of reference data are stored in the memory grains 119 (MG) on one row and output to the similarity evaluation cells 133 in parallel to execute associative recognition.

The following describes the memory unit 110 of the memory device 100 illustrated in FIG. 7 further in detail. The reference data storing circuit as the memory unit 110 includes a row decoder 111, a column decoder 112, the memory area 113, and a read/write circuit 114. The memory area 113 includes a plurality of row lines 115, a plurality of bit lines 116, a plurality of column lines 117, a plurality of the power drivers (PD) 118, a plurality of the memory grains (MG) 119. Each memory grain 119 is composed of a nonvolatile memory.

The row decoder 111 is connected with the plurality of row lines 115, and the column decoder 112 is connected with the plurality of column lines 117.

The memory area 113 is divided into a plurality of regions. Each region is specified by the column lines 117 in an optional number of one to N inclusive and the M row lines 115, and provided with a pair of the corresponding power driver 118 and memory grain 119. The optional number of the column lines 117, the number of the row lines 115, and the number of the bit lines 116 are set at designing and manufactured in accordance with the settings. The "optional number" includes a number determined by a user of the memory device or a constant value simply determined at designing and manufacturing. In FIG. 7, each region includes one of the column lines 117, M of the row lines 115, and M of the bit lines 116. The natural numbers M and N are defined in the same manner for the search data 10 and the reference data 30 described above as referring to FIGS. 1 and 2.

In the embodiment of the present invention, the memory grains 119 each composed of nonvolatile memories of M bits and the power drivers 118 paired with the memory grains 119 and configured to supply electrical power to the memory grains 119 are provided in each region specified by the column lines 117 in the optional number and the M row lines 115 in the memory area 113. The column lines 117 in the optional number are provided in each region. The "optional number" includes a number determined by the user of the memory device or a constant value simply determined at designing and manufacturing. The optional number of the column lines 117 is equal to the optional number of the memory grains 119 for each region, and is equal to one in FIG. 7.

In the embodiment of the present invention, each power driver 118 receives inputting of a control signal from each of the column lines 117 in the optional number, inputting of a control signal from each of the M row lines 115, and inputting of a clock signal, and supplies electrical power to the memory grain 119 paired with the power driver 118 in synchronization with the clock signal. Accordingly, the reference data of each dimension stored in the memory grain 119 is read and output to the read/write circuit 114 at the corresponding column through the bit lines 116.

Accordingly, electrical power is supplied not to the entire memory area 113 but to the memory grain 119 of each region to be read, and thus electrical power is supplied only to a necessary place only in a necessary time through inputting of the clock signal. This leads to significant reduction of electric power consumption at reading of the reference data stored in the memory area 113.

As illustrated in FIG. 7, the memory grains 119 are provided in an R×C matrix of $MG_{11}$ to $MG_{RC}$. With this configuration, when one or a plurality of the power drivers 118 are specified by one or a plurality of the row lines 115 to which a control signal flows from the row decoder 111 and one or a plurality of the column lines 117 to which a control signal flows from the column decoder 112, and clock signal "1" is input to each specified power driver 118, electrical power is supplied from the power driver 118 to the memory grain 119 paired with the power driver 118 only during the inputting. When clock signal "0" is input to the specified power driver 118, supply of electrical power to the memory grain 119 paired with the power driver 118 is stopped. Alternatively, the power driver 118 may supply the electrical power to the memory grain 119 paired with the power driver 118 when clock signal "0" is input to the power driver 118, and the power driver 118 may supply no electrical power to the memory grain 119 paired with the power driver 118 when clock signal "1" is input to the power driver 118. The clock signals "0" and "1" correspond to "H" and "L".

The inputting of control signals from the M row lines 115 may be sequentially performed for each set of row lines in a predetermined number of one to M or may be simultaneously performed for the first to M-th row lines.

The following describes power saving achieved in the memory device 100 illustrated in FIG. 7 in detail. FIGS. 8 to 10 are diagrams for comparing the memory unit and operation and electric power consumption thereof in the memory device to form a main core and a branch core with those of a conventional technology.

FIG. 8 is a diagram schematically illustrating the memory unit and operation and electric power consumption thereof in the memory device to form a main core and a branch core. The upper part of FIG. 8 schematically illustrates the memory unit 110. The middle part of FIG. 8 illustrates regions at rows from which data is read when Data #1, Data #2, and Data #3 are sequentially read at each row. In the lower part of FIG. 8, the horizontal axis represents time, the vertical axis represents electric power consumption, and the depth axis represents the position of a memory grain.

The power drivers 118 are provided for the respective dimensions of reference data (respective memory grains) to allow simultaneous activation of a plurality of optional column lines 117 as well as fine-grain power gating so that electrical power is flexibly supplied only to a necessary memory grain 119 corresponding to each necessary data dimension in one Data. In addition, an operation calculation clock signal is input to each power driver 118 so that electrical power is supplied from the power driver 118 to the corresponding memory grain 119 in synchronization with the clock signal.

Through this reading control, electrical power is consumed only when data necessary for calculation is in a calculation operation, and not when no clock signal of calculation operation is input. Moreover, electrical power is consumed only when a clock pulse is "0" at reading. When the clock pulse is "1" (in the first half of a clock), the bit line 116 is pre-charged to 0 V, and thus no electrical power needs to be supplied, which halves electric power consumption in the calculation operation.

For example, as for Data #1, electric power consumption is halved at reading when output is necessary for all dimensions of reference data because a clock is used. This is because of the following reason. By introducing clock control, the memory grains 119 are supplied with no electrical power but pre-charged in the first half of a clock, in other words, when a clock signal is "H". A specified memory grain 119 is supplied with electrical power to read data in the second half of a clock, in other words, when a clock signal is "L". This pre-charge prevents occurrence of "disturb" false operation when electrical power supply is switched at high speed, and thus data is not rewritten when the reference data is read.

As for Data #2, an operation calculation clock is controlled so that the power drivers 118 are not operated, and thus memory operation dynamically stops, which leads to minimization of electric power consumption.

As for Data #3, when data output is necessary for some dimensions of reference data, electrical power is supplied only to a minimum necessary number of the memory grains 119, thereby achieving optimization of electric power consumption.

In memory device 100 illustrated in FIG. 7, the memory unit 110 is composed of a nonvolatile memory based on cycle-based fine-grain controllable power gating. With this configuration, electric power consumption is zero at standby, and electrical power is supplied to a necessary part of the memory unit 110 but not to an unnecessary part, thereby reducing electric power consumption.

Nonvolatile memories have been developed with focus on various different specifications such as small area, fast speed, high stability, and low write current. In this example, a fast and stable nonvolatile memory cell is needed to achieve cycle-based fine-grain controllable power gating. In the embodiment of the present invention, typically, a differential-pair STT-MRAM memory cell is preferably used. This will be described later in detail in an implementation example.

As described later in the implementation example, searching can be performed at high speed and cycle-based fine-grain controllable power gating can be achieved because of the following reasons.

The first reason is that a differential-pair STT-MRAM memory cell (for example, 4T-2MTJ cell), which is capable of responding swiftly at electrical power supply and performing fast and stable operation, is employed. The 4T-2MTJ cell is characterized in that it can perform faster data reading from MTJ and causes no "disturb" false operation due to fast on and off operations of a power source.

The second reason is that bit lines are pre-charged to 0 V before electrical power supply to avoid accumulation of unnecessary electric charge and hence allow data reading at high speed.

In the memory device 100 illustrated in FIG. 7, significantly low electrical power consumption at an associative memory can be achieved by employing a nonvolatile memory device based on cycle-based fine-grain controllable power gating. The system is reconstructed in accordance with the dimension number of data through the switches 134 of the similarity evaluating unit 130, and the nonvolatile memory device based on cycle-based fine-grain controllable power gating supplies electrical power to a minimum necessary number of memories in accordance with the reconstruction, thereby optimizing electric power consumption at operation.

The following describes memory units of a conventional NNS associative memory in a digital approach and an analog approach (hereinafter referred to as "conventional approach"). FIG. 9 is a diagram schematically illustrating a memory unit 510 in the conventional approach and operation and electric power consumption thereof. The upper part of FIG. 9 schematically illustrates the memory unit 510. The middle part of FIG. 9 illustrates regions at rows from which data is read when Data #1, Data #2, and Data #3 are sequentially read at each row. In the lower part of FIG. 9, the horizontal axis represents time, the vertical axis represents electric power consumption, and the depth axis represents the position of a memory grain.

In the conventional approach, the memory area of the memory unit 510 is composed of a volatile SRAM. Thus, when reference data is written to all memory grains 519, electrical power needs to be constantly supplied at reading of Data #1, reading of Data #2, and reading of Data #3. Reference sign 511 denotes a row decoder, and Reference sign 512 denotes a column decoder.

FIG. 10 is a diagram schematically illustrating a memory unit composed of a conventional STT-MRAM and operation and electric power consumption thereof. The upper part of FIG. 10 schematically illustrates a memory unit 610. The middle part of FIG. 10 illustrates regions at rows from which data is read when Data #1, Data #2, and Data #3 are sequentially read at each row. In the lower part of FIG. 10, the horizontal axis represents time, the vertical axis represents electric power consumption, and the depth axis represents the position of a memory grain.

In a conventional STT-MRAM disclosed in Non Patent Literature 9, a fine-grain power gating technology is employed so that a power driver 618 is provided for each reference data of one Data, in other words, for each set of N memory grains 619, and independently supplied with electric power. Thus, electrical power can be supplied in accordance with the location of access reference data specified by the addresses of a column decoder and a row decoder at writing of reference data, reading of Data #1, reading of Data #2, and reading of Data #3, and no electrical power needs to be supplied to an unnecessary memory place. However, power gating is provided for each Data, and thus all memory grains 619 are simultaneously supplied with electrical power to read data of all dimensions in one Data. Reference sign 611 denotes a row decoder, and Reference sign 612 denotes a column decoder.

The following describes a system architecture (the case of the column number C=4) reconstructed in accordance with one to four-dimensional reference data as a chip including an RX4 matrix of memory grains. FIG. 11A is a diagram illustrating reconstruction of the memory device when reference data is one-dimensional. FIG. 11B is a diagram illustrating reconstruction of the memory device when reference data is two-dimensional. FIG. 11C is a diagram illustrating reconstruction of the memory device when reference data is three-dimensional. FIG. 11D is a diagram illustrating reconstruction of the memory device when reference data is four-dimensional. These diagrams illustrate operation states of cycle-based fine-grain controllable power gating of the nonvolatile memory device, and illustrate, with dotted lines, any memory grain 119 supplied with no electrical power in the memory unit 110. Similarly, in the similarity evaluating unit 130, any deactivated part is illustrated with dotted lines, and any non-deactivated part is illustrated with solid lines.

The memory system 200 according to the embodiment of the present invention may also be configured by including the following main core 210 and one or a plurality of branch cores 220 as illustrated in FIG. 12.

Each of the main core 210 and the branch core 220 includes, as illustrated in FIG. 7 for example, a plurality of read circuits (read/write circuit 114) each configured to read, in a memory area 113 storing a plurality of pieces of reference data of N ($\geq$1) dimensions each composed of M ($\geq$1) bits, the reference data divided into data of each dimension, reference data from a corresponding memory grain among memory grains in an optional number ($1 \leq k \leq N$) each composed of memories of M bits, a search data storing circuit (input search data storing circuit) 131 configured to store search data of N ($\geq$1) dimensions each composed of M ($\geq$1) bits and divide the search data to output, a plurality of similarity evaluation cells 133 each configured to calculate the similarity between reference data read in each reading from the memory area 113 and search data, and output, as a current value, the similarity of reference data read by the corresponding read circuit with respect to data read from the search data storing circuit, a plurality of current accumulators 135 each configured to accumulate currents output from the corresponding similarity evaluation cells 133 in an optional number, and a searching unit (e.g. time-domain minimum searching circuits 213 and 233) configured to obtain, as a local winner, a reference data candidate having high similarity based on similarities between reference data read from the memory area 113 and search data in each reading from the memory area 113 and evaluating a similarity.

The main core 210 includes a comparing and updating unit (minimum comparing and updating circuit) 214 having a temporary storage circuit, the temporary storage circuit configured to store a similarity of a global winner, the global winner obtained at the searching unit (e.g. time-domain minimum searching circuits 213 and 223), as which, a reference data candidate having the highest similarity among local winners obtained in each reading and evaluating a similarity, in which the comparing and updating unit (minimum comparing and updating circuit) 214 compares the similarity of the local winner obtained at the searching unit 223 in the main core 210 and the similarity of a global winner stored in the temporary storage circuit, and compares the similarity of a local winner obtained at the searching unit (e.g. time-domain minimum searching circuit 223) in the branch core 220 and the similarity of a global winner stored in the temporary storage circuit.

By employing such a system, firstly, it is possible to provide a simple system configuration with cores of the same compact design and reduce processing time at searching for reference data similar to search data even if the system includes a plurality of cores, and secondly, it is possible to satisfy, at the same time, being capable of flexibly corresponding to the number of dimensions of reference data and having a compact circuit configuration at searching for reference data similar to search data.

This system is realized by selecting and combining any of the aforementioned embodiments and therefore description thereof is omitted.

Implementation Example

Figure 15:
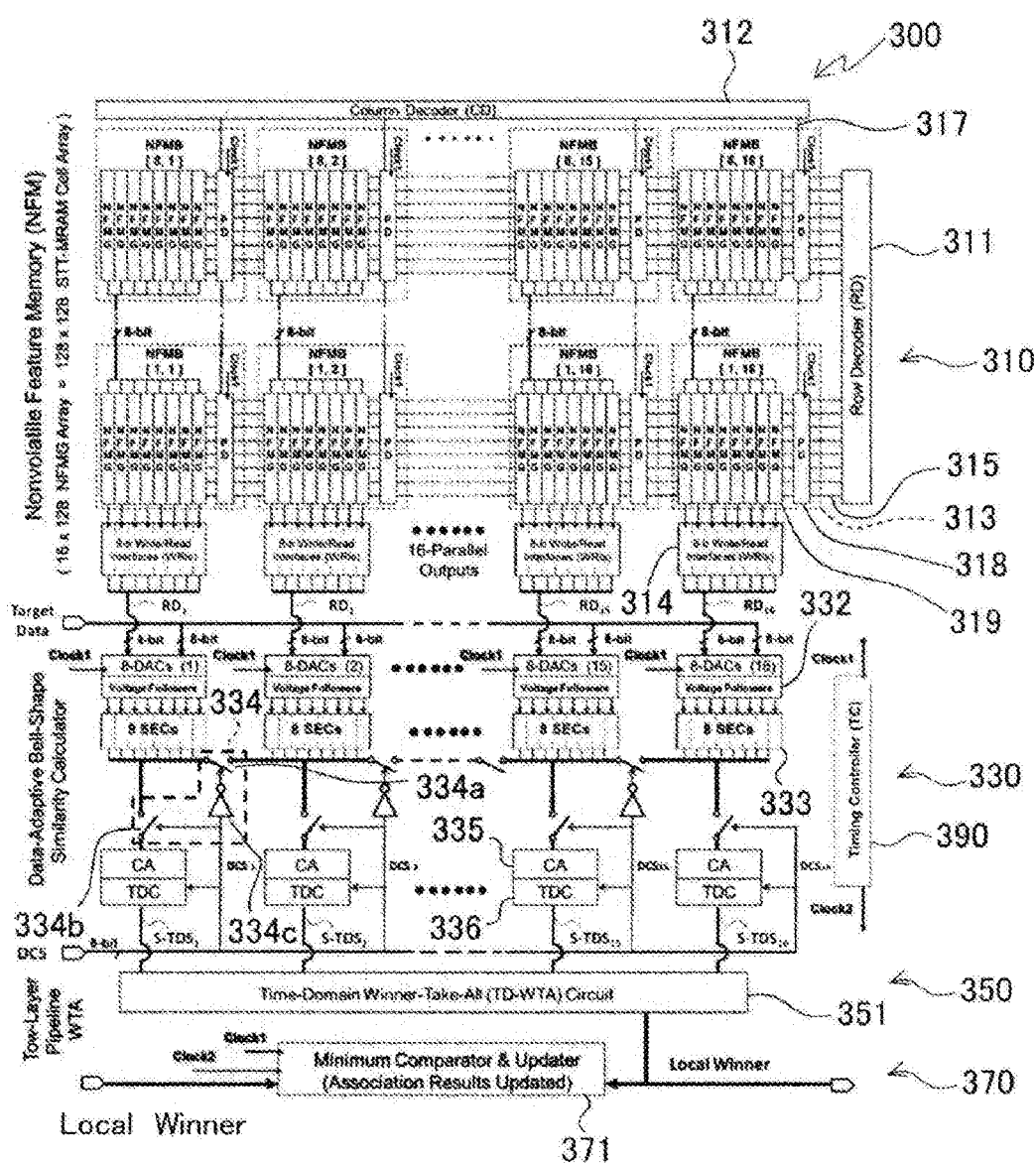
FIG. 15 is a block configuration diagram according to an implementation example.

The following describes the implementation example. FIG. 15 is a block configuration diagram according to the implementation example. A low electrical power, highly dense, and adaptive nonvolatile associative memory device is assumed for application to image recognition. This memory device 300 illustrated in FIG. 15 includes a memory unit 310, a similarity evaluating unit 330, a searching unit 350, a comparing and updating unit 370, and a timing controller 390 similarly to the configuration in FIG. 7. The memory unit 310 includes a row decoder 311, a column decoder 312, the memory area 313, a read/write circuit 314, row lines 315, bit lines 316, column lines 317, power drivers 318, memory grains 319 similarly to the configuration in FIG. 7. The similarity evaluating unit 330 includes a digital analog convertor (DAC) 332, a similarity evaluation cell (SEC) 333, a switch 334, a current accumulator (CA) 335, and a time-domain convertor (TDC) 336. The switch 334 includes a first switch 334a, a second switch 334b, and a NOT circuit 334c similarly to the configuration in FIG. 7. The memory device 300 is a prototype chip assuming eight-dimensional, 16-dimensional, 32-dimensional, 64-dimensional, and 128-dimensional image feature data. The memory device 300 is basically applicable to any data, the dimension number of which is an integral multiple of eight. Parameters described with reference to FIG. 7 are as follows.

N=8 dimensions, 16 dimensions, 32 dimensions, 64 dimensions, and 128 dimensions: Application is possible to any dimension of an integral multiple of eight.

M=8 bits

C=128 columns

R=16 rows

W=8 bits (the bit number of the counter of the minimum comparing and updating circuit)

For application to an integral multiple of eight, the PDs and similarity current accumulation switches of memory grains are each designed for every eight dimensions.

With this configuration, when a switch 334 odd-numbered from the left is operated to close a first switch 334a by an external dimension control signal, the system is applicable to 16-dimensional data. Evaluation of performance such as the speed of a measured waveform to be described later or the like is a result in 16-dimensional texture recognition.

The following describes a specific embodiment of the memory device 100 illustrated in FIG. 7 and the like by describing the basic circuit configuration of each component in the implementation example.

Figure 16:
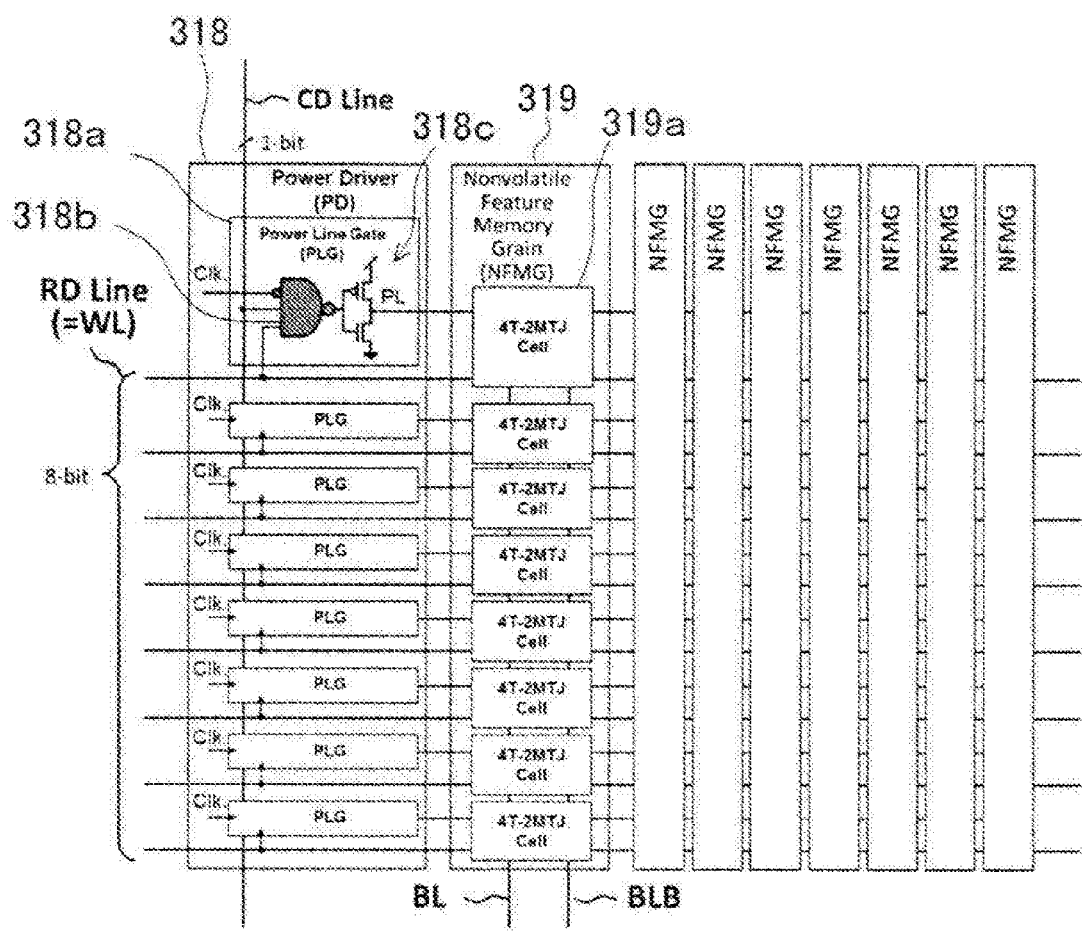
FIG. 16 is a block diagram of each region of a memory area in the implementation example.

FIG. 16 is a block diagram of each region of the memory area in the implementation example. FIG. 16 illustrates a region of the memory area described with reference to FIG. 7. This region includes a pair of one power driver 318 and K (=8) nonvolatile memory grains 319, and the power driver 318 includes M power line gates 318a. One line among a column line (CD line), a clock signal input line, and a row line (RD line) is input to a logical calculation circuit 318b of each power line gate 318a, and a clock signal is inverted and input to the logical calculation circuit 318b. An output signal from the logical calculation circuit 318b is input to an inverter circuit 318c connected with a power source line. An output from the inverter circuit 318c is input to a 4T-2MTJ cell 319a as a power line PL. Reference signs BL and BLB denote a pair of bit lines.

Figure 17A:
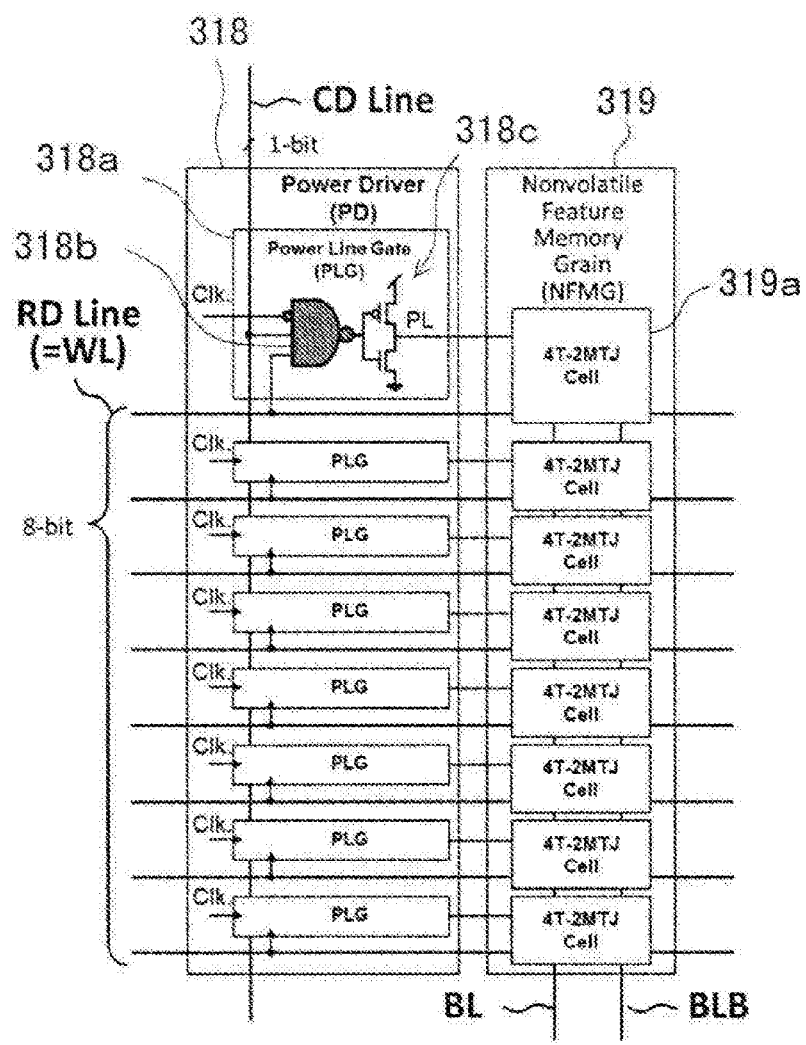
FIG. 17A is a block diagram of the memory area in the implementation example illustrated in FIG. 15 when it is assumed that one nonvolatile memory grain is provided and a power driver is provided for each dimension of the reference data.
Figure 17B:
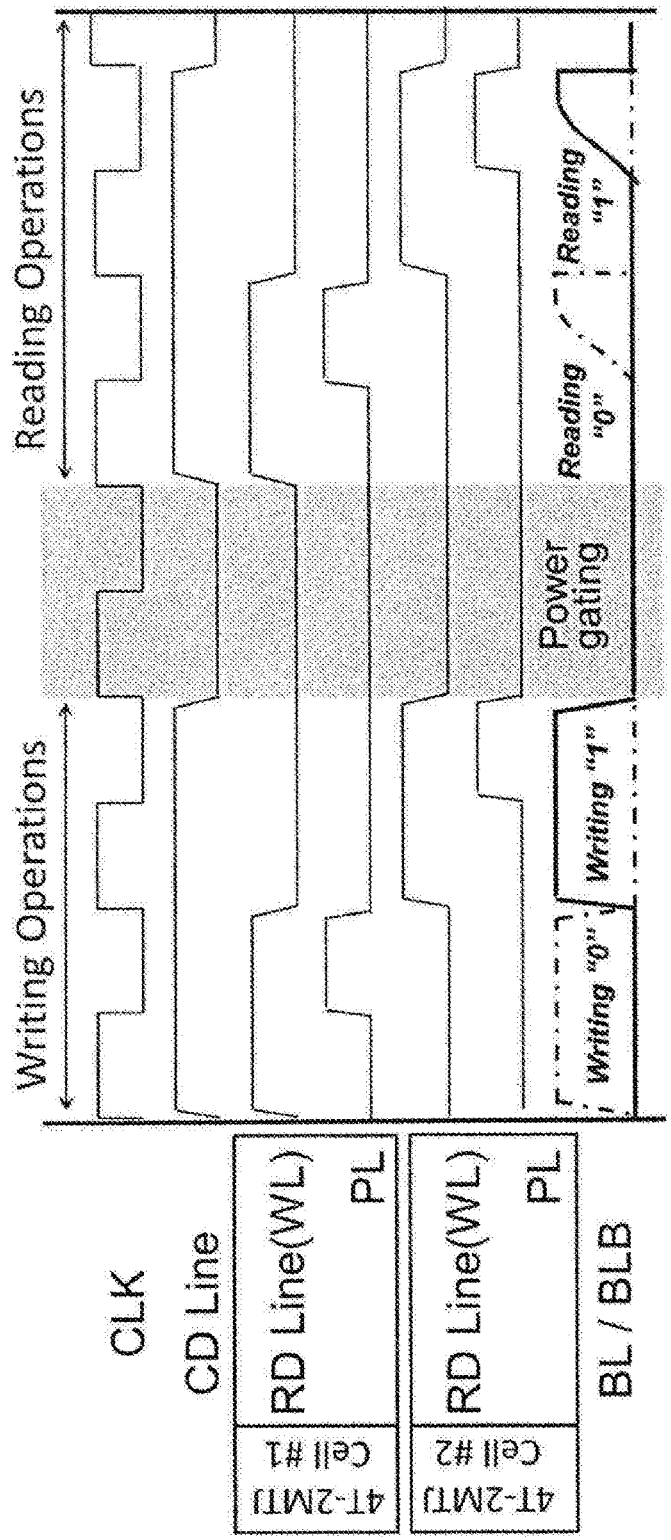
FIG. 17B is a time chart illustrating operation of the unit illustrated in FIG. 17A.

FIG. 17A illustrates a case in which only one nonvolatile memory grain 319 is provided and the power driver 318 is provided for each dimension of reference data in the configuration of the block diagram illustrated in FIG. 16. FIG. 17B is a time chart illustrating operation of the unit illustrated in FIG. 17A in which data is continuously read from two 4T-2MTJ memory cells (Cell #1 and Cell #2). As described above, in reading operation, when the clock signal is "0", the CD line is "1", and the corresponding RD line is "1", the power line PL is "1", and reading processing is performed.

Figure 17C:
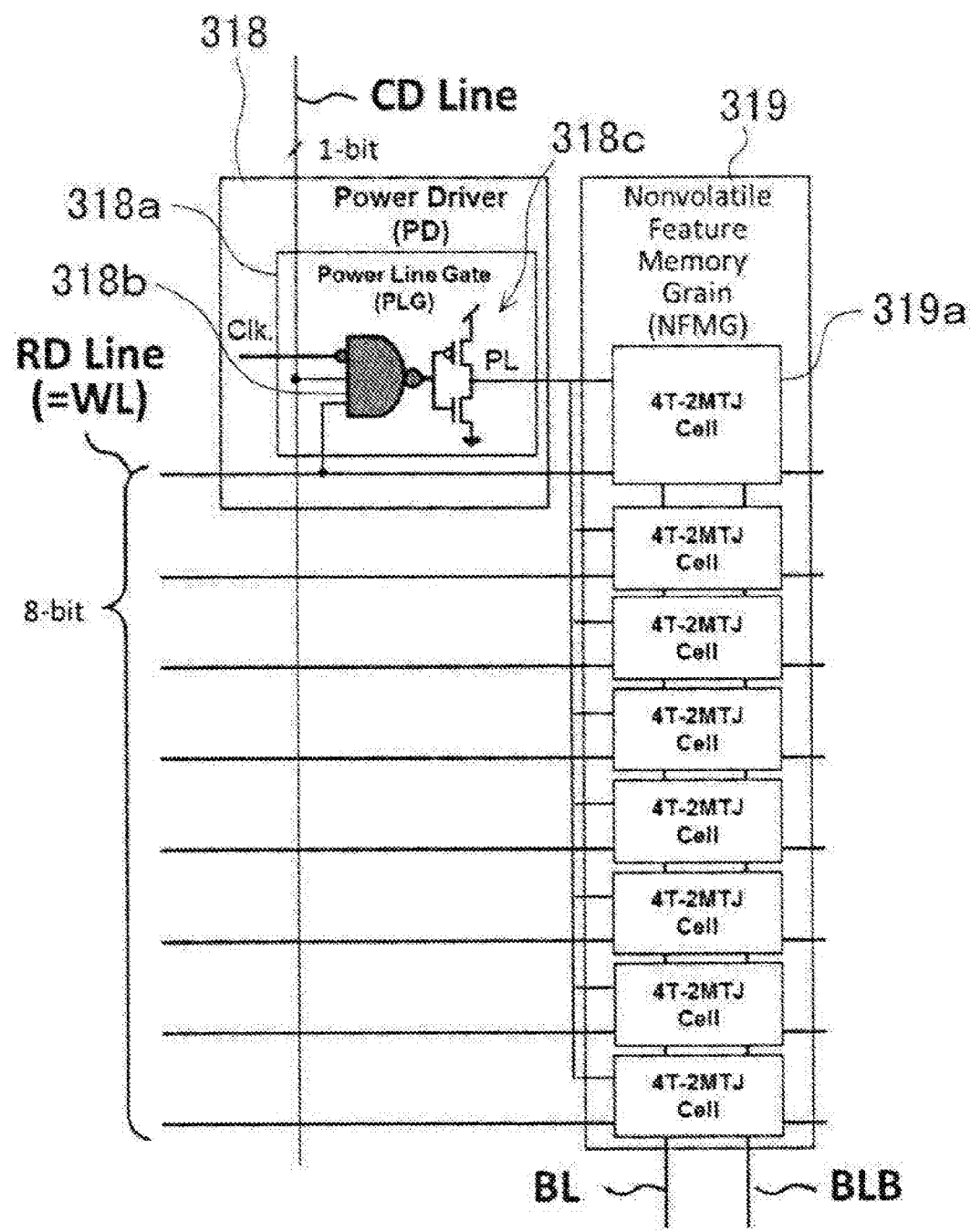
FIG. 17C is a diagram illustrating a modification of the circuit illustrated in FIG. 17A.

FIG. 17C illustrates a modification of the circuit illustrated in FIG. 17A. The power line PL may be output from one power line gate to M 4T-2MTJ cells 319a in parallel.

Figure 18:
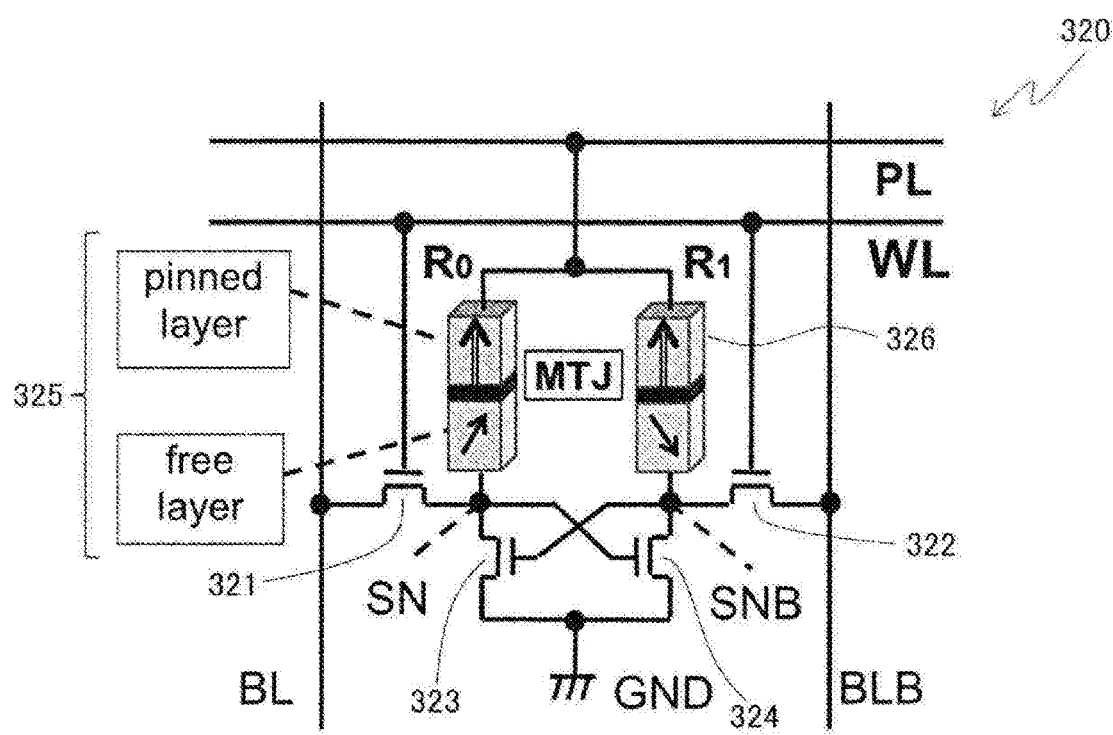
FIG. 18 is a circuit diagram of a 4T-2MTJ memory cell in the memory unit.
Figure 19:
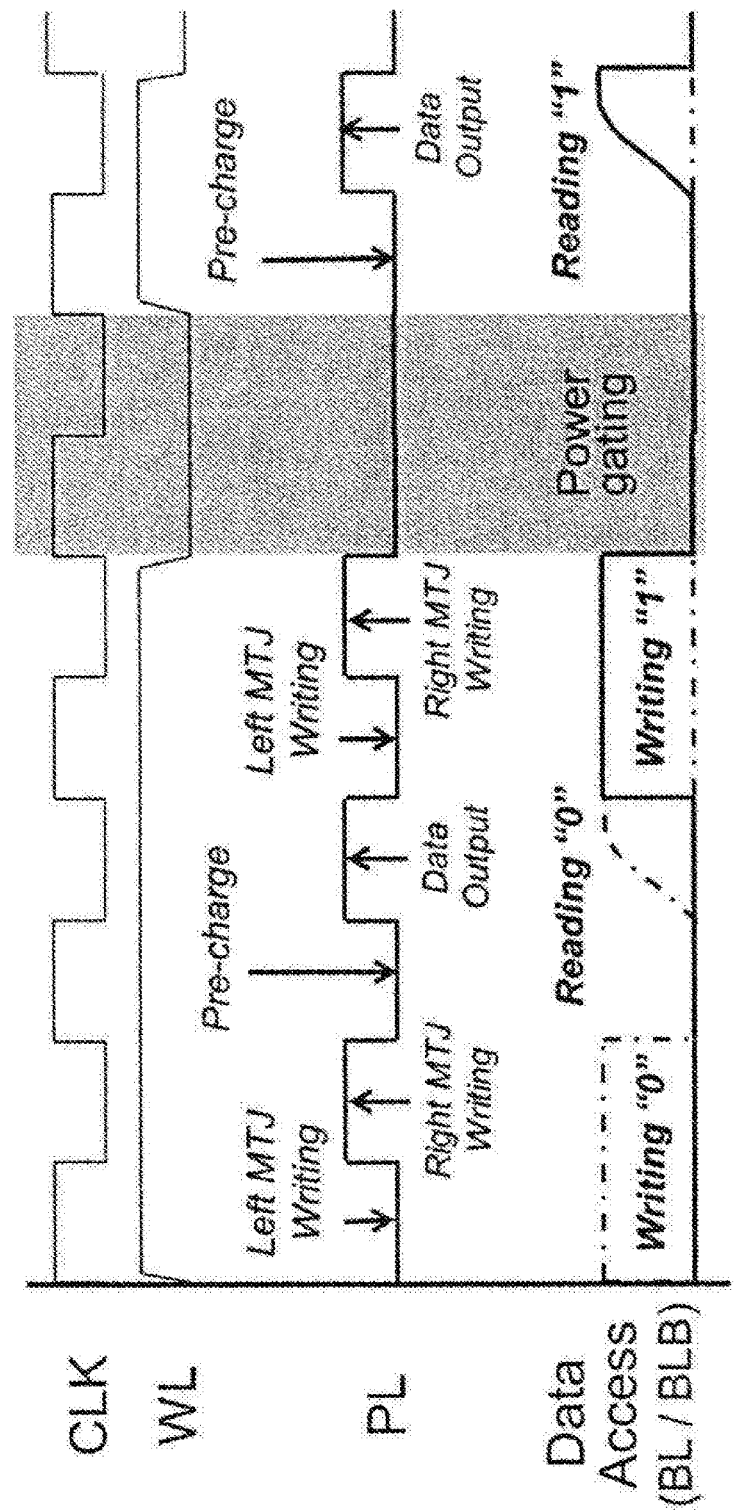
FIG. 19 is a time chart for description of operation of the 4T-2MTJ memory cell illustrated in FIG. 18.

FIG. 18 is a circuit diagram of a 4T-2MTJ memory cell 320 in the memory unit 310. The 4T-2MTJ memory cell 320 is a differential-pair STT-MRAM cell including four N-type MOSFETs 321 to 324 and two MTJs 325 and 326. The MTJs 325 and 326 are each composed of a pinned magnetic layer, an insulating layer, and a free magnetic layer. The pinned magnetic layers of the MTJs 325 and 326 are connected with the power line PL. The free magnetic layers of the MTJs 325 and 326 each record a state parallel or anti-parallel to the pinned magnetic layer, thereby storing a digital value. FIG. 19 is a time chart for description of operation of the 4T-2MTJ memory cell illustrated in FIG. 18.

When data is written to the 4T-2MTJ cell 320, the bit lines (BL and BLB) are connected with sense nodes (SN and SNB) by applying, for example, high voltage to a word line WL so that high voltage (1 V) and low voltage (0 V) are set to the bit lines BLB and BL. When data of "1"/"0" is written to the 4T-2MTJ cell 320, the power line PL is controlled by a clock signal so that the power line PL is set to 0 V in the first half of a clock to write the right and left MTJs 325 and 326 in an anti-parallel manner, and the power line PL is set to 1 V in the second half of the clock to write the left and right MTJs 325 and 326 in a parallel manner.

When data is read from the 4T-2MTJ cell 320, the bit lines (BL and BLB) are connected with the sense nodes (SN and SNB) by applying 1 V to the word line WL, and the power line PL is controlled by a clock signal so that the PL is set to 0 V in the first half of a clock to pre-charge each of the bit lines BLB and BL and the sense nodes SN and SNB to 0 V, and the power line PL is set to 1 V in the second half of the clock to read the voltage difference between the sense nodes SN and SNB through the bit lines BLB and BL.

Figure 20:
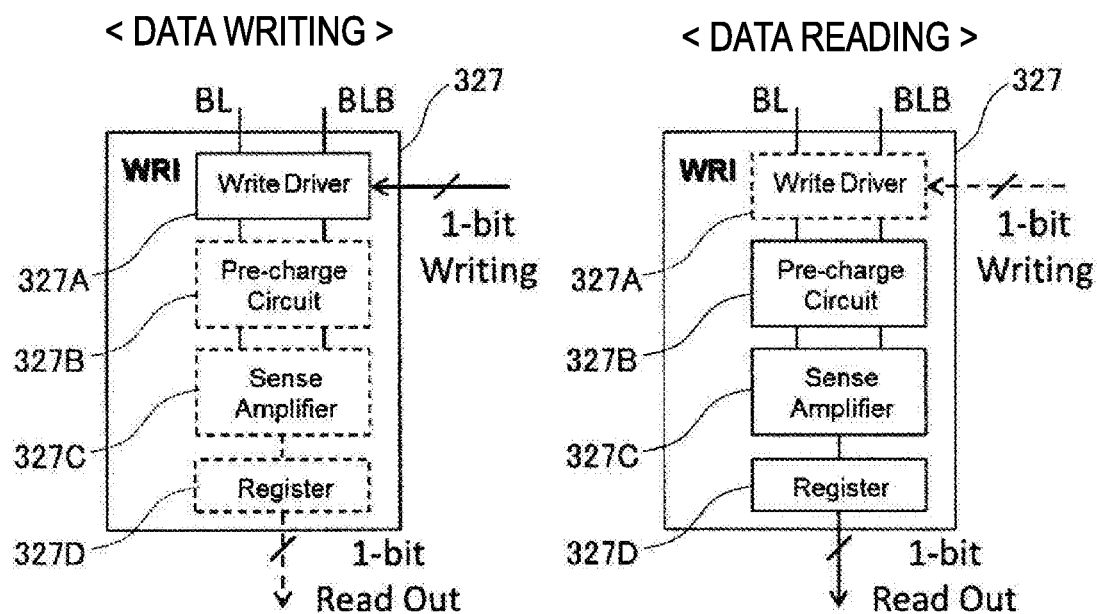
FIG. 20 is a block diagram of a read/write circuit in the implementation example illustrated in FIG. 15.

FIG. 20 is a block diagram of the read/write circuit 114 illustrated in FIG. 7. The read/write circuit 114 is composed of M read-write interface (WRI) circuits, and accesses the 4T-2MTJ cells 320 at M columns through the bit lines (BL and BLB) to read or write data of M bits in one clock. Each WRI circuit 327 includes a write driver circuit 327A, a pre-charge circuit 327B, a sense amplifier circuit 327C, and a digital register circuit 327D. The write driver circuit 327A is used to write data, and the pre-charge circuit 327B, the sense amplifier circuit 327C, and the digital register circuit 327D are used to read data, thereby processing data of one bit in one clock.

Figure 21:
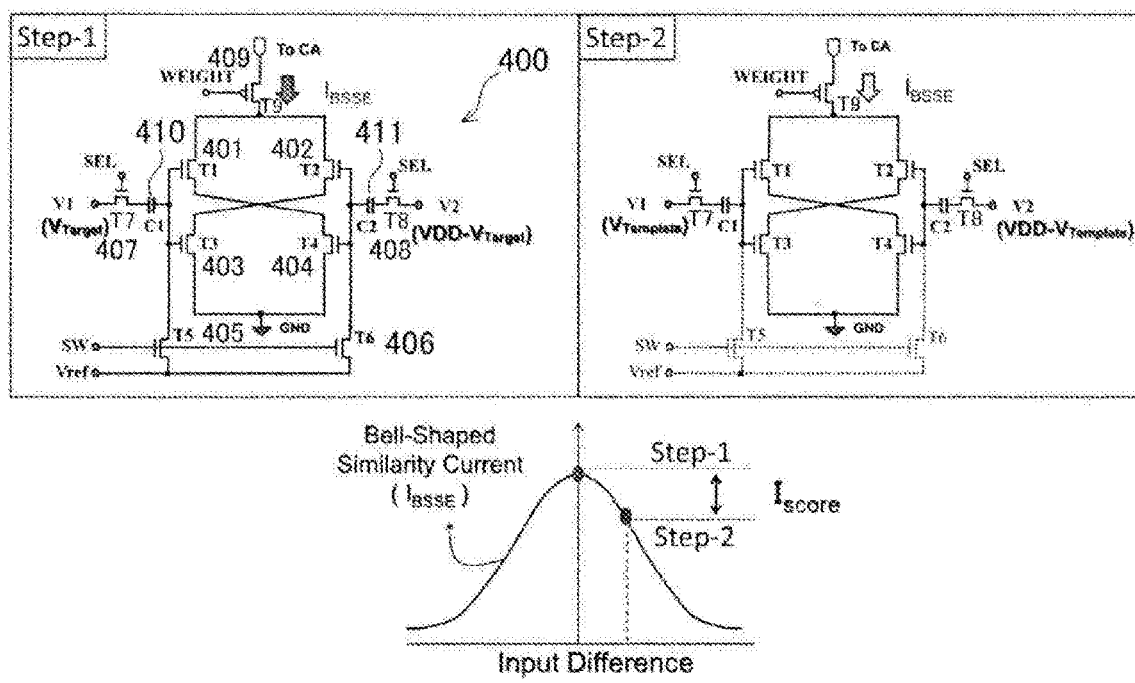
FIG. 21 is a circuit diagram of a similarity evaluation cell in the implementation example illustrated in FIG. 15.

FIG. 21 is a circuit diagram of the similarity evaluation cell 133 illustrated in FIG. 7 and the like. A similarity evaluation cell 400 includes nine N-type MOSFETs (T1 to T9) 401 to 409 and two capacitors (C1 and C2) 410 and 411. Analog voltage signals are input through ports V1 and V2 on both sides at two divided steps. Step 1 is illustrated on the left side in the upper part, and Step 2 is illustrated on the right side in the upper part. As illustrated in the lower part, the similarity evaluation cell 400 is a circuit configured to determine a voltage difference between Steps 1 and 2, and output the voltage difference to a current accumulator as similarity current ($I_{BSSE}$) that satisfies a similarity evaluating function.

At Step 1, SW is set to "H", and target voltage as search data is applied to the input ports V1 and V2, thereby obtaining maximum similarity current. At Step 2, SW is set to "L" to hold gate electric charge of transistors T1, T2, T3, and T4, and template voltage as reference data is applied to the input ports, thereby obtaining similarity current that decreases in accordance with the difference between the template voltage and the target voltage.

Figure 22:
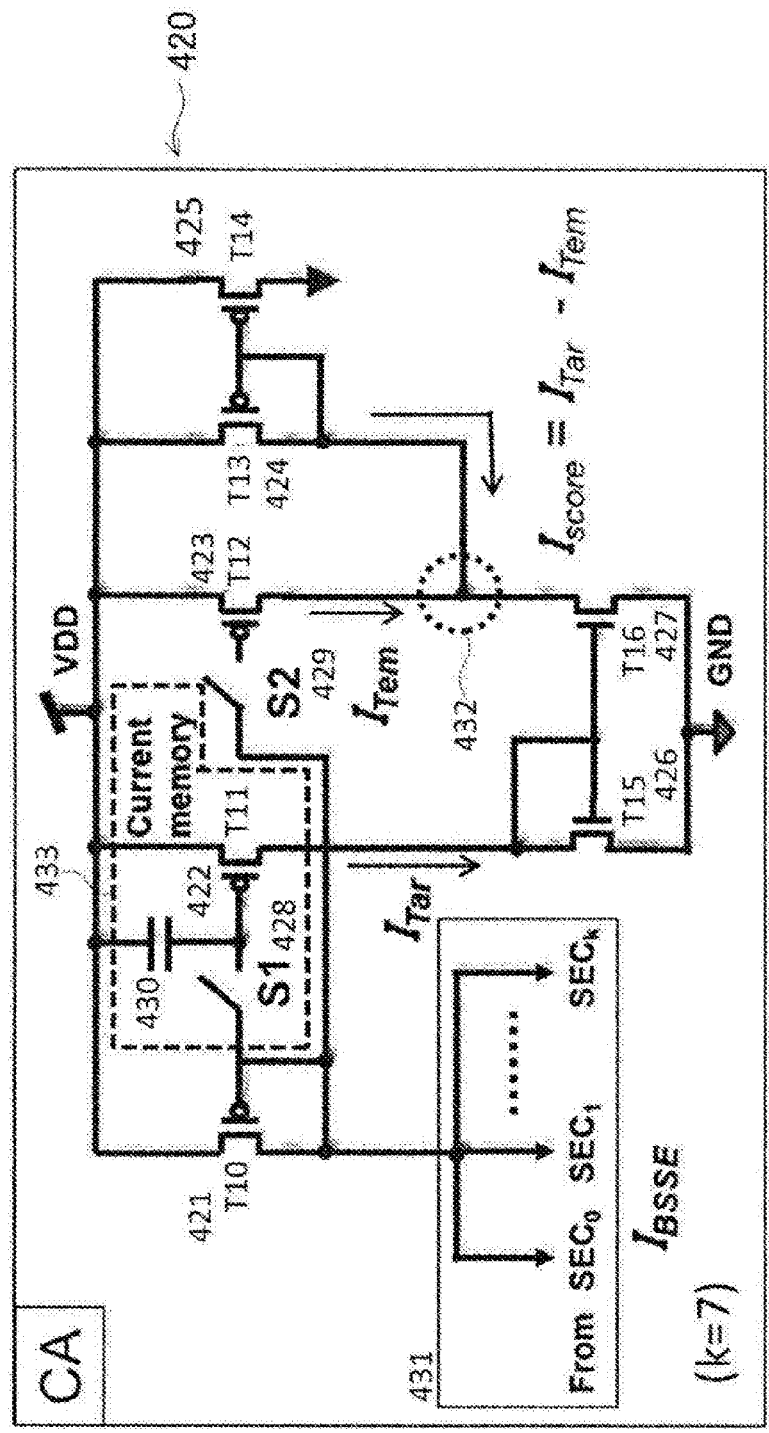
FIG. 22 is a circuit diagram of a current accumulator in the implementation example illustrated in FIG. 15.

FIG. 22 is a circuit diagram of the current accumulator 135 illustrated in FIG. 7 and the like. A current accumulator 420 includes five P-type MOSFETs (T10 to T14) 421 to 425, two N-type MOSFETs (T15 to T16) 426 and 427, two switches (S1 and S2) 428 and 429, and one capacitor 430. The MOSFETs T10 and T11 form a current mirror, the MOSFETs T10 and T12 form a current mirror, the MOSFETs T13 and T14 form a current mirror, and the MOSFETs T15 and T16 form a current mirror. The circuit illustrated in FIG. 22 includes one current adder 431, one current subtractor 432, and one current memory 433. The circuit adds similarity currents ($I_{BSSE}$) output from each of K similarity evaluation cells at two divided steps, and outputs the difference between the currents. These K values can be flexibly designed and adjusted by controlling the number of circuits of similarity evaluation cells connected with the current accumulator 420.

The current accumulator 420 first adds the similarity currents output from the K similarity evaluation cells (SEC) and corresponding to the search data at Step 1, sets the switch S1 (S2) to be on (off), and temporarily stores an obtained current result $I_{Tar}$ in the current memory 433 by using the current mirror formed by the MOSFETs T10 and T11. Then, the current accumulator 420 adds the similarity currents ($I_{Tem}$) output from the K similarity evaluation cells (SEC) and corresponding to the reference data at Step 2, sets the switch S1 (S2) to be off (on), copies an obtained current result $I_{Tem}$ by using the current mirror formed by the MOSFETs T10 and T12, calculates the difference between the current result $I_{Tem}$ and the stored current result $I_{Tar}$, and outputs the difference as a final similarity current ($I_{SCORE}$) of the search data and the reference data to a time-domain convertor (TDC).

Figure 23:
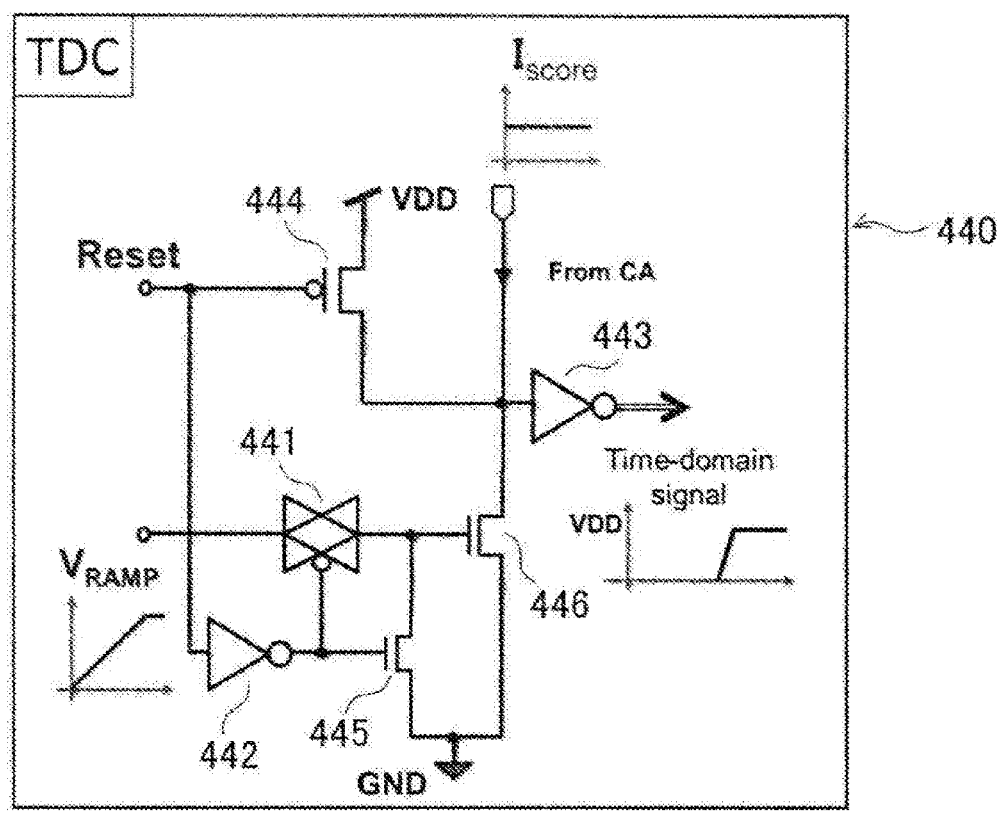
FIG. 23 is a circuit diagram of a time-domain convertor in the implementation example illustrated in FIG. 15.

FIG. 23 is a circuit diagram of the time-domain convertor 136 illustrated in FIG. 7 and the like. A time-domain convertor 440 includes one CMOS switch 441, two inverters 442 and 443, one P-type MOSFET 444, and two N-type MOSFETs 445 and 446, and converts the similarity current ($I_{SCORE}$) output from the current accumulator (CA) into a time-domain voltage delay signal.

The time-domain convertor 440 first initializes an output to GND by using a reset signal. Thereafter, the time-domain convertor 440 receives the voltage of a ramp signal simultaneously with inputting of the similarity current $I_{SCORE}$, and when the voltage of a switching node decreases beyond a threshold of an output inverter 443, the output of the time-domain convertor 440 rises to generate a TD voltage delay signal having a delay corresponding to the similarity current $I_{SCORE}$.

Figure 24:
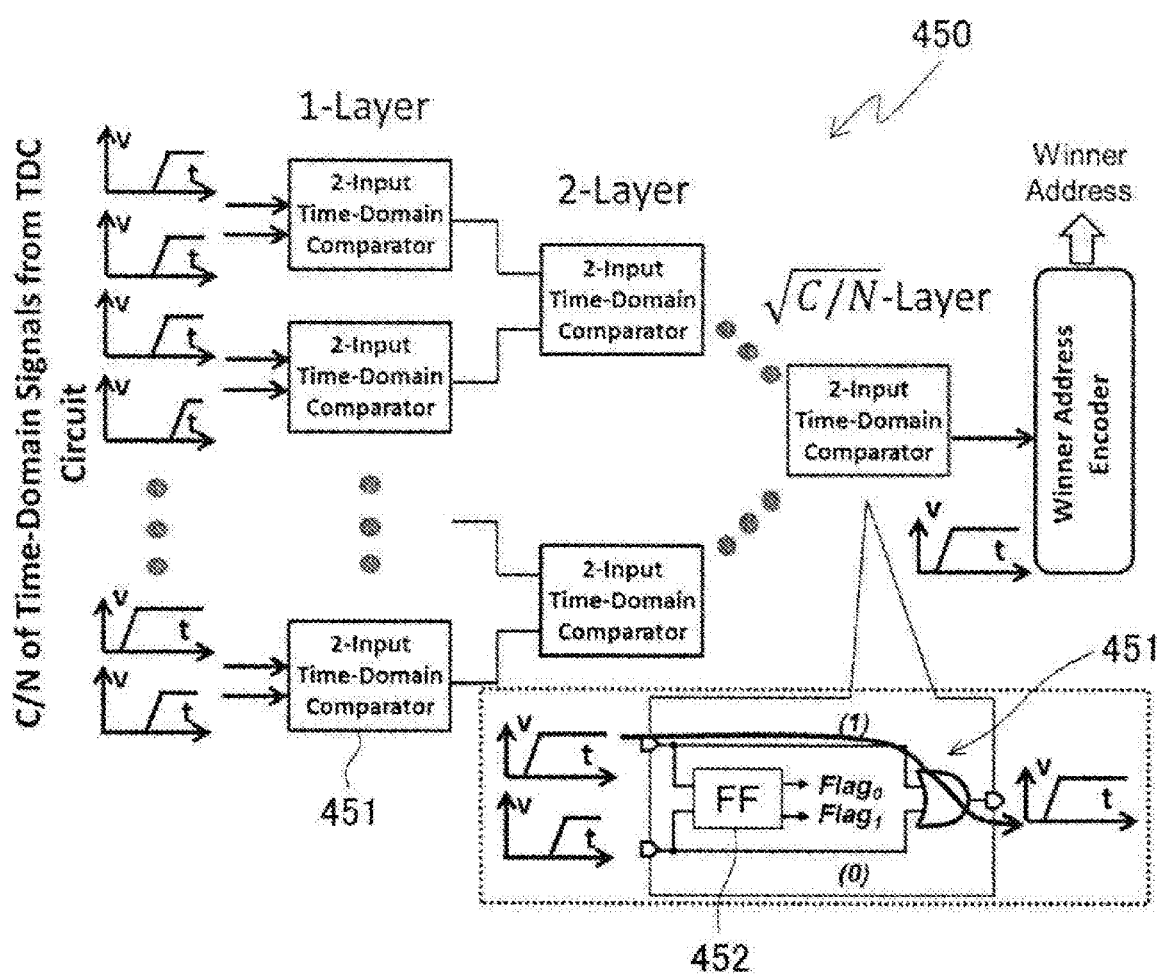
FIG. 24 is a block diagram of a TD-WTA circuit in a searching unit in the implementation example illustrated in FIG. 15.

FIG. 24 is a block diagram of a time-domain winner take-all (TD-WTA) circuit 450 in the searching unit 350. In FIG. 24, C represents the number of columns of memory grains, N represents the dimension number of data, and C/N represents the number of pieces of reference data at each row of the memory.

The TD-WTA circuit 450 is a minimum searching circuit including a [sqrt] (C/N) layer composed of (C−N)/N2-input time-domain comparators 451. The TD-WTA circuit 450 selects, as a local winner, a signal having a shortest delay (earliest rise) from among C/N TD voltage delay signals corresponding to C/N pieces of reference data input from the time-domain convertors in parallel, and outputs the signal together with the address of the winner.

The TD-WTA circuit 450 first inputs the C/N TD voltage delay signals to the 2-input TD comparator 451, compares each pair of the signals, and passes a signal having the shorter delay to the next layer. This process is repeated at several stages to search for a TD voltage delay signal (local winner) having the shortest delay. Each 2-input TD comparator 451 provides a flag to two input TD delay signals, stores the signals in an FF circuit 452, and encodes the flag to determine the address of reference data corresponding to the winner. Lastly, the TD-WTA circuit 450 outputs the local winner and the winner address thereof to a minimum comparing and updating circuit.

Figure 25:
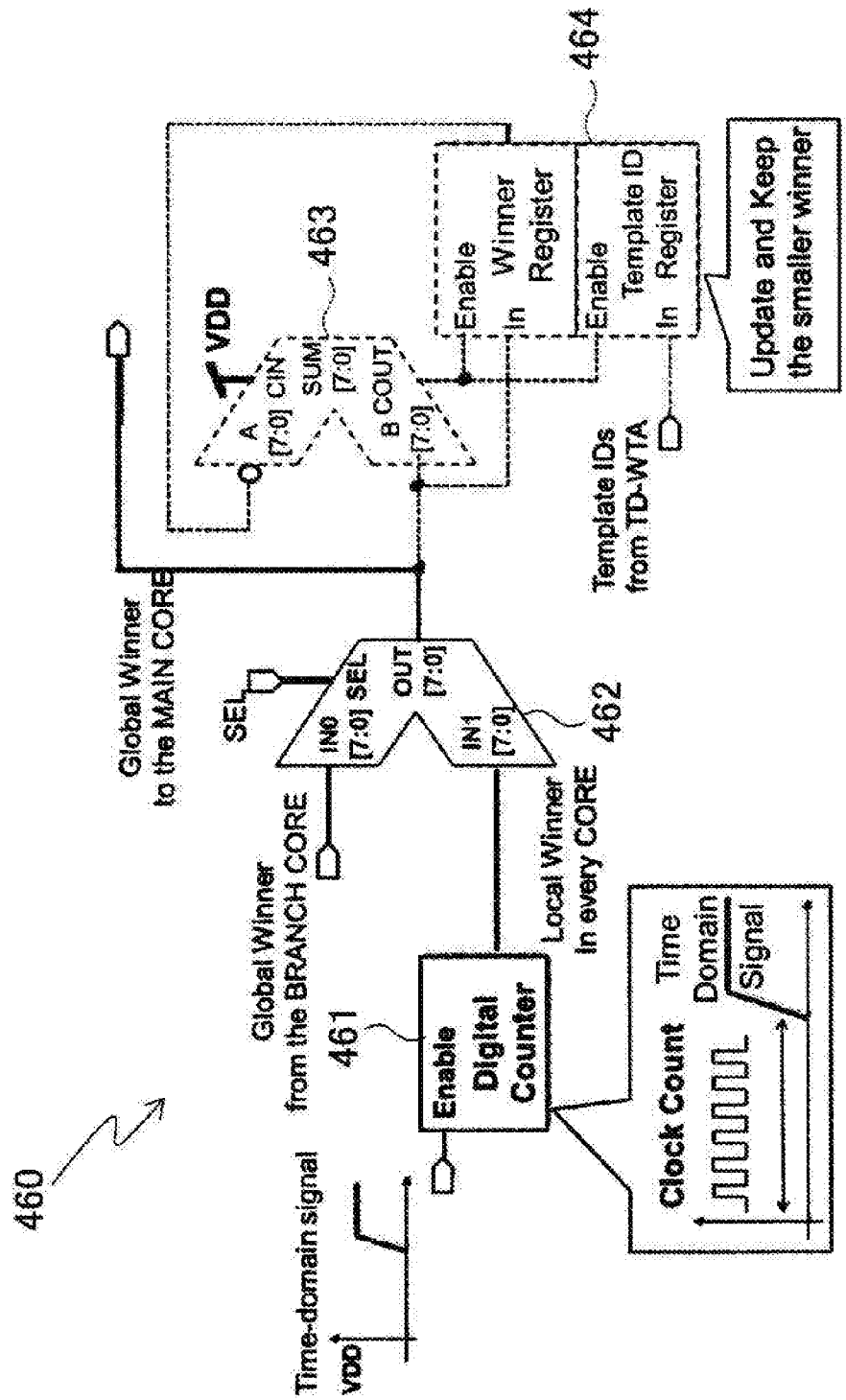
FIG. 25 is a configuration diagram of a minimum comparing and updating circuit in the implementation example illustrated in FIG. 15, which is used in a branch core.
Figure 26:
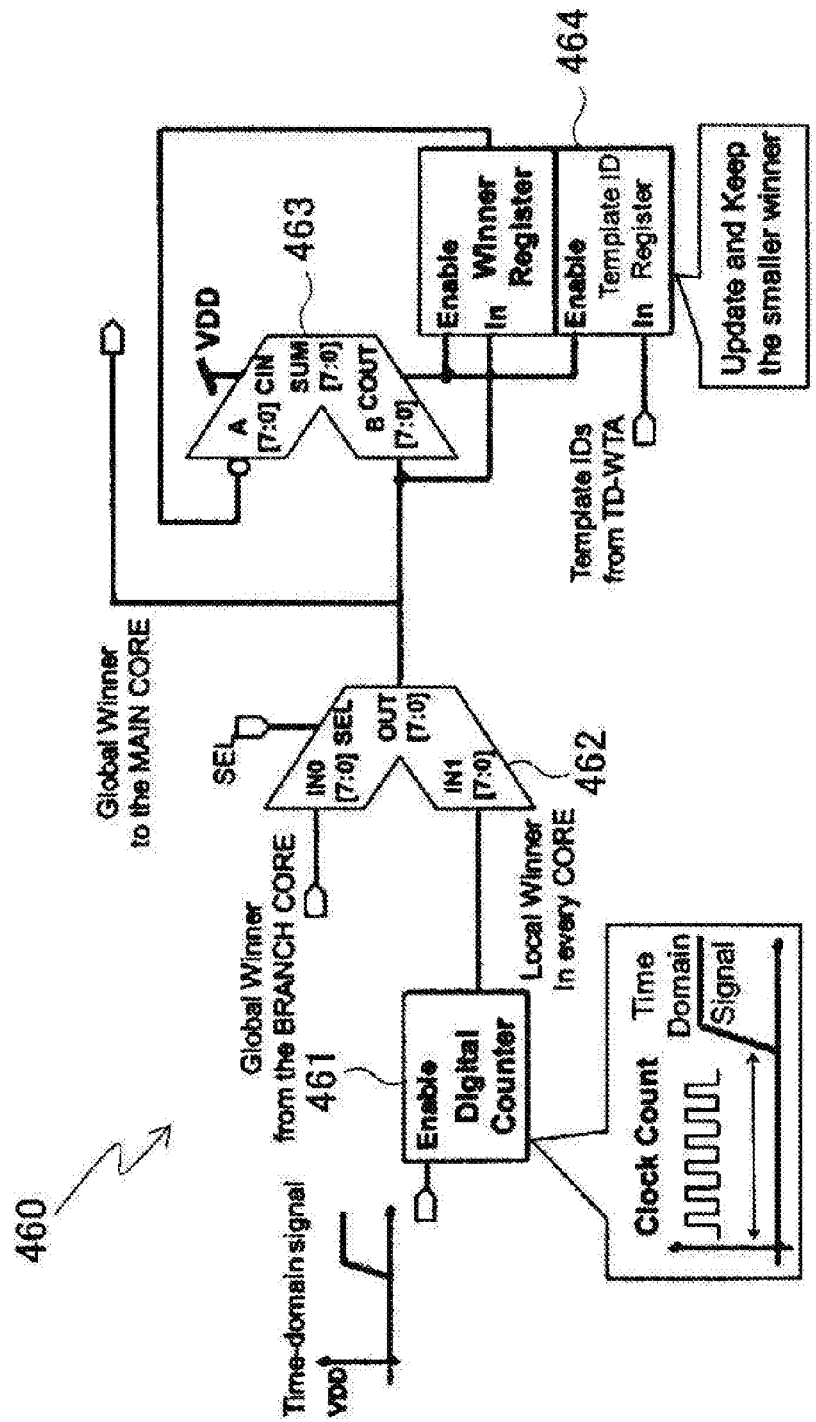
FIG. 26 is a configuration diagram of a minimum comparing and updating circuit in the implementation example illustrated in FIG. 15, which is used in a main core.

FIGS. 25 and 26 are each a configuration diagram of a minimum comparing and updating circuit 460. FIG. 25 illustrates the circuit used in a branch core, and FIG. 26 illustrates the circuit used in a main core. Any part illustrated with dotted lines is deactivated.

The minimum comparing and updating circuit 460 includes one W-bit digital counter 461, one W-bit selector 462, one W-bit digital adder 463, and a digital register 464 configured to store a global winner and the address thereof. The minimum comparing and updating circuit 460 compares each local winner input from the TD-WTA circuit 450 in series with a local winner determined at the previous step, and stores the smaller local winner, thereby determining a smallest global winner.

The minimum comparing and updating circuit 460 first receives the TD voltage delay signal of the local winner from the TD-WTA circuit 450, and converts a signal delay into the number of clocks through a digital counter of eight bits (W=8), thereby calculating the number of clocks (local minimum value) of the local winner. This conversion starts counting when the digital counter inputs a ramp voltage to a time-domain convertor, and is completed simultaneously with the calculation of the local winner by the TD-WTA circuit 450.

The branch core transfers the obtained local winner (minimum value) to the main core. The main core performs, by using the digital adder, subtraction processing on the local winner (minimum value) obtained from the main core or the branch core and the global winner (minimum value) stored in a winner register, and overwrites the register only in a case of COUT=1. While constantly updating the smaller global winner (minimum value) in this manner, the main core stores the final global minimum value and the corresponding reference data ID as an associative recognition result.

In the main core and each branch core, such processing is executed through the reference data storing circuit as the memory area, a data adaptive similarity evaluation circuit, and a two-level minimum searching circuit by a pipeline scheme at timings shifted from each other by one clock. Accordingly, associative recognition is completed on reference data at each row (C/N) of the core in one clock.

In the implementation example, a throughput of 8 data/clock is obtained. The system is easily scalable by using cores with the same design.

Figure 27A:
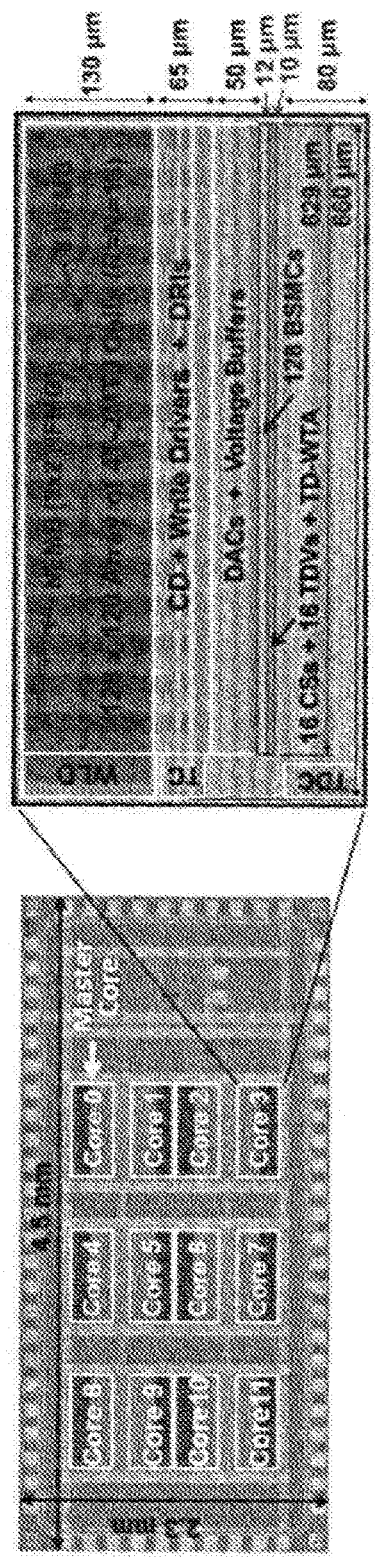
FIG. 27A is an image illustrating a picture of a chip produced according to designing specifications illustrated in FIG. 23C.
Figure 27B:
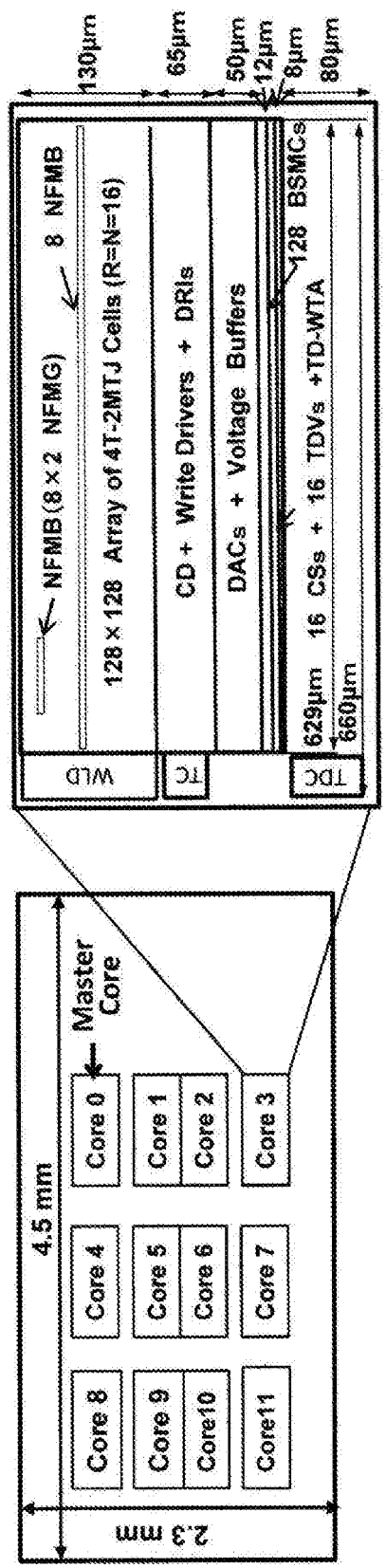
FIG. 27B is a pattern diagram of the image illustrated in FIG. 23A.

FIG. 27A illustrates a picture image of a chip produced in accordance with the design illustrated in FIG. 15. FIG. 27B schematically illustrates the image illustrated in FIG. 27A. FIG. 27C illustrates designing specifications.

FIG. 28 is a diagram illustrating a test result of circuit operation of a similarity evaluation cell. The horizontal axis represents $\Delta V$ that is $V_{tem}$-$V_{Tar}$ illustrated in the CA of FIG. 22. The vertical axis represents currents $I_{peak}$ and $I_{tem}$. As illustrated in FIG. 28, similar bell-shaped waveforms are obtained irrespective of a reference voltage $V_{ref}$.

Figure 29:
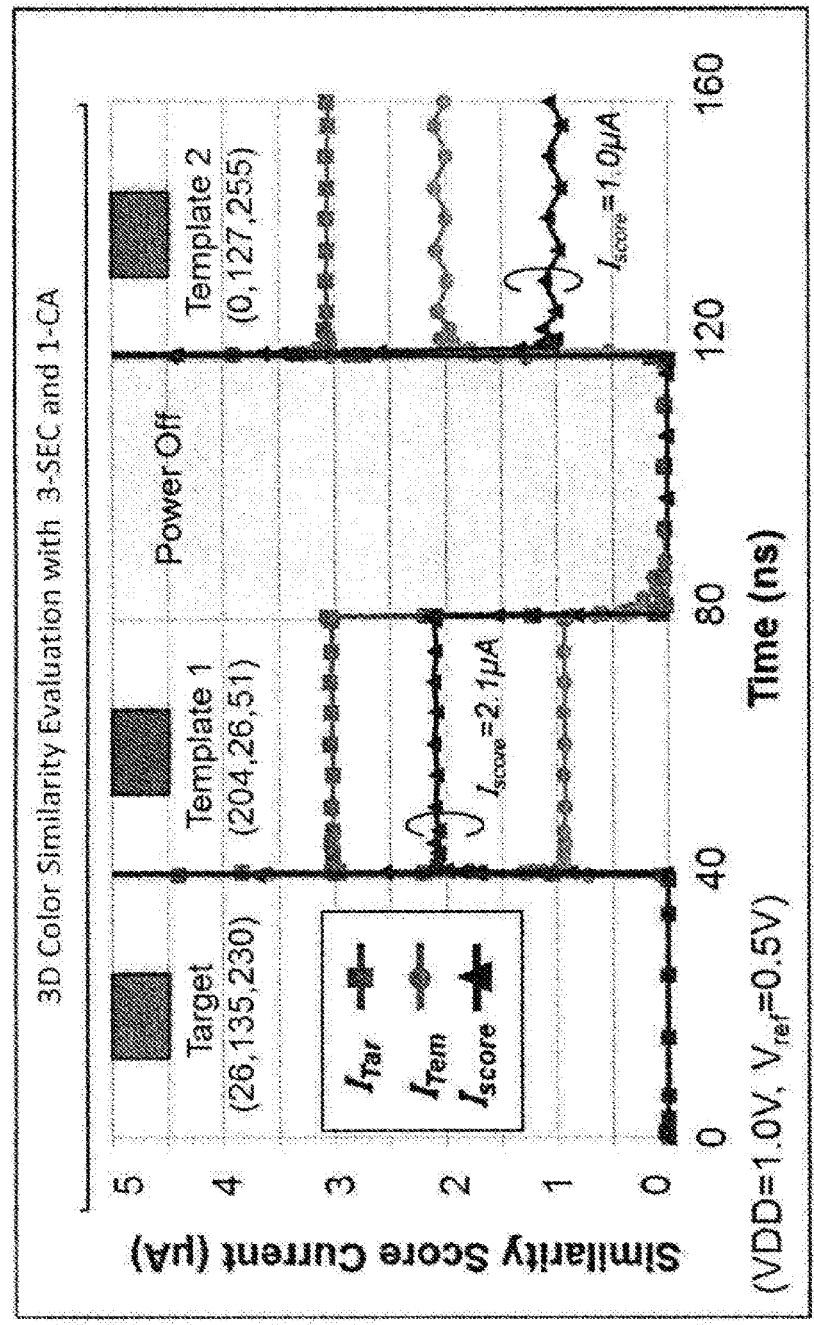
FIG. 29 is a diagram illustrating a result of similarity current in a three-dimensional data configuration.

FIG. 29 is a diagram illustrating a similarity current result output from the current accumulator in a three-dimensional color vector data (M=8 and N=3) configuration. As illustrated in FIG. 29, a lower similarity current ($I_{SCORE}$) is output for reference data (template) more similar to search data (target).

Figure 30:
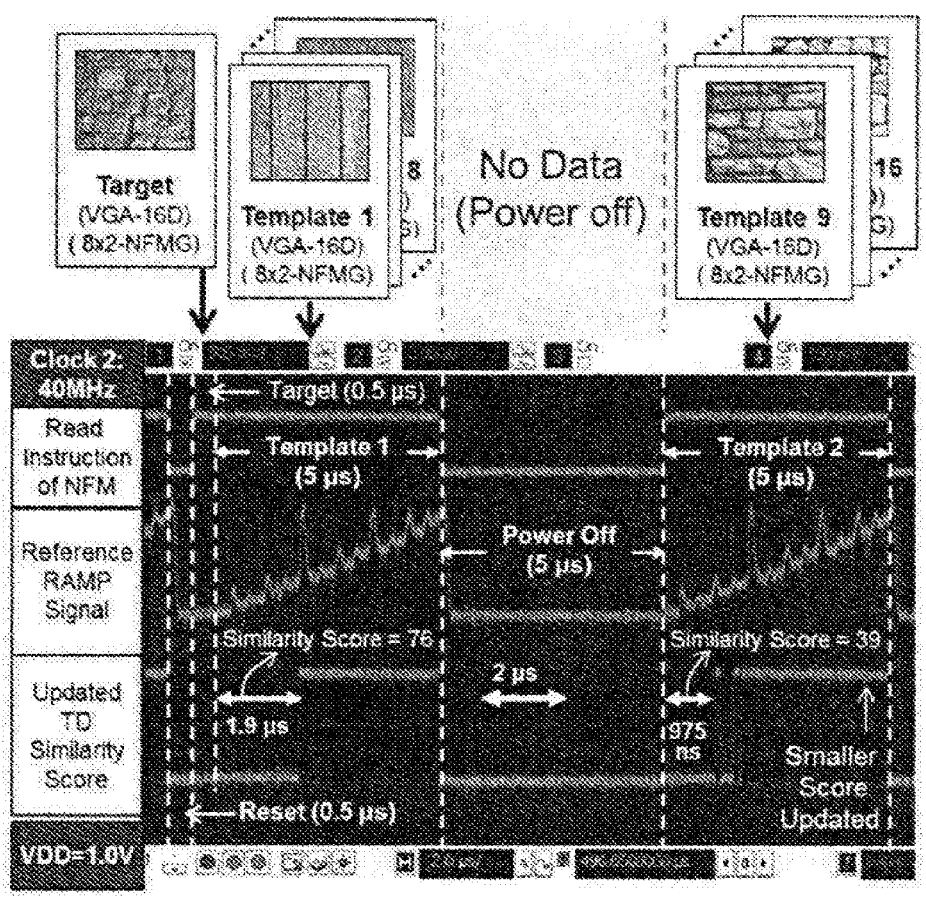
FIG. 30 is a diagram illustrating a core operation waveform in a 16-dimensional data configuration.

FIG. 30 is a diagram illustrating waveforms for testing core operation in a 16-dimensional data configuration, and is a verification result of texture recognition. The horizontal axis represents time, and the vertical axis represents a voltage of 0 V to 1 V. After the system is reset, as indicated by a data conversion command signal (read instruction of NFM) of D/A conversion, a "stone" texture as search data (Target) is input, and then eight "wooden board" textures as reference data (Template 1) at the first row are input. Then, after a power source is temporarily turned off, eight "stone" textures as reference data (Template 2) at the second row are input. While reference data is continuously input, current-mode similarity evaluation is performed, a similarity current is converted into a voltage TD delay signal by a ramp signal (reference ramp signal), and a TD delay signal (updated TD similarity score) having a highest similarity is output from the voltage TD delay signal of the reference data at each row. Simultaneously, a delay of the output TD delay signal (updated TD similarity score) is converted into the number of clocks and obtained as a digital difference (similarity score), and updating with the smaller difference is performed, thereby achieving final texture associative recognition.

A prototype chip included 12 cores, operated at 40 MHz at a power voltage of 1 V, and completed recognition processing on data per row, in other words, C/N pieces of reference data in five microseconds. Resetting took 0.5 microseconds, and search data inputting took 0.5 microseconds. Other parameters were C=128, N=16, and R=8.

Figure 31:
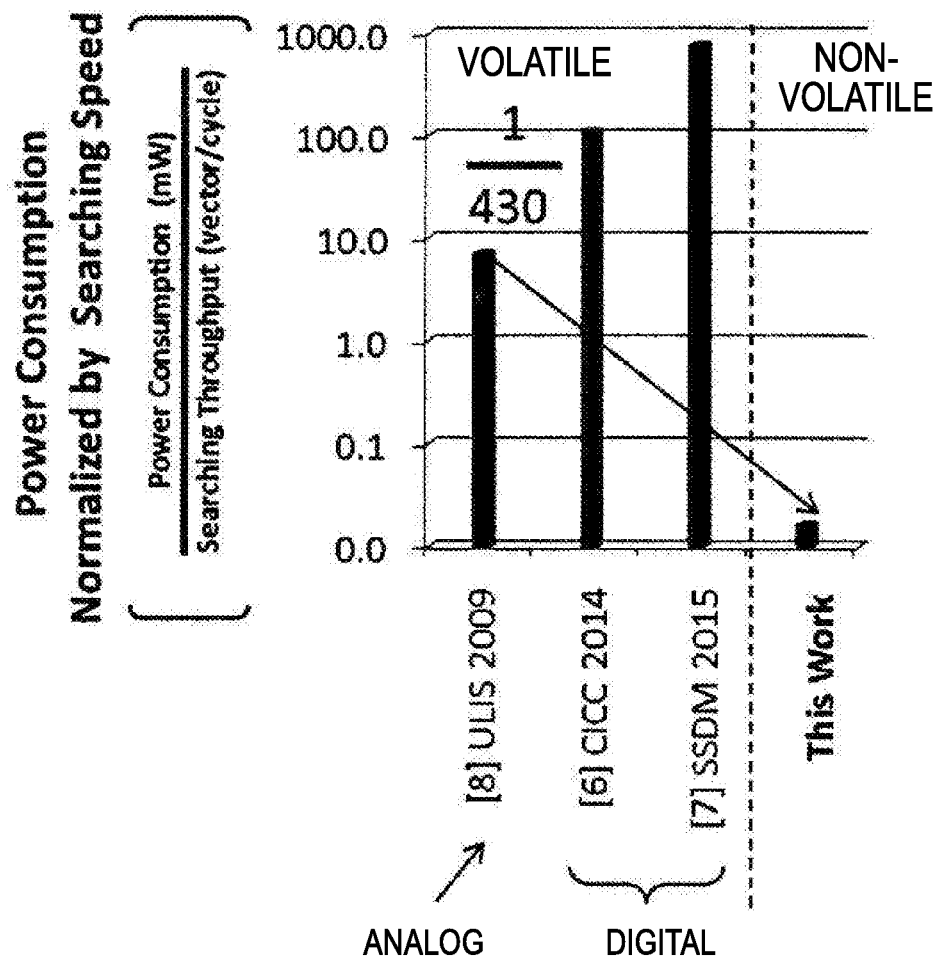
FIG. 31 is a diagram illustrating a comparison result of electric power consumption between the present implementation example and each of conventional analog and digital approaches.

FIG. 31 is a diagram illustrating a comparison result of electric power consumption between the conventional analog and digital approaches and the present implementation example. As illustrated in FIG. 31, electric power consumption is significantly reduced in the present implementation example.

Figure 32:
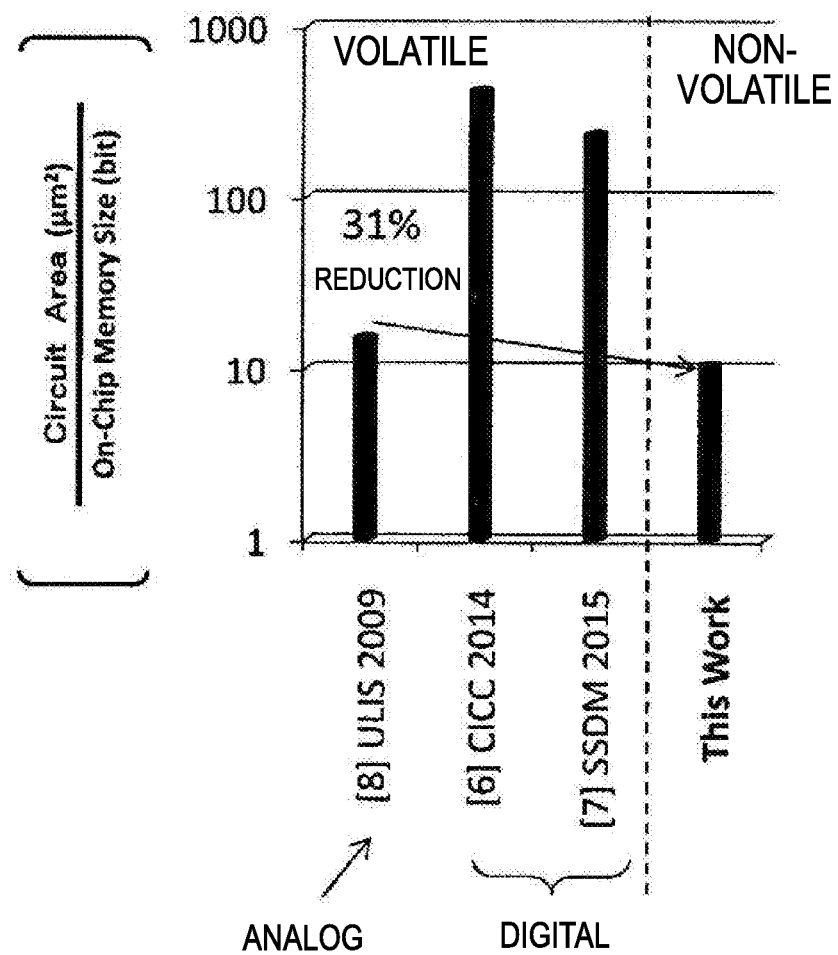
FIG. 32 is a diagram illustrating a comparison result of a circuit area between the present implementation example and each of the conventional analog and digital approaches.

FIG. 32 is a diagram illustrating a comparison result of a circuit area between the conventional analog and digital approaches and the present implementation example. As illustrated in FIG. 32, the circuit area is significantly reduced.

Although the embodiment of the present invention is described above, the present invention is characterized in the structure of similarity evaluating unit, and a memory unit, a searching unit, and a comparing and updating unit may each have a specific circuit configuration that achieves contents of the embodiment of the present invention. The configurations illustrated in the drawings of FIG. 15 or later are merely preferable examples. For example, the analog voltage minimum searching circuit may have a circuit configuration including multiple input terminals, one output terminal, operational amplifier, and resistors R1, R2 and R3 and configured to output a voltage of the resistor R3, as illustrated in FIG. 33.

Figure 33:
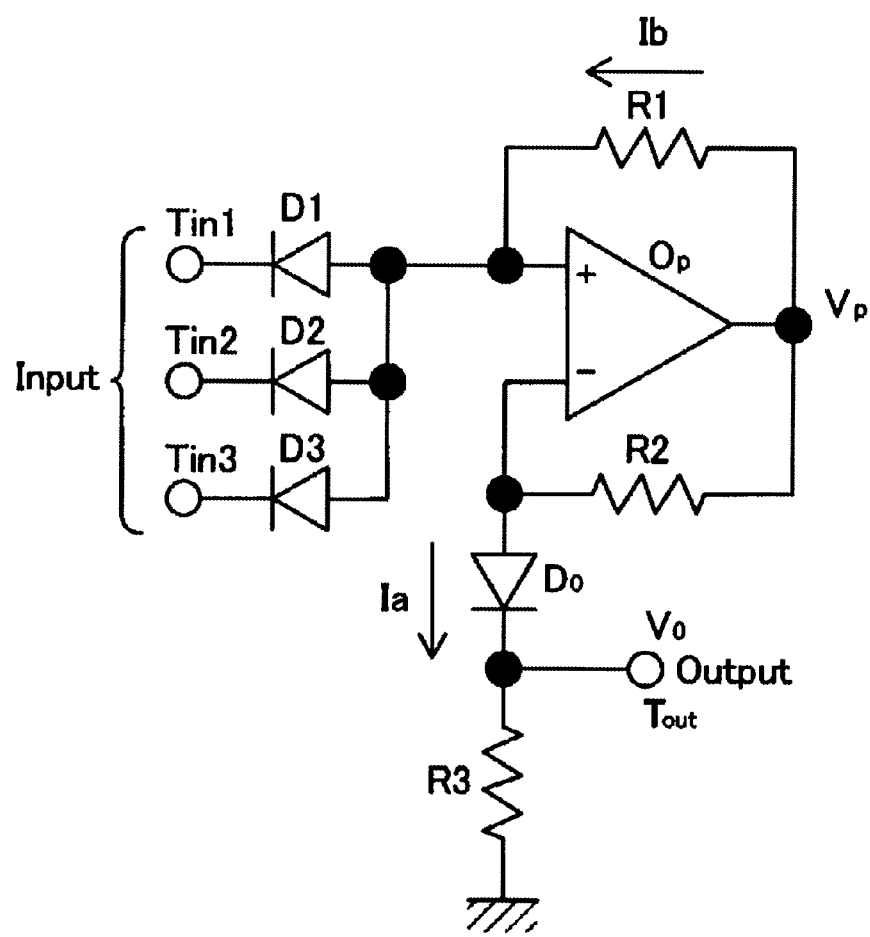
FIG. 33 is a diagram illustrating an example of a minimum searching circuit.

FIG. 33 illustrates an example of the analog voltage minimum searching circuit. In the analog voltage minimum searching circuit, output voltages Tin1, Tin2 and Tin3 from resistors connected with output ends of current accumulators are input to one of the input ends of the operational amplifier. The resistor R1 is connected between the one input end of the operational amplifier and an output end thereof. To make a current Ib flow from a voltage Vp of the output end of the operational amplifier to the resistor R1 through the terminals of the output voltages Tin1, Tin2 and Tin3, diodes D1, D2 and D3 are interposed between one end of the resistor R1 and three input ends of the analog voltage minimum searching circuit. Meanwhile, the resistor R2 is connected between the other input end of the operational amplifier and the output end thereof. A diode Do is interposed at the connection point between the output end of the operational amplifier and the resistor R2 and connected with one end of the resistor R3 and the other end of the resistor R3 is grounded. Thus, a current Ia flows from the connection point between the other input end of the operational amplifier and the resistor R2 to the resistor R3. Such a configuration is employed in the analog voltage minimum searching circuit, so that a plurality of input voltage minimum values are output as voltages between both ends of the resistor R3.

Although, in FIG. 7, each column line is a vertical line and each row line is a horizontal line in the above description, the column line is defined to be one of a line extending in one direction and a line extending in the other direction, and the row line is defined to be the other line. In other words, the column line is one of lines intersecting with each other, and the row line is the other line. This also applies to a configuration diagram illustrated in each drawing other than FIG. 7.

In the embodiment of the present invention, the memory device 100 has the following configuration as described with reference to FIG. 7.

Specifically, a memory device 100 includes: a memory area 113 configured to store reference data of N ($\geq 1$) dimensions each composed of M (1) bits, in where an optional number of memory grains 119 each composed of nonvolatile memories of M bits and power drivers 118 paired with the memory grains 119 and configured to supply electrical power to the memory grains 119 in the optional number are provided in each region specified by column lines 117 in the optional number and M row lines 115 in the memory area 113, the optional number being one to N inclusive, and the reference data per dimension stored in the memory grain 119 paired with each power driver 118 is read when the power driver 118 receives inputting of a control signal from the corresponding one of the column lines 117 in the optional number, inputting of a control signal from the corresponding one of the M row lines 115, and inputting of a clock signal, and supplies electrical power to the memory grain 119 in synchronization with the clock signal.

Accordingly, each memory grain 119 is supplied with electrical power through specification of a reading place by the column line 117 and the row line 115 and temporal specification by the clock signal, which leads to power saving.

In such memory device 100, the inputting of control signals from the M row lines 115 may be sequentially performed for each set of row lines in a predetermined number of one to M, for example. The inputting of control signals from the M row lines 115 may be simultaneously performed.

In such memory device 100, each power driver 118 does not supply electrical power to the corresponding one of the memory grains 119 in the optional number that is paired with the power driver 118 when having received inputting of a clock signal of "1" or "0", and supplies electrical power to the corresponding one of the memory grains 119 in the optional number that is paired with the power driver 118 to read the reference data stored in the memory grain 119 when having received inputting of a clock signal of "0" or "1". This leads to significant reduction of electric power consumption at reading of reference data.

Description of a nonvolatile memory is mainly made on an STT-MRAM, but the nonvolatile memory may be those listed below, for example. The nonvolatile memory may be a magnetoresistive random access memory (MRAM), a resistive random access memory (ReRAM), a ferroelectric random access memory (FeRAM), a flash memory, or the like.

The magnetoresistive random access memory is a nonvolatile memory exploiting spintronics and based on the operation principle of a giant magneto resistive effect (GMR effect). For example, the magnetoresistive random access memory is selected from a domain wall displacement MRAM, a spin hole torque MRAM, and a spin transfer torque MRAM (STT-RMAM). The domain wall displacement MRAM is a three-terminal MRAM in which magnetization is inverted by traveling through the domain wall of a minute magnetic body. The spin hole torque MRAM is a three-terminal MRAM in which magnetization is inverted by spin hole torque from a non-magnetic body. The STT-RMAM is a two-terminal MRAM in which magnetization is rotated through a mutual effect with electron spin by causing current to flow to a magnetic body. Each memory is expected to achieve a high density, a fast speed, and a long lifetime.

The resistive random access memory is a nonvolatile memory configured to store data by utilizing change of electric resistance in metallic oxide due to voltage application. The resistive random access memory is expected to achieve a high density and a high speed.

The ferroelectric random access memory is a nonvolatile memory configured to store data by utilizing positive and negative residual polarization due to a ferroelectric hysteresis effect. The ferroelectric random access memory is expected to achieve a high speed and a long lifetime.

The flash memory is a nonvolatile memory configured to store data by trapping, under voltage control, electric charge in a MOS floating gate to change a MOS threshold. The flash memory is expected to achieve a high density.

In the embodiment of the present invention, low electric power consumption can be achieved at data reading from a memory grain by power gating, and equivalent low electrical power consumption can be achieved at writing by flexibly optimized electrical power supply.

REFERENCE SIGNS LIST

10: search data
20: feature vector data
30: reference data
100: memory device
110: memory unit (reference data storing circuit)
111: row decoder
112: column decoder
113: memory area
114: read/write circuit
115: row line
116: bit line
117: column line
118: power driver
119: memory grain
130: similarity evaluating unit
131: input search data storing circuit
132: digital analog convertor (DAC)
133: similarity evaluation cell (SEC)
133a: cell group
134: switch
134a: first switch
134b: second switch
134c: NOT circuit
135: current accumulator (CA)
136: time-domain convertor (TDC)
150: searching unit
151: time-domain minimum searching circuit
170: comparing and updating unit
171: minimum comparing and updating circuit
200: memory system
210: main core
211: reference data storing circuit (memory unit) of main core
212: data adaptive current mode similarity evaluating circuit (similarity evaluating unit) of main core
213: time-domain minimum searching circuit (searching unit) of main core
214: minimum comparing and updating circuit (comparing and updating unit) of main core
215: output buffer of main core
220: branch core
221: reference data storing circuit (memory unit) of branch core
222: data adaptive current mode similarity evaluating circuit (similarity evaluating unit) of branch core
223: time-domain minimum searching circuit (searching unit) of branch core
224: minimum comparing and updating circuit (comparing and updating unit) of branch core
225: output buffer of branch core
300: memory device
310: memory unit
311: row decoder
312: column decoder
313: memory area
314: read/write circuit
315: row line
316: bit line
317: column line
318: power driver
319: memory grain
320: 4T-2MTJ memory cell
321 to 324: N-type MOSFET
325, 326: MTJ
327: WRI circuit
327A: write driver circuit
327B: pre-charge circuit
327C: sense amplifier circuit
327D: digital register (Register) circuit
330: similarity evaluating unit
332: digital analog convertor (DAC)
333: similarity evaluation cell (SEC)
334: switch
334a: first switch
334b: second switch
334c: NOT circuit
335: current accumulator (CA)
336: time-domain convertor (TDC)
350: searching unit
351: time-domain minimum searching circuit
370: comparing and updating unit
371: minimum comparing and updating circuit

The invention claimed is:

1. A memory system comprising
a main core and one or a plurality of branch cores,
each of the main core and the branch cores includes:
a plurality of read circuits each configured to read, in a memory area storing a plurality of pieces of reference data of N ($\geq 1$) dimensions each composed of M ($\geq 1$) bits, the reference data divided into data of each dimension, reference data from a corresponding memory grain among memory grains in an optional number ($1 \leq k \leq N$) each composed of memories of M bits;
a search data storing circuit configured to store search data of N ($\geq 1$) dimensions each composed of M ($\geq 1$) bits and divide the search data to output;
a plurality of similarity evaluation cells each configured to calculate similarity between reference data read in each reading from the memory area and search data, and output, as a current value, the similarity of reference data read from the corresponding read circuit with respect to data read from the search data storing circuit;
a plurality of current accumulators each configured to accumulate currents output from the corresponding similarity evaluation cells in the optional number; and
a searching unit configured to obtain, as a local winner, a reference data candidate having high similarity based on the similarity between reference data read from the memory area and search data in each reading from the memory area and evaluating a similarity, wherein
the main core comprises:
a comparing and updating unit having a temporary storage circuit, the temporary storage circuit configured to store a similarity of a global winner, the global winner obtained at the searching unit, as which, a reference data candidate having the highest similarity among local winners obtained in each reading and evaluating a similarity, the comparing and updating unit configured to compare the similarity of the local winner obtained by the searching unit of the main core and the similarity of the global winner stored in the temporary storage circuit, and compares the similarity of the local winner obtained by the searching unit of the branch core and the similarity of the global winner stored in the temporary storage circuit.

2. The memory system according to claim 1, wherein
the plurality of similarity evaluation cells are divided into cell groups having the similarity evaluation cells in the optional number,
each of the current accumulators corresponds to one of the cell groups, and
each of the current accumulators is provided with a switch so as to accumulate currents output from the similarity evaluation cells in the optional number in the cell group different from the corresponding one cell group.

3. The memory system according to claim 2, wherein, among the plurality of current accumulators, electric power is supplied only to a current accumulator which accumulates currents output from the similarity evaluation cells in the optional number in the cell group different from the corresponding one cell group.

4. The memory system according to claim 1, wherein
a digital analog convertor configured to convert digital data into analog data is provided in a front stage of the similarity evaluation cells, and
the similarity evaluation cells output, as analog current values, similarities to the corresponding current accumulators based on data converted into analog data by the digital analog converter.

5. The memory system according to claim 1, wherein the main core and the branch cores are provided with a plurality of time-domain convertors each configured to convert the similarity calculated at the corresponding similarity evaluation cell into a delay time.

6. The memory system according to claim 5, wherein the searching unit includes a time-domain minimum searching circuit configured to search for the local winner corresponding to the shortest delay based on a plurality of delay times input from the plurality of time-domain convertors, and simultaneously convert, as digital similarity of the local winner, the shortest delay into a clock cycle number within delay times by a counter to determine an address of the local winner.

7. The memory system according to claim 6, wherein the comparing and updating unit includes a minimum searching circuit configured to receive inputting of similarities of local winners from the searching units of the main core and the branch cores, and update, at the temporary storage circuit, a value having high similarity in comparison with the similarity of the global winner stored in the temporary storage circuit.

8. The memory system according to claim 1, wherein searching processing by the searching unit and comparing and updating by the comparing and updating unit in the main core are performed with searching processing by the searching unit in the branch core according to a synchronized clock.

9. The memory system according to claim 8, wherein searching processing by the searching unit and comparing and updating by the comparing and updating unit are performed at an optionally deviated clock number in the main core and the branch cores.

10. A memory system comprising
a main core and one or a plurality of branch cores, each of the main core and the branch cores including:
a searching unit configured to obtain, as a local winner, a reference data candidate having high similarity based on similarity between reference data read from a memory area and search data in each reading from the memory area and evaluating a similarity, wherein
the main core comprises: a comparing and updating unit having a temporary storage circuit, the temporary storage circuit configured to store a similarity of a global winner, the global winner obtained at the searching unit, as which, a reference data candidate having the highest similarity among local winners obtained in each reading and evaluating a similarity, the comparing and updating unit configured to compare the similarity of the local winner obtained by the searching unit of the main core and the similarity of the global winner stored in the temporary storage circuit, and compares the similarity of the local winner obtained by the searching unit of the branch core and the similarity of the global winner stored in the temporary storage circuit.

11. The memory system according to claim 10, wherein each of the main core and the branch cores includes a plurality of similarity evaluation cells each configured to calculate the similarity between each reference data read in each reading from the memory area and search data, and a plurality of time-domain convertors each configured to convert the similarity calculated by the corresponding similarity evaluation cell into a delay time.

12. The memory system according to claim 11, wherein the searching unit includes a time-domain minimum searching circuit configured to search for the local winner corresponding to the shortest delay based on a plurality of delay times input from the plurality of time-domain convertors, and simultaneously convert, as digital similarity of the local winner, the shortest delay into a clock cycle number within delay times by a counter to determine an address of the local winner.

13. The memory system according to claim 12, wherein the comparing and updating unit includes a minimum searching circuit configured to receive inputting of similarities of local winners from the searching units of the main core and the branch cores, and update, at the temporary storage circuit, a value having high similarity in comparison with the similarity of the global winner stored in the temporary storage circuit.

14. The memory system according to claim 10, wherein searching processing by the searching unit and comparing and updating by the comparing and updating unit in the main core are performed with searching processing by the searching unit in the branch core according to a synchronized clock.

15. The memory system according to claim 14, wherein searching processing by the searching unit and comparing and updating by the comparing and updating unit are performed at an optionally deviated clock number in the main core and the branch cores.

16. A memory device comprising:
a plurality of read circuits each configured to read, in a memory area storing a plurality of pieces of reference data of N ($\geq 1$) dimensions each composed of M ($\geq 1$) bits, the reference data divided into data of each dimension, reference data from a corresponding memory grain among memory grains in an optional number ($1 \leq k \leq N$) each composed of memories of M bits;
a search data storing circuit configured to store search data of N ($\geq 1$) dimensions each composed of M ($\geq 1$) bits and divide the search data to output;
a plurality of similarity evaluation cells each configured to output, as a current value, similarity of reference data read from the corresponding read circuit with respect to data read from the search data storing circuit; and a plurality of current accumulators each configured to accumulate currents output from the corresponding similarity evaluation cells in the optional number.

17. The memory device according to claim 16, wherein the plurality of similarity evaluation cells are divided into cell groups having the similarity evaluation cells in the optional number, each of the current accumulators corresponds to one of the cell groups, and each of the current accumulators is provided with a switch so as to accumulate currents output from the similarity evaluation cells in the optional number in the cell group different from the corresponding one cell group.

18. The memory device according to claim 17, wherein, among the plurality of current accumulators, electric power is supplied only to a current accumulator which accumulates currents output from the similarity evaluation cells in the optional number in the cell group different from the corresponding one cell group.

19. The memory device according to claim 16, wherein
a digital analog convertor configured to convert digital data into analog data is provided in a front stage of the similarity evaluation cells, and the similarity evaluation cells output, as analog current values, similarities to the corresponding current accumulators based on data converted into analog data by the digital analog convertor.

20. The memory device according to claim 16, wherein
a digital analog convertor configured to convert digital data into analog data is provided in a rear stage of the similarity evaluation cells, and the similarity evaluation cells calculate similarities and output the similarities to the digital analog convertor.

21. The memory device according to claim 16, comprising a searching unit configured to obtain a current value of reference data most similar to search data based on current values output from the plurality of current accumulators, and convert the current value into a data value.

22. The memory device according to claim 21, comprising a comparing and updating unit configured to compare reference data read from the memory area for each row and update reference data most similar to search data based on the data obtained by the searching unit.

23. The memory device according to claim 16, comprising:

a plurality of time-domain convertors each configured to convert the similarity calculated by the corresponding similarity evaluation cell into a delay time;

a searching unit configured to obtain, as a local winner, a reference data candidate having high similarity based on delay times converted by the plurality of time-domain convertors; and a comparing and updating unit configured to obtain, as a global winner, a reference data candidate having the highest similarity from among local winners obtained by the searching unit in each reading and evaluating a similarity, and have a temporary storage circuit for storing the similarity of the global winner, wherein the comparing and updating unit compares the similarity of the local winner obtained by the searching unit and the similarity of the global winner stored in the temporary storage circuit.

24. The memory device according to claim 23, wherein the searching unit includes a time-domain minimum searching circuit configured to search for the local winner corresponding to the shortest delay based on a plurality of delay times input from the plurality of time-domain convertors, and simultaneously convert, as digital similarity of the local winner, the shortest delay into a clock cycle number within delay times by a counter to determine an address of the local winner.

25. A memory system comprising a main core and one or a plurality of branch cores, wherein the main core comprises the memory device according to claim 23, and the branch cores comprise the memory device according to claim 23 or 24, the comparing and updating unit being deactivated in the branch core and a local winner obtained by the searching unit of the branch core being input to the comparing and updating unit of the main core.

26. The memory system according to claim 25, wherein searching processing by the searching unit and comparing and updating by the comparing and updating unit in the main core are performed with searching processing by the searching unit in the branch core according to a synchronized clock.

27. The memory system according to claim 26, wherein searching processing by the searching unit and comparing and updating by the comparing and updating unit are performed at an optionally deviated clock number in the main core and the branch cores.

* * * * *